United States Patent
Okuda et al.

(10) Patent No.: US 9,570,603 B2
(45) Date of Patent: Feb. 14, 2017

(54) SEMICONDUCTOR DEVICE HAVING TRENCH GATE STRUCTURE AND METHOD FOR MANUFACTURING THE SEMICONDUCTOR DEVICE

(71) Applicant: ROHM CO., LTD., Kyoto (JP)

(72) Inventors: Hajime Okuda, Kyoto (JP); Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/936,666

(22) Filed: Nov. 9, 2015

(65) Prior Publication Data

US 2016/0133742 A1     May 12, 2016

(30) Foreign Application Priority Data

Nov. 10, 2014    (JP) ................. 2014-228459

(51) Int. Cl.

| | |
|---|---|
| H01L 29/66 | (2006.01) |
| H01L 29/78 | (2006.01) |
| H01L 29/06 | (2006.01) |
| H01L 29/08 | (2006.01) |
| H01L 27/092 | (2006.01) |
| H01L 29/40 | (2006.01) |
| H01L 29/417 | (2006.01) |
| H01L 29/423 | (2006.01) |
| H01L 29/49 | (2006.01) |
| H01L 29/10 | (2006.01) |
| H01L 29/45 | (2006.01) |

(52) U.S. Cl.
CPC ......... *H01L 29/7813* (2013.01); *H01L 27/092* (2013.01); *H01L 29/0653* (2013.01); *H01L 29/0696* (2013.01); *H01L 29/0865* (2013.01); *H01L 29/0882* (2013.01); *H01L 29/407* (2013.01); *H01L 29/41766* (2013.01); *H01L 29/42368* (2013.01); *H01L 29/4925* (2013.01); *H01L 29/66734* (2013.01); *H01L 29/1095* (2013.01); *H01L 29/456* (2013.01)

(58) Field of Classification Search
USPC ......................................... 257/330; 438/270
See application file for complete search history.

(56) References Cited

U.S. PATENT DOCUMENTS

| | | |
|---|---|---|
| 5,998,834 A | 12/1999 | Williams et al. |
| 2007/0210350 A1 | 9/2007 | Omura et al. |
| 2014/0048876 A1 | 2/2014 | Sekiguchi |

FOREIGN PATENT DOCUMENTS

| | | |
|---|---|---|
| JP | 2000-511353 A | 8/2000 |
| JP | 2007-273931 A | 10/2007 |
| JP | 2011-199109 A | 10/2011 |
| JP | 2014-038965 A | 2/2014 |

*Primary Examiner* — Telly Green
(74) *Attorney, Agent, or Firm* — Rabin & Berdo, P.C.

(57) ABSTRACT

A semiconductor device of the present invention includes a semiconductor layer in which a gate trench is formed, a gate insulating film formed along an inner surface of the gate trench, a gate electrode that is buried in the gate trench through the gate insulating film and that has a lower electrode and an upper electrode that are separated upwardly and downwardly from each other with an intermediate insulating film between the lower electrode and the upper electrode, and a gate contact that is formed in the gate trench so as to pass through the upper electrode and through the intermediate insulating film and so as to reach the lower electrode and that electrically connects the lower electrode and the upper electrode together.

22 Claims, 52 Drawing Sheets

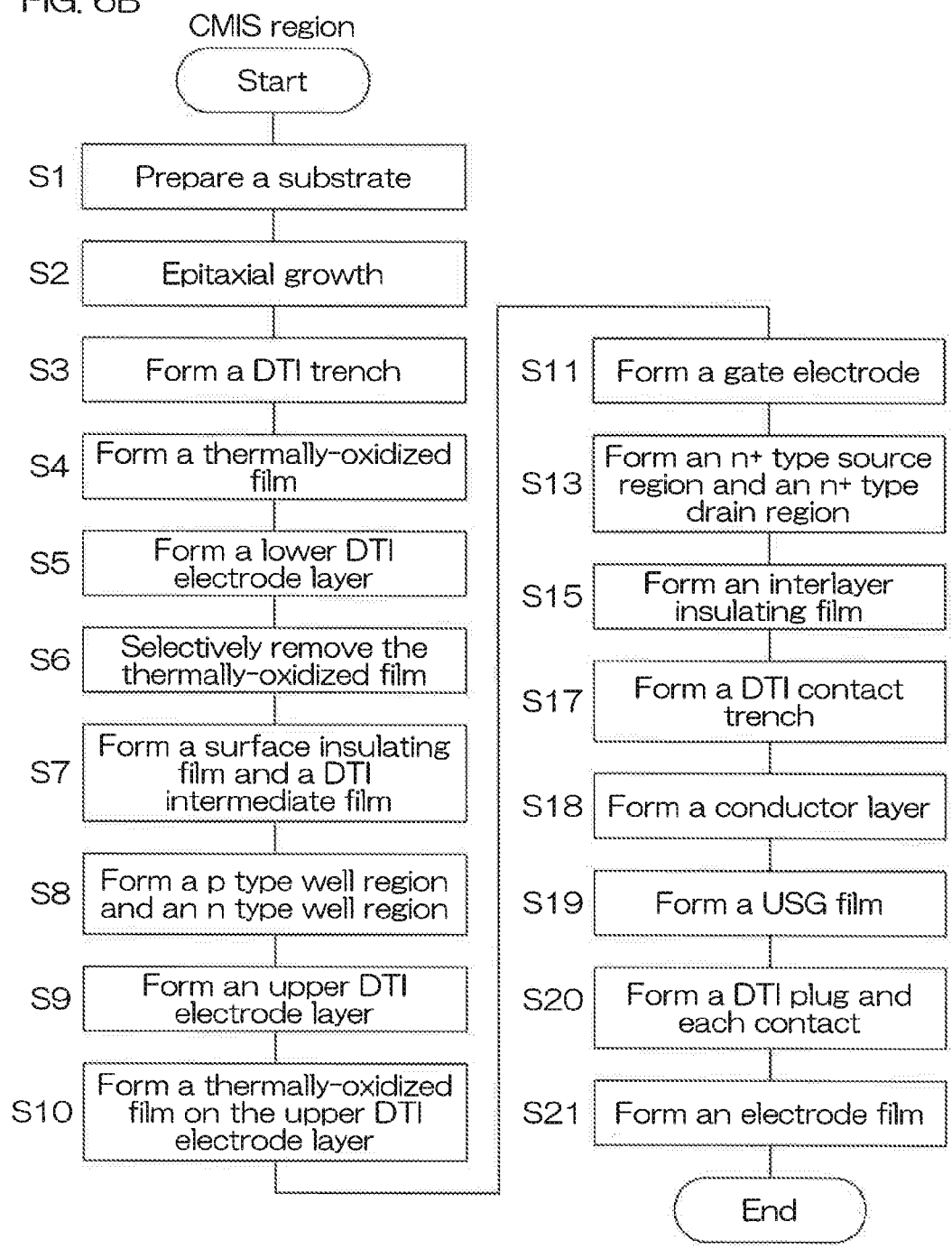

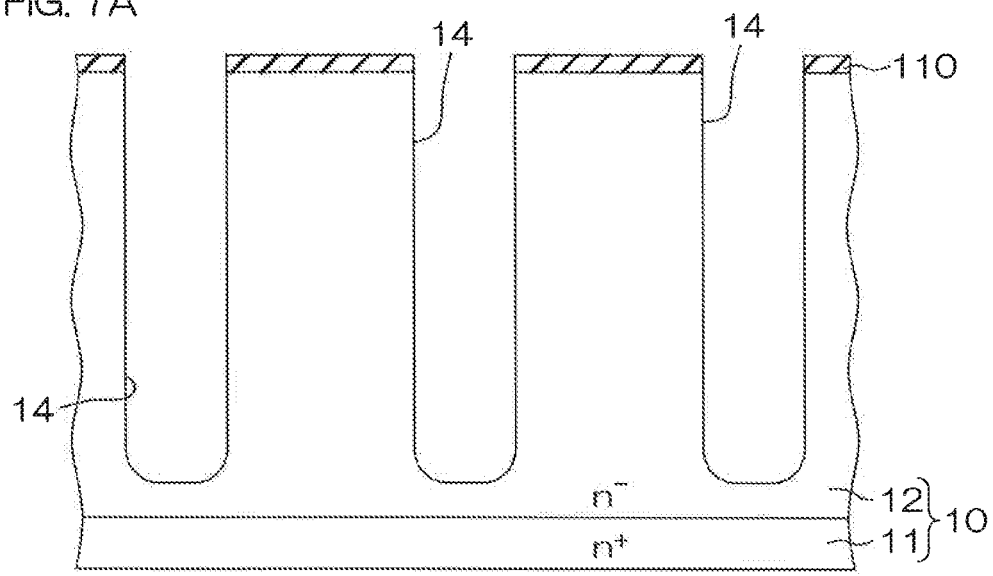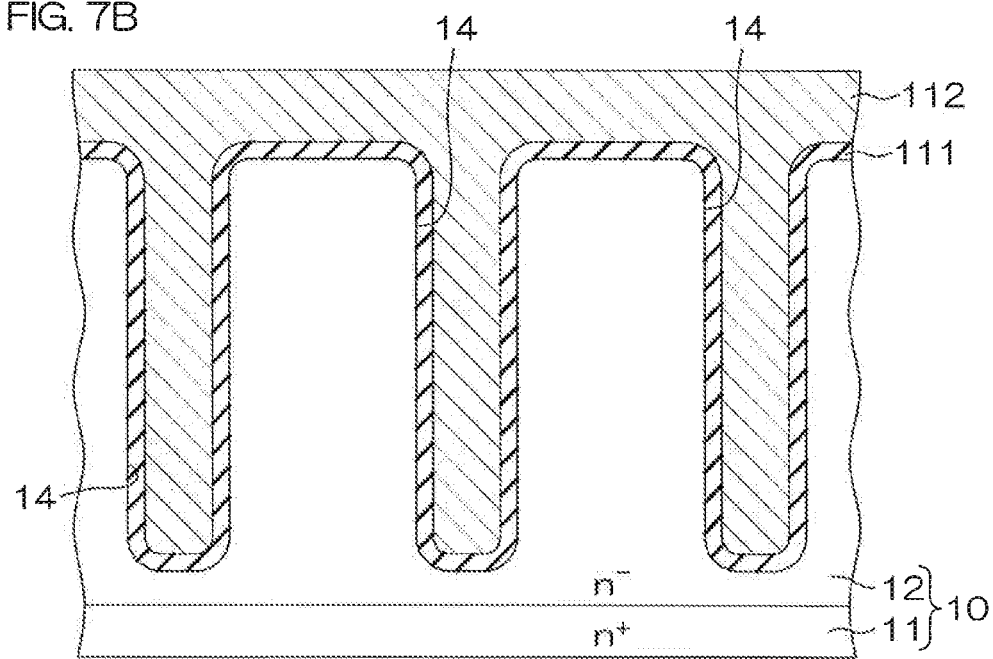

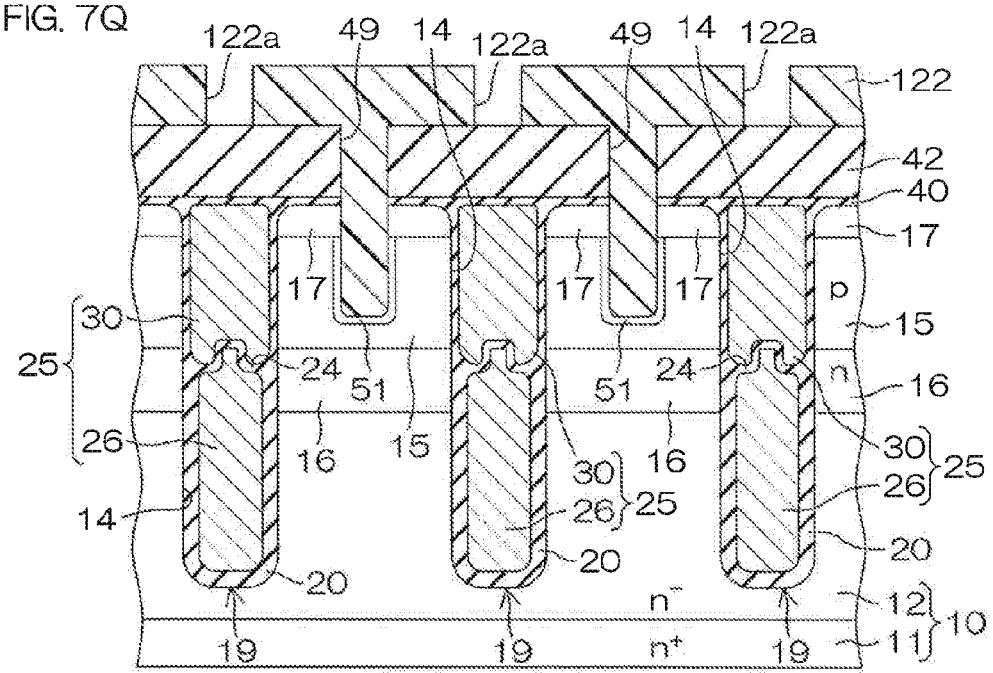
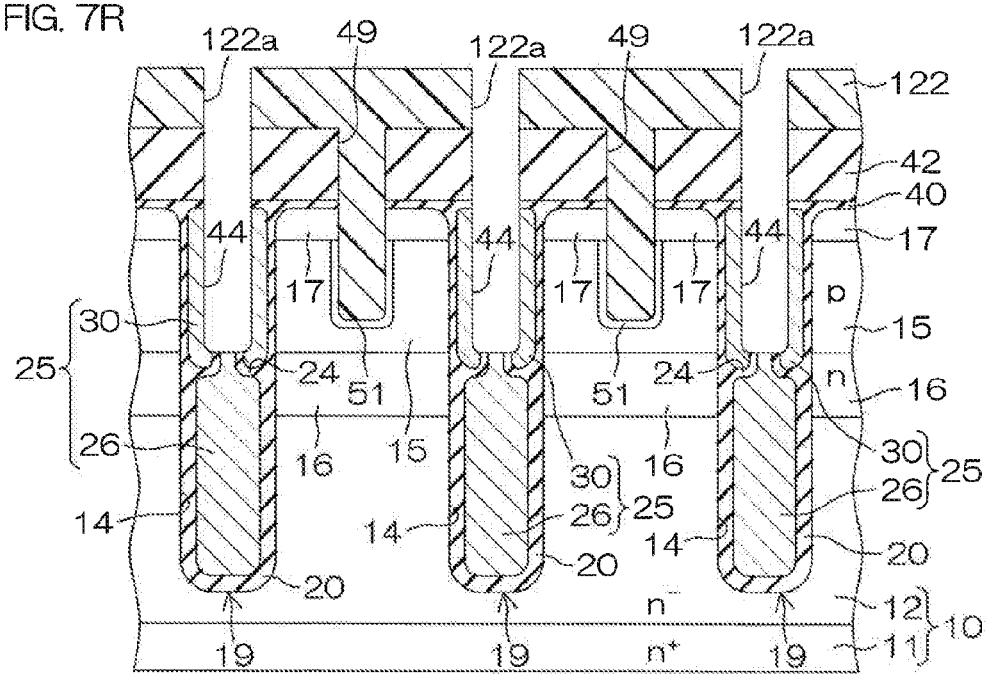

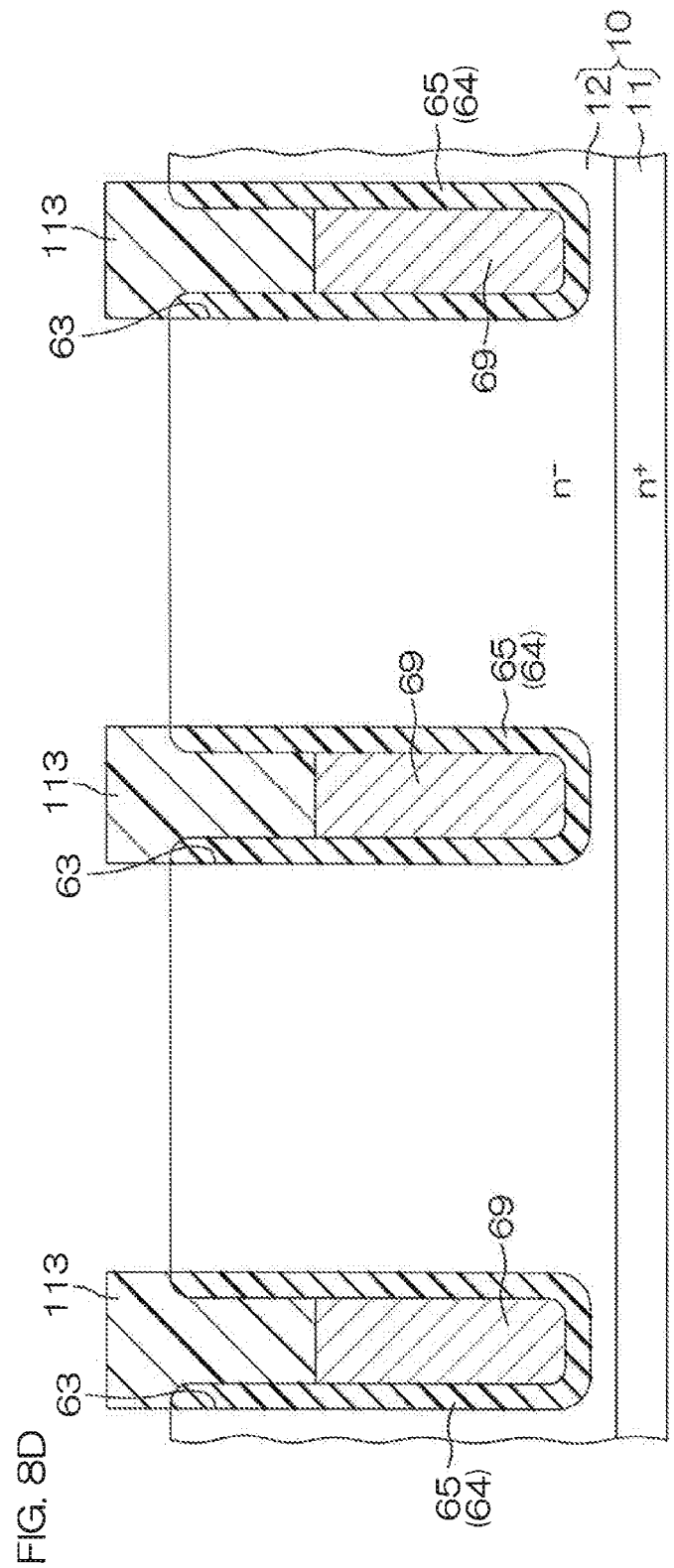

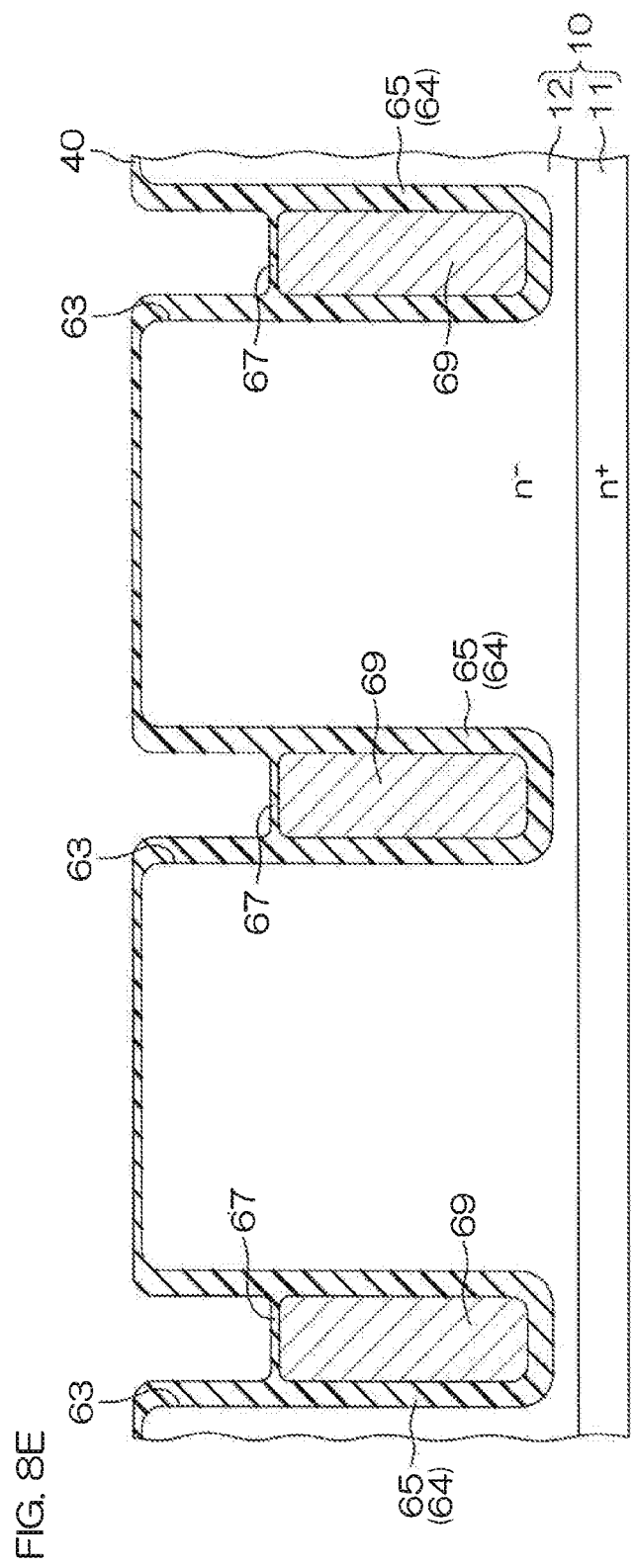

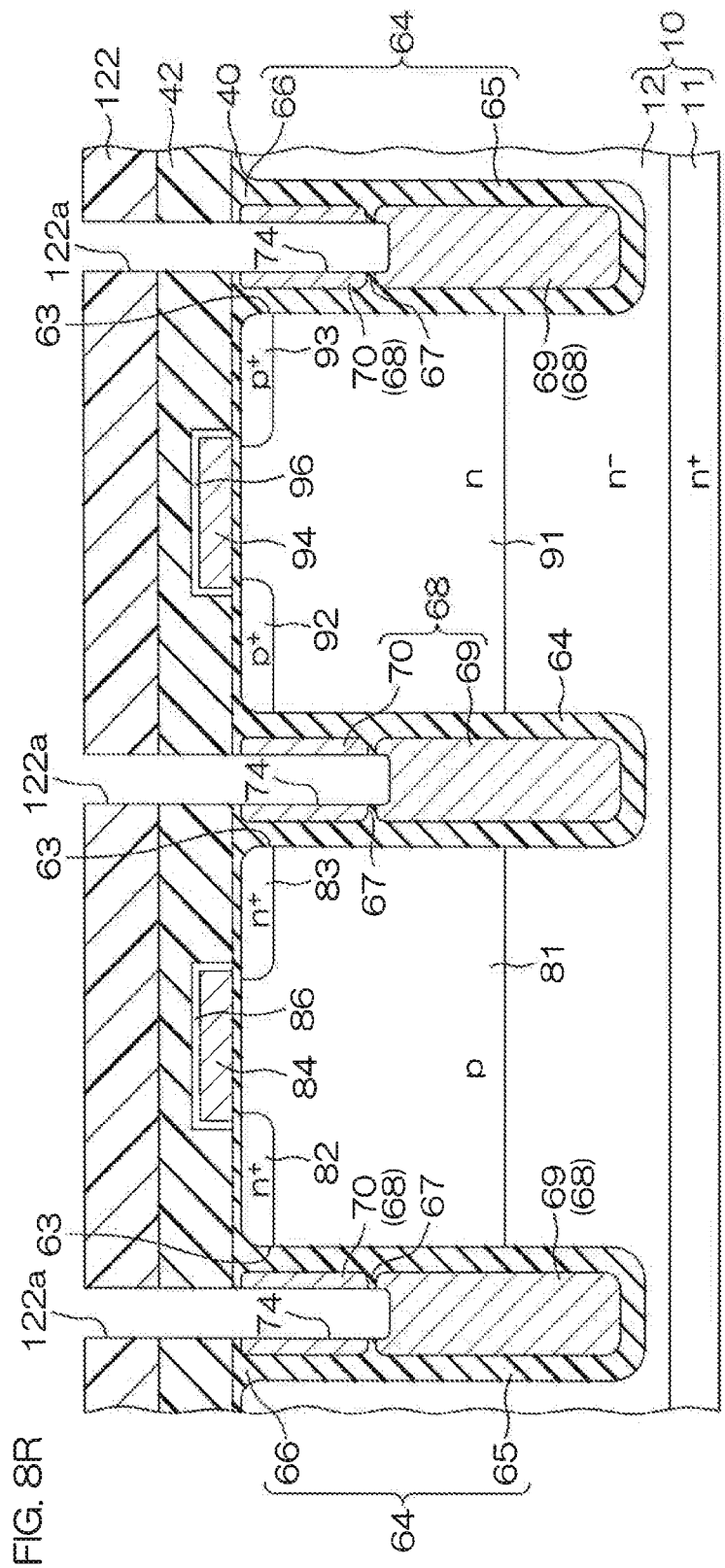

SEMICONDUCTOR DEVICE HAVING TRENCH GATE STRUCTURE AND METHOD FOR MANUFACTURING THE SEMICONDUCTOR DEVICE

CROSS-REFERENCE TO RELATED APPLICATIONS

The present application corresponds to Japanese Patent Application No. 2014-228459 filed in the Japan Patent Office on Nov. 10, 2014, and the entire disclosure of this application is incorporated herein by reference.

TECHNICAL FIELD

The present invention relates to a semiconductor device having a trench gate structure and a method for manufacturing the semiconductor device.

BACKGROUND ART

Patent Document 1 (Japanese Translation of International Application No. 2000-511353) discloses a trench-gate type power MOSFET that includes a semiconductor substrate in which a trench is formed, a gate embedded in the trench, a source region formed at a surface portion of the semiconductor substrate, a body region formed below the source region, and a drain region formed below the body region.

SUMMARY OF INVENTION

A main object of the present invention is to provide a semiconductor device that is capable of restraining a rise in temperature in the trench gate structure and that has excellent reliability, and is to provide a method for manufacturing the semiconductor device.

Another object of the present invention is to provide a semiconductor device that is capable of avoiding a complex structure and that is capable of lowering resistance, and is to provide a method for manufacturing the semiconductor device.

BRIEF DESCRIPTION OF DRAWING

FIG. 6A and FIG. 6B are flowcharts to describe one example of a manufacturing process of the VDMIS region according to the semiconductor device of FIG. 1.

DESCRIPTION OF EMBODIMENT

Figure 1:
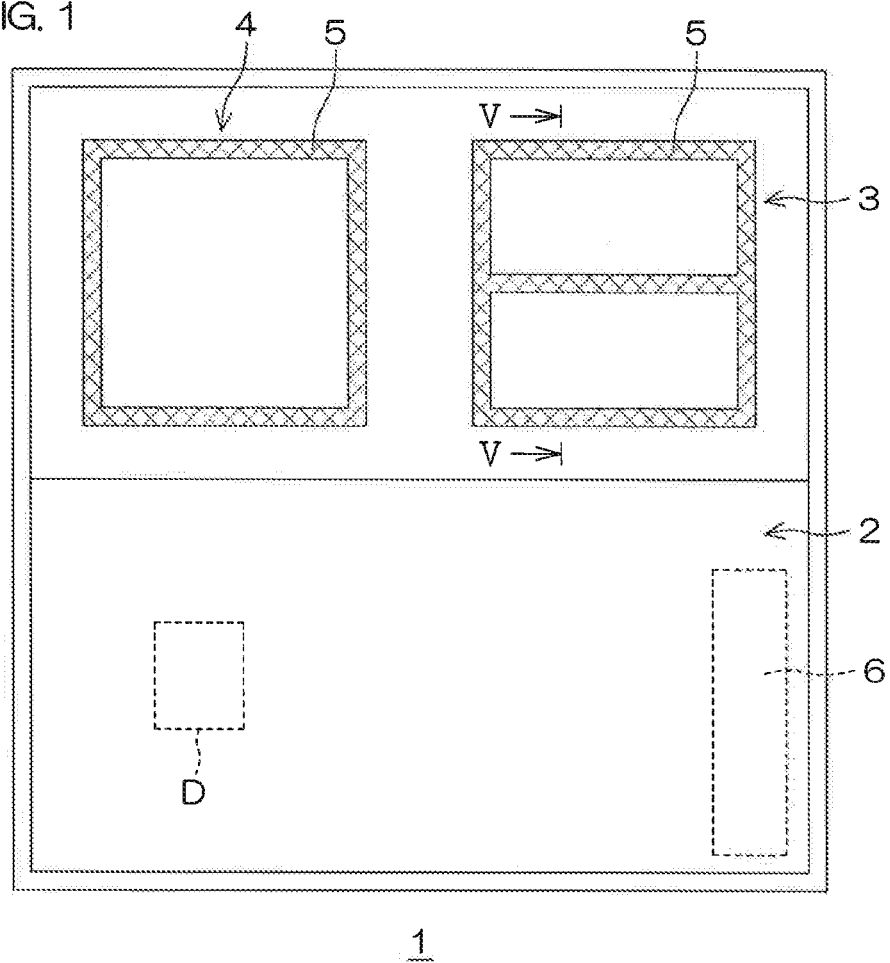
FIG. 1 is a schematic plan view of a semiconductor device according to a first preferred embodiment of the present invention.

A semiconductor device to achieve the aforementioned objects includes a semiconductor layer in which a gate trench is formed, a gate insulating film formed along an inner surface of the gate trench, a gate electrode that is buried in the gate trench through the gate insulating film and that has a lower electrode and an upper electrode that are separated upwardly and downwardly from each other with an intermediate insulating film between the lower electrode and the upper electrode, and a gate contact that is formed in the gate trench so as to pass through the upper electrode and through the intermediate insulating film and so as to reach the lower electrode and that electrically connects the lower electrode and the upper electrode together.

Hereinafter, let it be supposed that the term "to pass through" denotes that a component passes through a to-be-penetrated object and then exits from the object to an opposite side, and, in addition, denotes that a component reaches another component through a portion formed by removing a part of a to-be-penetrated object.

According to this arrangement, a trench gate structure having the gate electrode buried in the gate trench is formed. Additionally, the gate electrode has a split gate structure that includes the lower electrode and the upper electrode that are separated upwardly and downwardly between which the intermediate insulating film is sandwiched.

A method for drawing around and connecting each of the lower and upper electrodes to the end of the gate trench is mentioned as an example of a connection method of the lower electrode and the upper electrode in the split gate structure. In this method, for example, each of the lower and upper electrodes is formed so as to extend to the end of the gate trench along the formation direction of the gate trench while maintaining a state of being electrically separated by the intermediate insulating film.

A lower-electrode contact that is connected only to the lower electrode and an upper-electrode contact that is connected only to the upper electrode are formed at the end of the gate trench. The lower-electrode contact and the upper-electrode contact are formed so as to be exposed on the opening side of the gate trench. The lower-electrode contact and the upper-electrode contact are connected together by means of an electrode film or the like that is formed outside the gate trench. As a result, the lower electrode and the upper electrode are electrically connected (short-circuited) together in a region outside the gate trench.

However, in the thus formed arrangement, the lower electrode and the upper electrode are separated from each other by means of the intermediate insulating film in the gate trench. This makes it impossible to transmit heat generated in the lower electrode directly to the upper electrode and makes it impossible to dissipate the heat outwardly from the gate trench. Additionally, a connection portion between the lower electrode and the upper electrode is apart from a heat generation source, and therefore it is impossible to efficiently dissipate the heat. Therefore, the inside of the gate trench is liable to be filled with the heat, and it is impossible to say that this is desirable from the viewpoint of reliability. Therefore, in order to improve the reliability of the trench gate structure and, consequently, to improve the reliability of the semiconductor device, it is necessary to restrain a rise in temperature in the gate trench.

Additionally, in an arrangement in which each of the lower and upper electrodes is drawn around to the end of the gate trench, a resistance value increases in proportion to the increase of the wiring length of the lower and upper electrodes in addition to the fact that the structure of the device becomes complex. Additionally, the resistance values of the lower and upper electrodes are liable to increase in proportion to a rise in temperature in the gate trench. As a result, this also causes obstruction to the lowering of resistance.

On the other hand, according to the arrangement of the present invention, the gate contact is formed in the gate trench so as to pass through the upper electrode and through the intermediate insulating film and so as to reach the lower electrode. The gate contact electrically connects (short-circuits) the lower electrode and the upper electrode together in the gate trench. Additionally, the gate contact is formed near a heat generation source, and therefore it is possible to allow the gate contact to function as a heat dissipation material.

This makes it possible to dissipate heat generated in the lower electrode outwardly from the gate trench through the gate contact, and hence makes it possible to restrain a rise in temperature in the gate trench. Additionally, when the semiconductor device of the present invention is employed as an in-vehicle power-based switching element, it is possible to realize an excellent dynamic clamp capacity by means of the restraint effect of a rise in temperature. Therefore, according to the arrangement of the present invention, it is possible to provide a semiconductor device that has excellent reliability.

Additionally, according to the arrangement of the present invention, the electric connection (short circuit) between the lower electrode and the upper electrode is achieved by the gate contact, and therefore, as described above, the lower electrode and the upper electrode are not required to be drawn around to the end of the gate trench. This makes it possible to avoid the structural complication of the semiconductor device. Additionally, this makes it possible to prevent the increase of the resistance value caused by drawing around the lower electrode and the upper electrode. Still additionally, it is possible to restrain a rise in temperature in the gate trench, and therefore it is also possible to restrain the increase of the resistance values of the lower and upper electrodes that is caused by a rise in temperature. As a result, it is possible to lower the resistance of the semiconductor device.

A semiconductor device that fulfills the same effects as the aforementioned effects is producible by performing a semiconductor-device manufacturing method including a step of forming a gate trench in a semiconductor layer, a step of forming a gate insulating film along an inner surface of the gate trench, a step of forming a lower electrode by burying a conductive material to a halfway portion in a depth direction of the gate trench, a step of forming an intermediate insulating film by coating the lower electrode with an insulating film, a step of forming an upper electrode by burying a conductive material so as to backfill the gate trench from above the intermediate insulating film, and a step of forming a gate contact that electrically connects the lower electrode and the upper electrode together by allowing the gate contact to pass through the upper electrode and through the intermediate insulating film and to reach the lower electrode.

Preferably, the gate contact is formed along a longitudinal direction of the gate trench.

According to this arrangement, the gate contact is formed along the gate trench, and therefore it is possible to effectively enlarge an area in which the gate contact functions as a heat dissipation material. As a result, it is possible to effectively improve a heat dissipation capability brought about by the gate contact.

The semiconductor device that fulfills the same effects as these effects is producible by forming the gate contact along the longitudinal direction of the gate trench in the manufacturing method of the semiconductor device.

In the semiconductor device, the gate contact may have a bottom portion that is contiguous to an upper end portion of the lower electrode and that is contiguous to the intermediate insulating film. Additionally, in the semiconductor device, the gate contact may have a bottom portion contiguous to an upper end portion of the lower electrode and may have a side portion contiguous to the intermediate insulating film. It is possible to excellently electrically connect (short-circuit) the upper electrode and the lower electrode together by positioning the bottom portion of the gate contact at a depth lower than the intermediate insulating film. In these arrangements, the upper electrode may have a lower end portion that extends toward the lower electrode side and that faces the side portion of the lower electrode with the intermediate insulating film therebetween.

Preferably, the semiconductor device includes a second conductivity type body region formed at a surface portion of the semiconductor layer and a first conductivity type region formed in the body region, in which the gate insulating film includes a thick film portion contiguous to the lower electrode and a thin film portion that is smaller in thickness than the thick film portion and that is interposed between the upper electrode and the body region.

According to this arrangement, the lower electrode faces the semiconductor layer with the thick film portion of the gate insulating film therebetween, and therefore it is possible to reduce the capacity element in the lower part of the gate electrode. Additionally, the upper electrode faces the body region with the thin film portion of the gate insulating film therebetween. This makes it possible to improve channel controllability. As a result, it is possible to effectively improve the switching response speed of the semiconductor device.

Here, when a semiconductor layer having a first conductivity type layer is formed and when the first conductivity type region includes a source region, it is possible to provide a semiconductor device having a VDMIS (Vertical Double Diffused Metal-Insulator-Semiconductor Field-Effect Transistor). On the other hand, when a semiconductor layer having a second conductivity type layer is formed and when the first conductivity type region includes an emitter region, it is possible to provide a semiconductor device having an IGBT (Insulated Gate Bipolar Transistor). Of course, a semiconductor layer having both the first conductivity type layer and the second conductivity type layer may be formed, and a semiconductor device having both characteristics of the VDMIS and the IGBT may be manufactured.

The semiconductor device that fulfills the same effects as these effects is producible by performing the semiconductor-device manufacturing method including a step of, prior to a step of forming the intermediate insulating film, allowing the gate insulating film contiguous to the lower electrode to remain as a thick film portion by selectively removing the gate insulating film to the halfway portion in the depth direction of the gate trench, the step of forming the intermediate insulating film including a step of forming the insulating film that has a thickness smaller than the thick film portion along the inner surface of the gate trench from which the gate insulating film has been removed and forming a thin film portion serving as the gate insulating film, a step of forming a body region facing the upper electrode with the thin film portion of the gate insulating film between the body region and the upper electrode by implanting a second conductivity type impurity into a surface portion of the semiconductor layer, and a step of forming a first conductivity type region by implanting a first conductivity type impurity into a surface portion of the semiconductor layer in the body region.

Preferably, in the semiconductor device, the thin film portion of the gate insulating film has a thickness of 1/10 or less with respect to the thick film portion of the gate insulating film.

The semiconductor device may include a contact for use in the first conductivity type region, the contact being formed so as to pass through the first conductivity type region and so as to reach the body region.

According to this arrangement, the contact for use in the first conductivity type region also functions as a heat dissipation material in the same way as the gate contact. Therefore, heat generated in the semiconductor layer is dissipated outwardly from the semiconductor layer through the contact for use in the first conductivity type region. As a result, the heat dissipation capability of the entire semiconductor device is improved. Additionally, it is possible to form the contact for use in the first conductivity type region even closer to the gate electrode than in a case in which the contact for use in the first conductivity type region is formed on the semiconductor layer. This makes it possible to further improve channel controllability.

The semiconductor device that fulfills the same effects as these effects is producible by performing the semiconductor-device manufacturing method including a step of forming a contact for use in the first conductivity type region, the contact passing through the first conductivity type region and reaching the body region.

In the semiconductor device, the contact for use in the first conductivity type region may have a bottom portion at a position shallower than the bottom portion of the gate contact. Preferably, in the semiconductor device, the contact for use in the first conductivity type region is formed along the longitudinal direction of the gate trench. According to this arrangement, the contact for use in the first conductivity type region is formed along the gate trench, and therefore it is possible to further enlarge an area in which the contact for use in the first conductivity type region functions as a heat dissipation material. As a result, it is possible to further improve a heat dissipation capability brought about by the contact for use in the first conductivity type region.

Preferably, in the semiconductor device, the contact for use in the first conductivity type region includes tungsten. According to this arrangement, the contact for use in the first conductivity type region that has an excellent heat dissipation capability is realized by tungsten that has excellent thermal conductivity.

The semiconductor device that fulfills the same effects as these effects is producible by forming the contact for use in the first conductivity type region that includes tungsten in the semiconductor-device manufacturing method.

Preferably, the semiconductor device includes an interlayer insulating film formed on the semiconductor layer, in which the gate contact is formed so as to pass through the interlayer insulating film. According to this arrangement, an area in which the gate contact functions as a heat dissipation material is further enlarged. As a result, the heat dissipation capability of the gate contact is even further improved.

The semiconductor device that fulfills the same effects as these effects is producible by performing the semiconductor-device manufacturing method including a step of forming an interlayer insulating film with which the semiconductor layer is covered after the step of forming the upper electrode and prior to the step of forming the gate contact, in which the gate contact is formed so as to pass through the interlayer insulating film, the upper electrode, and the intermediate insulating film in this order and so as to reach the lower electrode.

Preferably, in the semiconductor device, the gate contact includes tungsten. According to this arrangement, the gate contact that has an excellent heat dissipation capability is realized by tungsten that has excellent thermal conductivity.

The semiconductor device that fulfills the same effects as these effects is producible by performing the semiconductor-device manufacturing method in which the gate contact that includes tungsten is formed.

In the semiconductor device, the semiconductor layer may include an element region electrically separated by a DTI (Deep Trench Isolation) structure, and the DTI structure may include a DTI insulating film formed along an inner surface of a DTI trench formed in the semiconductor layer, a DTI electrode that is buried in the DTI trench through the DTI insulating film and that has a lower DTI electrode and an upper DTI electrode that are separated upwardly and downwardly from each other with the DTI intermediate insulating film between the lower DTI electrode and the upper DTI electrode, and a DTI contact that is formed in the DTI trench so as to pass through the upper DTI electrode and through the DTI intermediate insulating film and so as to reach the lower DTI electrode and that electrically connects the lower DTI electrode and the upper DTI electrode together.

According to this arrangement, the DTI structure has a split structure that includes a lower DTI electrode and an upper DTI electrode that are separated upwardly and downwardly from each other with an intermediate DTI insulating film therebetween. The element region is electrically separated from other regions by means of the DTI structure. Additionally, according to the DTI structure, the DTI contact also functions as a heat dissipation material in the same way as the gate contact. Therefore, heat generated in the element region or in the semiconductor layer is dissipated outwardly from the semiconductor layer by means of the DTI structure. Moreover, it is possible to produce this DTI structure through the same process as the trench gate structure (the split gate structure). Therefore, the number of manufacturing steps never increases only for forming the DTI structure. Preferably, a ground potential is applied to the DTI contact.

The element region may include a CMIS(Complementary MIS) region, the CMIS region having a first conductivity type MISFET (Metal-Insulator-Semiconductor Field-Effect Transistor) and a second conductivity type MISFET.

According to this arrangement, it is possible to provide a semiconductor device having an IPM (Intelligent Power Module) structure in which the CMIS region serving as a control portion and the VDMIS region serving as a power portion are formed integrally with each other.

Preferred embodiments of the present invention will be hereinafter described in detail with reference to the accompanying drawings.

First Preferred Embodiment

FIG. 1 is a schematic plan view of a semiconductor device 1 according to a first preferred embodiment of the present invention.

The semiconductor device 1 is a small semiconductor chip formed in a quadrangular shape when viewed planarly, and includes a VDMIS region 2 that has a VDMIS (Vertical Double Diffused Metal-Insulator-Semiconductor Field-Effect Transistor), a CMIS region 3 that has a CMIS (Complementary MIS), and a passive element region 4 that has passive elements, such as a capacitor and a resistor. The VDMIS region 2 is formed as a power portion. On the other hand, the CMIS region 3 is formed as a control portion. As a result, the semiconductor device 1 has an IPM (Intelligent Power Module) structure.

A source pad 6 to which, for example, a bonding wire is connected is selectively disposed on an uppermost layer of the VDMIS region 2 (see the broken line portion of FIG. 1). The present preferred embodiment shows an example in which the source pad is disposed at an end of the VDMIS region 2.

The CMIS region 3 and the passive element region 4 are each formed apart from the VDMIS region 2, and are each surrounded by a DTI (Deep Trench Isolation) structure 5 having a square annular shape when viewed planarly (see the cross hatching portion). The CMIS region 3 and the passive element region 4 are each separated electrically from the VDMIS region 2 by means of the DTI structure 5.

Hereinafter, an arrangement of the VDMIS region 2 will be first described with reference to FIG. 2 to FIG. 4, and then an arrangement of the CMIS region 3 will be described with reference to FIG. 5. A description of an arrangement of the passive element region 4 is omitted.

<VDMIS Region 2>

Figure 2:
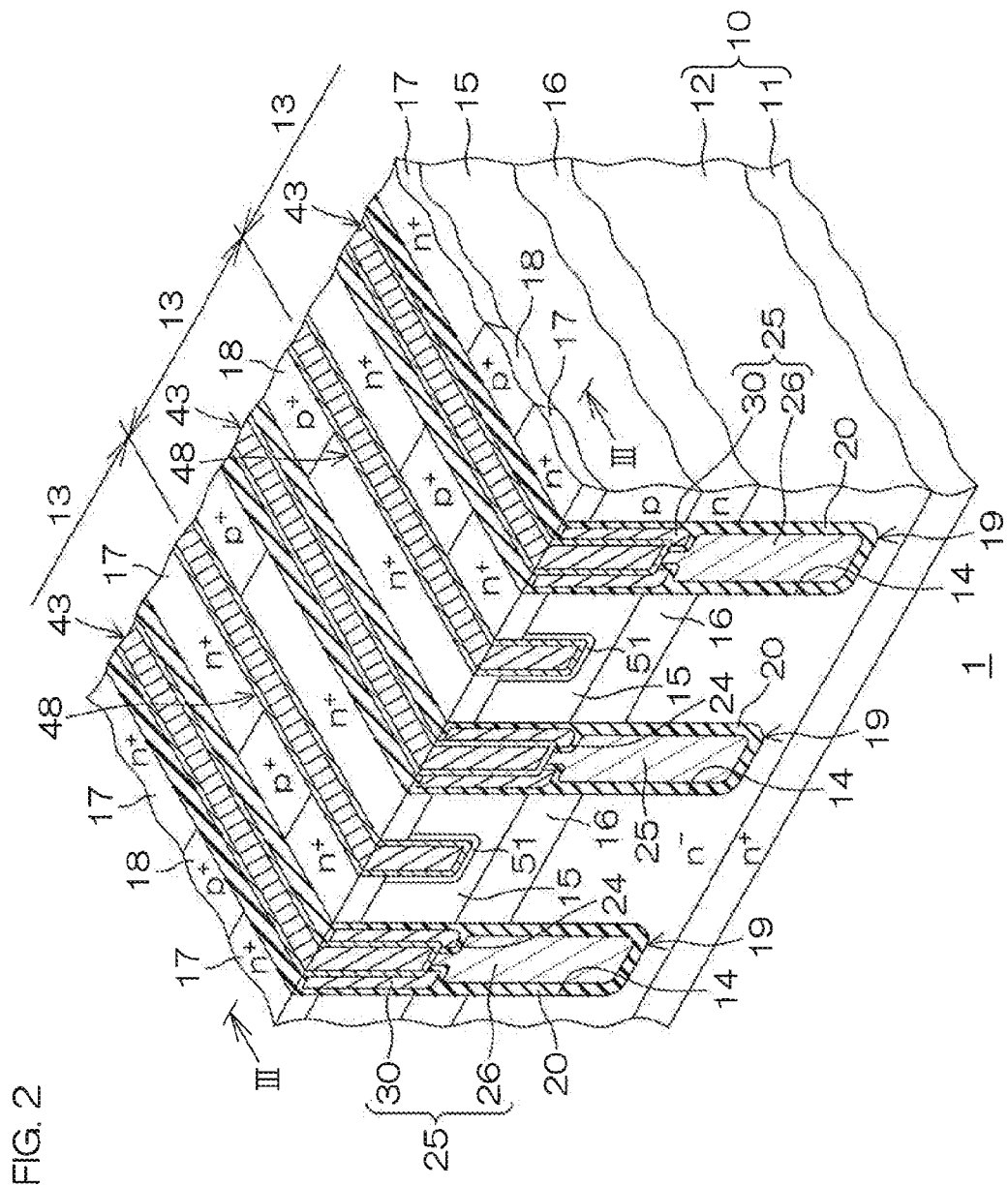
FIG. 2 is a perspective cross-sectional view of a region surrounded by the broken line of a VDMIS region of FIG. 1, showing a structure of a semiconductor layer while excluding an arrangement formed on the semiconductor layer.

FIG. 2 is a perspective cross-sectional view of a region D surrounded by the broken line of the VDMIS region 2 shown in FIG. 1. FIG. 3 is a cross-sectional view taken along line III-III shown in FIG. 2. In FIG. 2, a structure of a semiconductor layer 10 is shown, in which an arrangement formed on the semiconductor layer 10 is selectively excluded.

The semiconductor device 1 includes the semiconductor layer 10 that is one example of the semiconductor layer of the present invention. The semiconductor layer 10 includes an n$^+$ type semiconductor substrate 11 and an n$^-$ type epitaxial layer 12 formed on the semiconductor substrate 11. The semiconductor substrate 11 has an impurity concentration of, for example, $1.0 \times 10^{18}$ cm$^{-3}$ to $1.0 \times 10^{20}$ cm$^{-3}$ (in the present preferred embodiment, $2.0 \times 10^{19}$ cm$^{-3}$). The epitaxial layer 12 has an impurity concentration of, for example, $1.0 \times 10^{15}$ cm$^{-3}$ to $1.0 \times 10^{17}$ cm$^{-3}$ (in the present preferred embodiment, $1.0 \times 10^{16}$ cm$^{-3}$). The n type impurities are, for example, N (nitrogen), As (arsenic), P (phosphorus), or the like (hereinafter, the same applies).

A plurality of unit cells 13 forming a VDMIS are formed in the epitaxial layer 12. The present preferred embodiment shows an example in which the unit cells 13 are formed in a stripe manner. Hereinafter, an arrangement of the unit cells 13 will be specifically described.

A plurality of gate trenches 14 spaced out, which form a part of the unit cell 13, are formed in the epitaxial layer 12 in a stripe manner. The width of the gate trench 14 is, for example, 0.5 μm to 1.0 μm (in the present preferred embodiment, 0.6 μm). The depth of the gate trench 14 is, for example, 4.0 μm to 5.0 μm (in the present preferred embodiment, 4.2 μm). The side portion of each gate trench 14 may be formed perpendicularly to the surface of the epitaxial layer 12. Additionally, the edge portion at which the side portion and the bottom portion of each gate trench 14 intersect with each other may be formed so as to be curved outwardly from each gate trench 14.

A p type body region 15, an n type drift region 16, an n type source region 17, and a p type contact region 18, each of which forms a part of the unit cell 13, are formed between mutually adjoining gate trenches 14. The n type source region 17 is one example of a first conductivity type region of the present invention.

The p type body region 15 is formed along the stripe direction of the gate trench 14. The p type body region 15 is formed, for example, 1.0 μm to 1.5 μm deep from the surface of the epitaxial layer 12. The p type body region 15 is exposed to the side portion of each gate trench 14, and forms a part of the side portion of the gate trench 14. The p type body region 15 has an impurity concentration of, for example, $1.0 \times 10^{16}$ cm$^{-3}$ to $1.0 \times 10^{18}$ cm$^{-3}$ (in the present preferred embodiment, $3.0 \times 10^{17}$ cm$^{-3}$). The p type impurities are, for example, B (boron), Al (aluminum), or the like (hereinafter, the same applies).

The n type drift region 16 is formed under the p type body region 15 along the stripe direction of the gate trench 14. The n type drift region 16 is formed at a depth of a halfway portion in the depth direction of each gate trench 14 so as to come into contact with the bottom of the p type body region 15. The n type drift region 16 is exposed to the side portion of each gate trench 14, and forms a part of the side portion of the gate trench 14. The n type drift region 16 may have an impurity concentration higher than the epitaxial layer 12.

Figure 3:
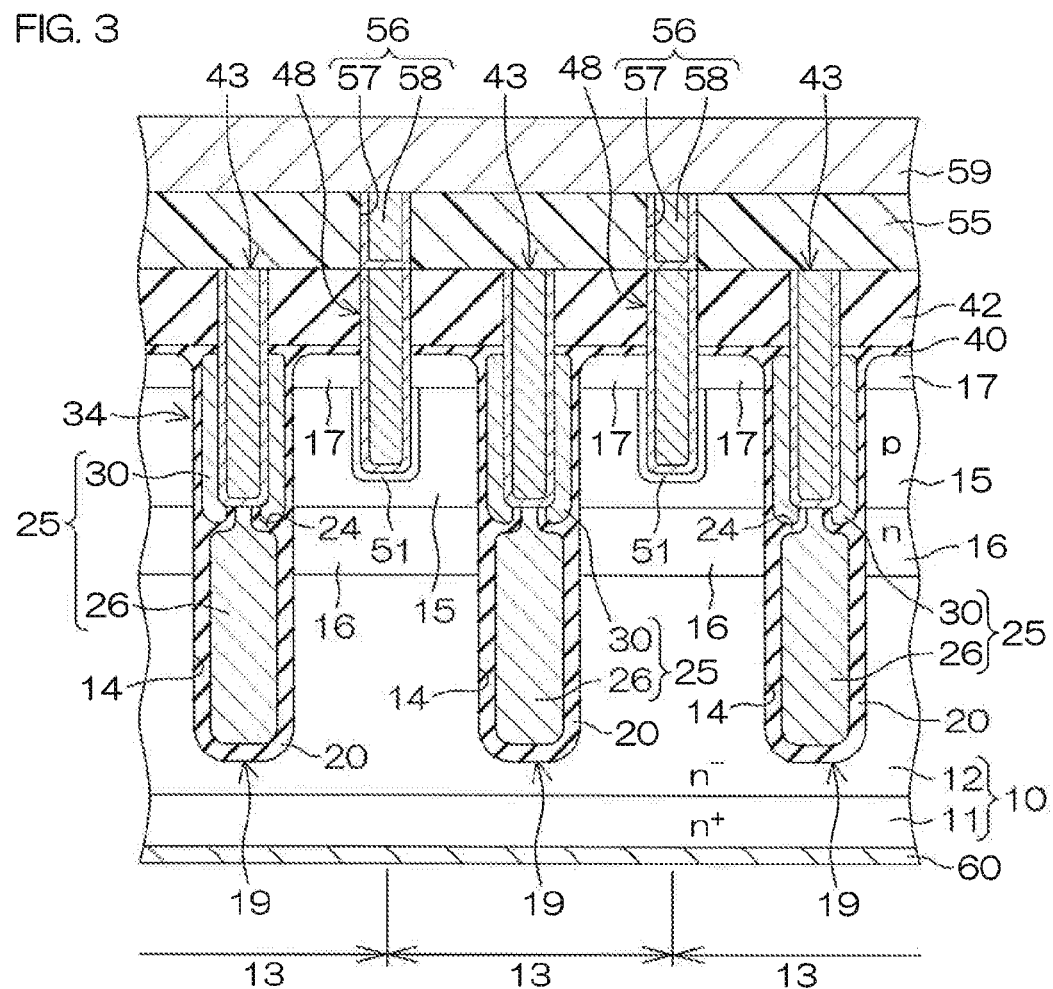
FIG. 3 is a cross-sectional view taken along line III-III shown in FIG. 2.

As shown in FIG. 2 and FIG. 3, the n type source region 17 and the p type contact region 18 are formed more shallowly than the p type body region 15, and are exposed from the surface of the epitaxial layer 12. The n type source region 17 is formed along the stripe direction of each gate trench 14 so as to be exposed from both side portions of each gate trench 14 (i.e., from both side portions in the direction perpendicular to the stripe direction). The n type source region 17 forms a part of the side portion of the gate trench 14. The n type source region 17 may have an impurity concentration higher than the epitaxial layer 12.

On the other hand, the p type contact region 18 is selectively formed so as to lie in a halfway portion in the stripe direction of the n type source region 17, and is exposed from the side portion of the gate trench 14. The p type contact region 18 may have an impurity concentration higher than the p type body region 15. The p type contact region 18 forms a part of the side portion of the gate trench 14.

A gate electrode 25 is embedded in the gate trench 14 with a gate insulating film 20 therebetween. As a result, a trench gate structure 19 is formed. The gate electrode 25 has a split gate structure that includes a lower electrode layer 26 and an upper electrode layer 30 that have been separated upwardly and downwardly between which an intermediate insulating film 24 is sandwiched. The lower electrode layer 26 and the upper electrode layer 30 may be polysilicon layers each of which is doped with, for example, p type impurities.

An arrangement of the trench gate structure 19 will be hereinafter described in more detail with reference to FIG. 4. FIG. 4 is an enlarged cross-sectional view around the trench gate structure 19 shown in FIG. 3.

Figure 4:
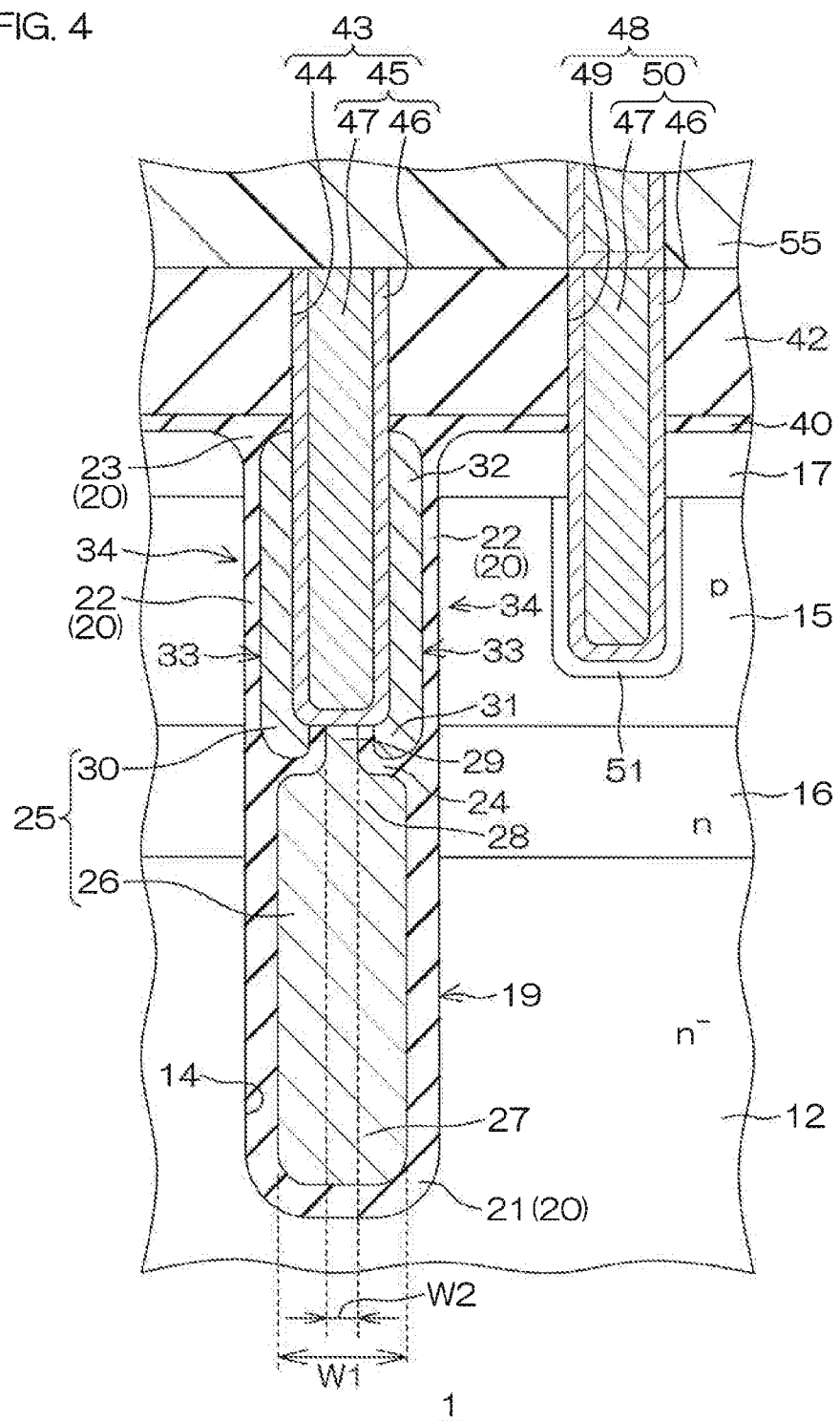
FIG. 4 is an enlarged cross-sectional view around a trench gate structure shown in FIG. 3.

As shown in FIG. 4, the gate insulating film 20 includes a thick film portion 21 contiguous to the lower electrode layer 26 and a first thin film portion 22 that has a thickness smaller than the thick film portion 21 and that is interposed between the upper electrode layer 30 and the p type body region 15. The gate insulating film 20 additionally includes a second thin film portion 23 that has a thickness smaller than the thick film portion 21 and that covers the upper electrode layer 30. Preferably, the first thin film portion 22 of the gate insulating film 20 has a thickness equal to or lower than 1/10 of the thickness of the thick film portion 21. The thick film portion 21 of the gate insulating film 20 may have a thickness of, for example, 3000 Å to 5000 Å. The first thin film portion 22 of the gate insulating film 20 may have a thickness of, for example, 250 Å to 500 Å. The gate insulating film 20 may be, for example, a silicon oxide film ($SiO_2$).

The lower electrode layer 26 of the gate electrode 25 is formed so as to backfill the gate trench 14 to the halfway portion in the depth direction of the gate trench 14 through the thick film portion 21 of the gate insulating film 20. The lower electrode layer 26 has a lower end portion 27 facing the epitaxial layer 12 (an end portion on the bottom side of the gate trench 14) with the thick film portion 21 of the gate insulating film 20 therebetween. The lower electrode layer 26 additionally has an upper end portion 28 facing the n type drift region 16 (an end portion on the opening side of the gate trench 14) with the thick film portion 21 of the gate insulating film 20 therebetween. The upper end portion 28 of the lower electrode layer 26 includes a convex portion 29 formed so as to protrude toward the opening side of the gate trench 14.

The present preferred embodiment shows an example in which the convex portion 29 of the lower electrode layer 26 has a width W2 smaller than a width W1 of the other parts of the lower electrode layer 26 with respect to the direction perpendicular to the depth direction of the gate trench 14. However, an arrangement may be formed so that the upper end portion 28 is regarded as not having the convex portion 29 by making the convex portion 29 substantially equal in width to the other parts of the lower electrode layer 26 (width W1≈width W2). The intermediate insulating film 24 is formed so as to cover this convex portion 29.

The intermediate insulating film 24 is formed along the convex portion 29 of the lower electrode layer 26. The intermediate insulating film 24 is formed at a boundary between the thick film portion 21 and the first thin film portion 22 so as to be integrally continuous with the thick film portion 21 and with the first thin film portion 22 of the gate insulating film 20. In other words, the intermediate insulating film 24 forms a part of the gate insulating film 20. The intermediate insulating film 24 is smaller in thickness than the thick film portion 21 of the gate insulating film 20, and is greater in thickness than the first thin film portion 22 of the gate insulating film 20. The intermediate insulating film 24 may have a thickness greater than 500 Å, e.g., may have a thickness of 600 Å. The intermediate insulating film 24 may be, for example, a silicon oxide film ($SiO_2$).

The upper electrode layer 30 of the gate electrode 25 is formed on the intermediate insulating film 24 so as to backfill the gate trench 14 through the first thin film portion 22 of the gate insulating film 20. The upper electrode layer 30 faces the p type body region 15 with the first thin film portion 22 of the gate insulating film 20 therebetween. More specifically, the upper electrode layer 30 has a lower end portion 31 (an end portion on the bottom side of the gate trench 14) that extends toward the lower electrode layer 26 and that crosses a boundary between the p type body region 15 and the n type drift region 16. The upper electrode layer 30 additionally has an upper end portion 32 (an end portion on the opening side of the gate trench 14) that extends toward the opening side of the gate trench 14 and that crosses a boundary between the p type body region 15 and the n type source region 17 and a boundary between the p type body region 15 and the p type contact region 18 (see FIG. 2 also).

The lower end portion 31 of the upper electrode layer 30 is positioned between the bottom of the p type body region 15 and the bottom of the n type drift region 16. The lower end portion 31 of the upper electrode layer 30 faces a side portion of the lower electrode layer 26 with the intermediate insulating film 24 therebetween. More specifically, the lower end portion 31 of the upper electrode layer 30 faces a side portion of the convex portion 29 of the lower electrode layer 26 with the intermediate insulating film 24 therebetween. The upper electrode layer 30 is formed so as to overlap with the upper end portion 28 of the lower electrode layer 26.

On the other hand, the upper end portion 32 of the upper electrode layer 30 is positioned between the opening of the gate trench 14 and the bottom of the n type source region 17 (the p type contact region 18). As a result, the upper electrode layer 30 has a side portion 33 facing the p type body region 15 with the first thin film portion 22 of the gate insulating film 20 therebetween from the side of the upper end portion 32 to the side of the lower end portion 31.

A region faced by the upper electrode layer 30 in the p type body region 15 with the first thin film portion 22 of the gate insulating film 20 therebetween is a channel region 34 of the VDMIS. The formation of a channel in the channel region 34 is controlled by the upper electrode layer 30 of the gate electrode 25.

The second thin film portion 23 of the gate insulating film 20 is formed so as to backfill the gate trench 14 from above the upper electrode layer 30 in such a way as to cover the upper end portion 32 of the upper electrode layer 30. The second thin film portion 23 of the gate insulating film 20 is contiguous to the n type source region 17 and the p type contact region 18 that are exposed from the side portion of the gate trench 14 (see FIG. 2 also). For example, the second thin film portion 23 of the gate insulating film 20 may have the same thickness (250 Å to 500 Å) as the first thin film portion 22. Additionally, for example, the second thin film portion 23 of the gate insulating film 20 may have the same thickness as the intermediate insulating film 24 (greater than 500 Å, e.g., equal to 600 Å). The second thin film portion 23 is formed so as to be integrally continuous with the first thin film portion 22 and with a surface insulating film 40 formed on the epitaxial layer 12.

The surface insulating film 40 may be, for example, a silicon oxide film (SiO$_2$). The surface insulating film 40 may have the same thickness as the first thin film portion 22 or the second thin film portion 23 of the gate insulating film 20.

In the VDMIS region 2, the gate electrode 25 is buried in the gate trench 14 in this way, and, as a result, the trench gate structure 19 is formed. The unit cell 13 forming the VDMIS is defined by a region sandwiched between the center lines (boundaries) between mutually adjoining trench gate structures 19. In other words, one unit cell 13 includes one trench gate structure 19.

As shown in FIG. 3 and FIG. 4, an interlayer insulating film 42 is formed on the epitaxial layer 12 (the surface insulating film 40) so as to cover the trench gate structure 19. The interlayer insulating film 42 may include, for example, silicon oxide (SiO$_2$), silicon nitride (SiN), and the like. The interlayer insulating film 42 has a thickness of, for example, 2000 Å to 5000 Å. The interlayer insulating film 42 has a gate contact 43 electrically connected to the trench gate structure 19.

The gate contact 43 is formed along the stripe direction of the gate trench 14. The gate contact 43 is formed so as to pass through the interlayer insulating film 42, the second thin film portion 23 of the gate insulating film 20, the upper electrode layer 30, and the intermediate insulating film 24 in this order and so as to reach the lower electrode layer 26. The gate contact 43 has a side portion contiguous to the interlayer insulating film 42, to the second thin film portion 23 of the gate insulating film 20, and to the upper electrode layer 30, and has a bottom portion contiguous to the upper end portion 28 (the convex portion 29) of the lower electrode layer 26 and to the intermediate insulating film 24. The lower electrode layer 26 and the upper electrode layer 30 that are formed in the gate trench 14 are electrically connected (short-circuited) together by means of the gate contact 43.

In the present preferred embodiment, let it be supposed that the term "to pass through" denotes that a component passes through a to-be-penetrated object and then exits from the object to an opposite side, and, in addition, denotes that a component reaches another component through a portion formed by removing a part of a to-be-penetrated object (hereinafter, the same applies). In other words, the gate contact 43 may be regarded as being formed so as to reach the lower electrode layer 26 through a portion formed by removing a part of the objects consisting of the interlayer insulating film 42, the second thin film portion 23 of the gate insulating film 20, the upper electrode layer 30, and the intermediate insulating film 24.

As shown in FIG. 4, the gate contact 43 has a trench contact structure that includes a gate contact trench 44 and a conductor layer 45 buried in the gate contact trench 44.

The gate contact trench 44 is formed by digging down the interlayer insulating film 42, the second thin film portion 23 of the gate insulating film 20, the upper electrode layer 30, and the intermediate insulating film 24 in this order so as to reach the lower electrode layer 26. The gate contact trench 44 has a side portion to which the interlayer insulating film 42, the second thin film portion 23 of the gate insulating film 20, and the upper electrode layer 30 are exposed, and has a bottom portion to which the intermediate insulating film 24 and the lower electrode layer 26 (the convex portion 29) are exposed.

The conductor layer 45 of the gate contact 43 has a layered structure in which a plurality of conductive materials are stacked together. More specifically, the gate contact 43 has a first conductor layer 46 formed along the inner surface of the gate contact trench 44 and a second conductor layer 47 formed along the surface of the first conductor layer 46.

The first conductor layer 46 has its front surface and its back surface (a surface on the side of the gate contact trench 44) that are formed along the inner surface of the gate contact trench 44. The second conductor layer 47 has a thickness greater than the first conductor layer 46, and is formed so as to backfill the gate contact trench 44 from above the first conductor layer 46. Preferably, the percentage of the second conductor layer 47 with respect to the gate contact trench 44 is greater than that of the first conductor layer 46 with respect to the gate contact trench 44. The conductive material of the first conductor layer 46 may be, for example, titanium (Ti), titanium nitride (TiN), or the like. On the other hand, the conductive material of the second conductor layer 47 may be, for example, tungsten (W).

The interlayer insulating film 42 additionally has a source contact 48 formed so as to pass through the interlayer insulating film 42 and through the surface insulating film 40 and so as to be electrically connected to the n type source region 17. The source contact 48 is formed between the gate trenches 14 along the stripe direction of the gate trench 14. The source contact 48 is formed so as to cross the borderline between mutually adjoining unit cells 13.

As shown in FIG. 4, the source contact 48 has a trench contact structure that includes a source contact trench 49 and a conductor layer 50 buried in the source contact trench 49.

The source contact trench 49 is formed by digging down the interlayer insulating film 42, the surface insulating film 40, and the epitaxial layer 12 (the n type source region 17 and the p type contact region 18) in this order. The source contact trench 49 has a bottom portion that reaches the p type body region 15. A side portion of the source contact trench 49 may be formed perpendicularly to the surface of the epitaxial layer 12. An edge portion at which the side portion and the bottom portion of the source contact trench 49 intersect with each other may be formed so as to be curved outwardly from the source contact trench 49. A p type extra contact region 51 is selectively formed at a part along the side portion and the bottom portion of the source contact trench 49 in the p type body region 15.

The p type extra contact region 51 is formed along the side portion and the bottom portion of the source contact trench 49 from the bottom portion of the n type source region 17 and from the bottom portion of the p type contact region 18 (see FIG. 2). The n type source region 17, the p type contact region 18 (see FIG. 2), and the p type extra contact region 51 are exposed from the side portion and the bottom portion of the source contact trench 49. In other words, the n type source region 17, the p type contact region 18 (see FIG. 2), and the p type extra contact region 51 form a part of the side portion of the source contact trench 49, and form the bottom portion of the source contact trench 49. The side portion of the source contact trench 49 faces the side portion of the gate trench 14 (the trench gate structure 19) with the p type extra contact region 51 and the p type body region 15 therebetween.

The conductor layer 50 of the source contact 48 has a layered structure consisting of the first conductor layer 46 and the second conductor layer 47 in the same way as the gate contact 43. The conductor layer 50 buried in the source contact trench 49 forms an ohmic contact between the p type extra contact region 51 and the conductor layer 50.

As shown in FIG. 3, a USG film 55 made of USG (Undoped Silica Glass) is formed on the interlayer insulating film 42. The USG film 55 may have a thickness of, for example, 2000 Å to 5000 Å. The USG film 55 has a source plug 56 formed so as to pass through the USG film 55 and so as to be connected to the source contact 48.

The source plug 56 includes a plug trench 57 that is for use in plugs and that is formed in the USG film 55 and a conductor layer 58 buried in the plug trench 57. The plug trench 57 may be formed along the source contact 48 in a stripe manner. The conductor layer 58 of the source plug 56 has a layered structure consisting of the first conductor layer 46 and the second conductor layer 47 in the same way as the gate contact 43. A source electrode film 59 is formed on the USG film 55 so as to cover the source plug 56.

The source electrode film 59 is electrically connected to the source plug 56 formed in the USG film 55. Preferably, the source electrode film 59 is formed so as to overlap with at least one trench gate structure 19 (one unit cell 13). The present preferred embodiment shows an example in which the source electrode film 59 is formed so as to cover the whole of the VDMIS region 2, i.e., so as to cover a region in which all unit cells 13 are formed. Preferably, the source electrode film 59 is made of, for example, Al (aluminum), or Cu (copper), or an alloy (AlCu) of these elements (in the present preferred embodiment, AlCu). The source electrode film 59 may have a thickness of, for example, 5 μm to 10 μm. A second interlayer insulating film and a second USG film may be formed on the source electrode film 59 in this order.

The source pad 6 (see FIG. 1) is electrically connected to the source electrode film 59. A ground potential (a reference voltage) is applied to the source electrode film 59 through the source pad 6. Electric power input to the source electrode film 59 is transmitted to the source contact 48 through the source plug 56. On the other hand, a gate electrode film, a gate electrode pad, and the like (not shown) each of which transmits a gate voltage applied in other regions to the gate contact 43 may be electrically connected to the gate contact 43. Electric power input to the gate electrode pad and the like is transmitted to the trench gate structure 19 through the gate contact 43. A drain electrode 60 serving as a back-surface electrode is formed on the back surface of the semiconductor layer 10 (the semiconductor substrate 11). A VDMIS is thus arranged in the VDMIS region 2.

As described above, the trench gate structure 19 in which the gate electrode 25 is buried in the gate trench 14 is formed in the VDMIS region 2. Additionally, the gate electrode 25 has a split gate structure that includes the lower electrode layer 26 and the upper electrode layer 30 that have been separated upwardly and downwardly from each other by means of the intermediate insulating film 24.

A method for drawing around and connecting each of the lower and upper electrode layers 26 and 30 to the end of the gate trench 14 can be mentioned as an example of a connection method of the lower electrode layer 26 and the upper electrode layer 30 in the split gate structure. In this case, for example, each of the lower and upper electrode layers 26 and 30 is formed so as to extend to the end of the gate trench 14 along the stripe direction while maintaining a state of being electrically separated by means of the intermediate insulating film 24.

A lower-electrode-layer contact that is connected only to the lower electrode layer 26 and an upper-electrode-layer contact that is connected only to the upper electrode layer 30 are formed at the end of the gate trench 14. The lower-electrode-layer contact and the upper-electrode-layer contact are formed so as to be exposed on the opening side of the gate trench 14. The lower-electrode-layer contact and the upper-electrode-layer contact are connected together by means of an electrode film or the like that is formed outside the gate trench 14. As a result, the lower electrode layer 26 and the upper electrode layer 30 are electrically connected (short-circuited) together in a region outside the gate trench 14.

However, in the thus formed arrangement, the lower electrode layer 26 and the upper electrode layer 30 are separated from each other by means of the intermediate insulating film 24 in the gate trench 14. This makes it impossible to transmit heat generated in the lower electrode layer 26 directly to the upper electrode layer 30 and to dissipate the heat outwardly from the gate trench 14. Additionally, a connection portion between the lower electrode layer 26 and the upper electrode layer 30 is apart from a heat generation source, and therefore it is impossible to efficiently dissipate the heat. Therefore, the inside of the gate trench 14 is liable to be filled with the heat, and it is impossible to say that this is desirable from the viewpoint of reliability. Therefore, in order to improve the reliability of the trench gate structure and, consequently, to improve the reliability of the semiconductor device, it is necessary to restrain a rise in temperature in the gate trench 14.

Additionally, in an arrangement in which each of the lower and upper electrode layers 26 and 30 is drawn around to the end of the gate trench 14, a resistance value increases in proportion to the increase of the wiring length of the lower and upper electrode layers 26 and 30 in addition to the fact that the structure of the device becomes complex. Additionally, the resistance values of the lower and upper electrode layers 26 and 30 are liable to increase in proportion to a rise in temperature in the gate trench 14. As a result, this also causes obstruction to the lowering of resistance.

On the other hand, according to the present preferred embodiment, the gate contact 43 is formed in the gate trench 14 so as to pass through the upper electrode layer 30 and through the intermediate insulating film 24 and so as to reach the lower electrode layer 26. The gate contact 43 electrically connects (short-circuits) the lower electrode layer 26 and the upper electrode layer 30 together in the gate trench 14. Additionally, the gate contact 43 includes tungsten excellent in thermal conductivity, and is formed near a heat generation source. Still additionally, this gate contact 43 is formed so as to pass through the interlayer insulating film 42 along the stripe direction of the gate trench 14.

This makes it possible to allow the gate contact 43 to function as a heat dissipation material in a wide area, and hence makes it possible to effectively dissipate heat generated in the lower electrode layer 26 through the gate contact 43. As a result, it is possible to effectively restrain a rise in temperature in the gate trench 14. Additionally, when the semiconductor device 1 is employed as an in-vehicle power-based switching element, it is possible to realize an excellent dynamic clamp capacity by the restraint effect of a rise in temperature. Therefore, it is possible to provide a semiconductor device 1 that has excellent reliability.

Additionally, according to the present preferred embodiment, the electric connection between the lower electrode layer 26 and the upper electrode layer 30 is achieved by the gate contact 43 in the gate trench 14, and therefore, as described above, the lower electrode layer 26 and the upper electrode layer 30 are not required to be drawn around to the outside of the gate trench 14. This makes it possible to avoid the structural complication of the semiconductor device 1. Additionally, this makes it possible to prevent the increase of the resistance value caused by drawing around the lower electrode layer 26 and the upper electrode layer 30. Still additionally, it is possible to restrain a rise in temperature in the gate trench 14, and therefore it is also possible to restrain the increase of the resistance values of the lower and upper electrode layers 26 and 30 that is caused by a rise in temperature. As a result, it is possible to lower the resistance of the semiconductor device 1.

Additionally, according to the present preferred embodiment, the source contact 48 is formed so as to pass through the surface insulating film 40 and through the epitaxial layer 12 and so as to be electrically connected to the n type source region 17. The source contact 48 is formed with the same arrangement as the gate contact 43. In other words, the source contact 48 functions as a heat dissipation material. Moreover, the source electrode film 59 with which at least one trench gate structure 19 (one unit cell 13) is covered is connected to the source contact 48. This makes it possible to effectively dissipate heat generated in the epitaxial layer 12 and the like outwardly from the epitaxial layer 12 through the source contact 48 and through the source electrode film 59. As a result, it is possible to effectively improve the heat dissipation capability of the entire semiconductor device 1.

Additionally, according to the present preferred embodiment, the side portion of the source contact 48 and the side portion of the gate trench 14 face each other with the p type body region 15 therebetween. Therefore, the controllability of the channel (the channel region 34) is further improved than in a case in which the source contact 48 is formed on the epitaxial layer 12 so as to pass only through the interlayer insulating film 42 and the surface insulating film 40 and so as to be contiguous to the n type source region 17.

Additionally, according to the present preferred embodiment, the gate insulating film 20 includes the thick film portion 21 contiguous to the lower electrode layer 26 and the first thin film portion 22 contiguous to the upper electrode layer 30. Therefore, the lower electrode layer 26 faces the epitaxial layer 12 with the thick film portion 21 of the gate insulating film 20 therebetween, and therefore it is possible to reduce the capacity element in the lower part of the trench gate structure 19. Additionally, the upper electrode layer 30 faces the p type body region 15 with the first thin film portion 22 of the gate insulating film 20 therebetween. This makes it possible to improve the controllability of the channel (the channel region 34). As a result, it is possible to effectively improve the switching response speed of the VDMIS.

<CMIS Region 3>

Figure 5:
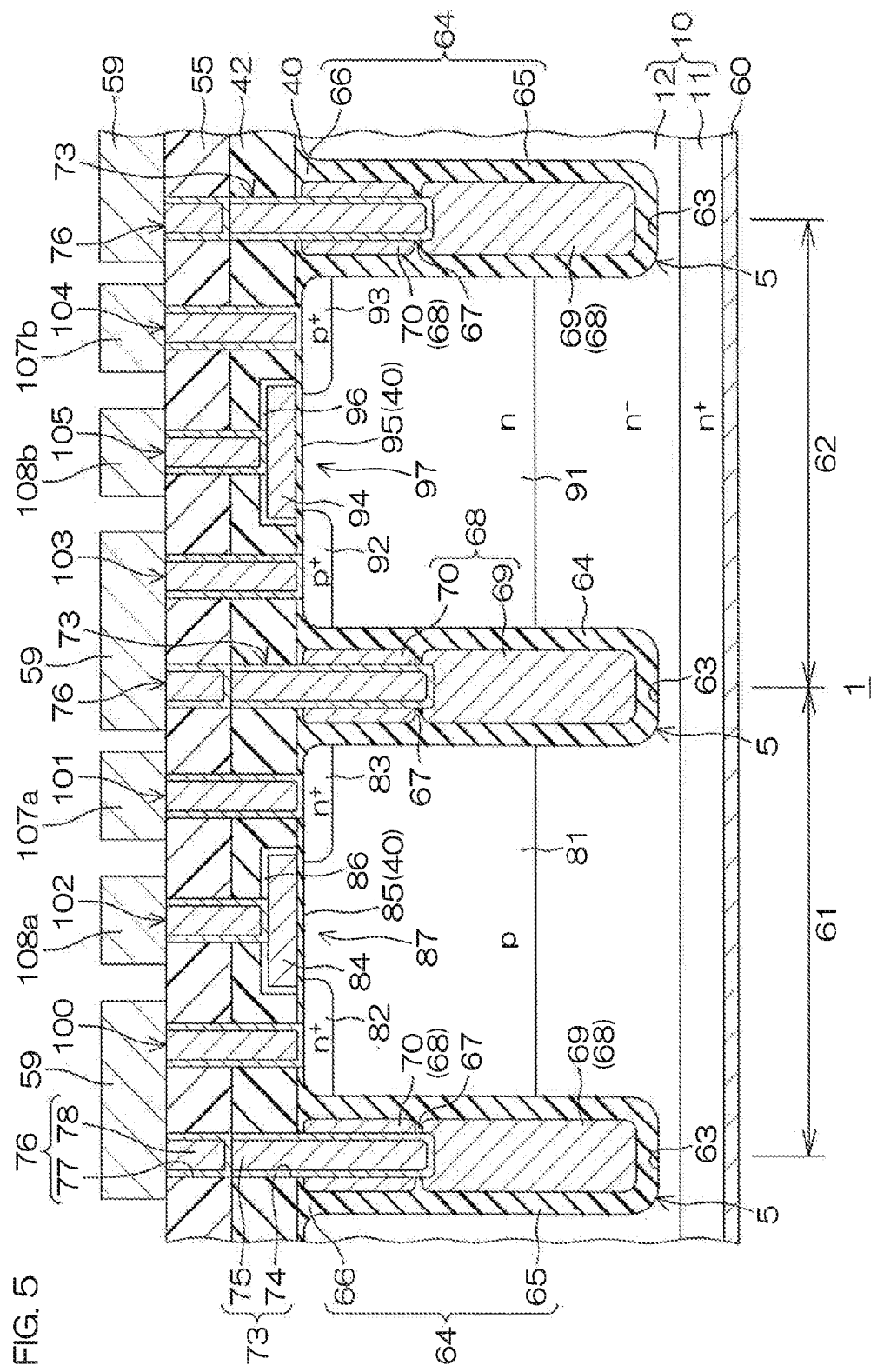
FIG. 5 is a schematic cross-sectional view to describe a CMIS region shown in FIG. 1, taken along line V-V shown in FIG. 1.

FIG. 5 is a schematic cross-sectional view to describe the CMIS region 3 of FIG. 1, taken along line V-V shown in FIG. 1. In FIG. 5, the same reference sign as in FIG. 1 to FIG. 4 is given to a component corresponding to each component of FIG. 1 to FIG. 4 mentioned above, and a description of this component is omitted.

As shown in FIG. 1 and FIG. 5, the CMIS region 3 includes an n-MIS region 61 and a p-MIS region 62 that are electrically separated from each other by means of the DTI structure 5. An n type MISFET (Metal-Insulator-Semiconductor Field-Effect Transistor) is formed in the n-MIS region 61, whereas a p type MISFET is formed in the p-MIS region 62.

Hereinafter, an arrangement of the DTI structure 5 will be first described, and then an arrangement of the n-MIS region 61 and an arrangement of the p-MIS region 62 will be described.

<DTI Structure 5>

As shown in FIG. 5, the DTI structure 5 includes a DTI trench 63 that is for use in DTIs and that is formed in the epitaxial layer 12. The DTI trench 63 has the same depth as the aforementioned gate trench 14. On the other hand, the width of the DTI trench 63 is, for example, 1 μm to 2 μm (in the present preferred embodiment, 1.8 μm), and is formed so as to be greater than the width (0.5 μm to 1.0 μm) of the gate trench 14. A DTI electrode 68 that is for use in DTIs is embedded in the DTI trench 63 through a DTI insulating film 64 that is for use in DTIs. The DTI electrode 68 has a split structure that includes a lower DTI electrode layer 69 and an upper DTI electrode layer 70 that are separated upwardly and downwardly from each other with an intermediate DTI insulating film 67 therebetween.

The DTI insulating film 64 includes a first part 65 that is formed along the inner surface of the DTI trench 63 and that is contiguous to the lower DTI electrode layer 69 and to the upper DTI electrode layer 70 and a second part 66 with which an area on the upper DTI electrode layer 70 is covered. The first part 65 of the DTI insulating film 64 may have, for example, the same thickness (3000 Å to 5000 Å) as the thick film portion 21 of the gate insulating film 20.

The lower DTI electrode layer 69 of the DTI electrode 68 is formed so as to backfill the DTI trench 63 to the halfway portion in the depth direction of the DTI trench 63 through the first part 65 of the DTI insulating film 64. The intermediate DTI insulating film 67 is formed so as to cover the lower DTI electrode layer 69.

The intermediate DTI insulating film 67 is formed so as to be integrally continuous with the first part 65. The intermediate DTI insulating film 67 may have a thickness smaller than the first part 65. The intermediate DTI insulating film 67 may have the same thickness as the intermediate insulating film 24 (which is equal to or greater than 500 Å, e.g., which is 600 Å).

The upper DTI electrode layer 70 of the DTI electrode 68 is formed so as to backfill the DTI trench 63 from above the intermediate DTI insulating film 67 through the first part 65 of the DTI insulating film 64.

The second part 66 of the DTI insulating film 64 is formed so as to backfill the DTI trench 63 from above the upper DTI electrode layer 70 in such a way as to cover the upper end portion of the upper DTI electrode layer 70. The second part 66 is formed so as to be integrally continuous with the surface insulating film 40 formed on the epitaxial layer 12. The second part 66 may have, for example, the same thickness as the second thin film portion 23 of the gate insulating film 20.

A DTI contact 73 that is electrically connected to the DTI electrode 68 is formed on the interlayer insulating film 42. The DTI contact 73 is formed along the DTI trench 63. The DTI contact 73 may be formed in a square annular shape along the DTI trench 63 when viewed planarly (see FIG. 1 also), or may be formed by a plurality of contacts that are spaced out along the square annular shape when viewed planarly.

The DTI contact 73 is formed by passing through the interlayer insulating film 42, the second part 66 of the DTI insulating film 64, the upper DTI electrode layer 70, and the intermediate DTI insulating film 67 in this order so as to reach the lower DTI electrode layer 69. The DTI contact 73 has a side portion contiguous to the intermediate DTI insulating film 67 and to the upper DTI electrode layer 70 and a bottom portion contiguous to the lower DTI electrode layer 69. The lower DTI electrode layer 69 and the upper DTI electrode layer 70 that are formed in the DTI trench 63 are electrically connected (short-circuited) together by means of the DTI contact 73.

The DTI contact 73 includes a DTI contact trench 74 and a conductor layer 75 buried in the DTI contact trench 74. The DTI contact trench 74 is formed by digging down the interlayer insulating film 42, the second part 66 of the DTI insulating film 64, the upper DTI electrode layer 70, and the intermediate DTI insulating film 67 in this order so as to reach the lower DTI electrode layer 69. The DTI contact trench 74 has a side portion to which the interlayer insulating film 42, the second part 66 of the DTI insulating film 64, the upper DTI electrode layer 70, and the intermediate DTI insulating film 67 of the DTI insulating film 64 are exposed and a bottom portion to which the lower DTI electrode layer 69 is exposed.

The conductor layer 75 of the DTI contact 73 has a layered structure consisting of the first conductor layer 46 and the second conductor layer 47 in the same way as the gate contact 43 mentioned above. A DTI plug 76 that passes through the USG film 55 and that is connected to the DTI contact 73 is additionally formed in the USG film 55 in the CMIS region 3.

The DTI plug 76 includes a DTI plug trench 77 formed in the USG film 55 and a conductor layer 78 buried in the DTI plug trench 77. The DTI plug trench 77 may be formed along the DTI contact 73. The conductor layer 78 of the DTI plug 76 has a layered structure consisting of the first conductor layer 46 and the second conductor layer 47 in the same way as the gate contact 43. For example, the aforementioned source electrode film 59 or another source electrode film is connected to the DTI plug 76, and a ground potential is applied thereto.

As described above, the CMIS region 3 and the VDMIS region 2 are electrically separated from each other by means of the DTI structure 5. Additionally, the n-MIS region 61 and the p-MIS region 62 are further partitioned from each other by means of the DTI structure 5 in the CMIS region 3, so that an electric separation between the n-MIS region 61 and the p-MIS region 62 is achieved.

According to the DTI structure 5, it is possible not only to electrically separate a plurality of element regions (the VDMIS region 2 and the CMIS region 3) from each other but also to dissipate heat generated in the CMIS region 3, the epitaxial layer 12, and the like outwardly from the epitaxial layer 12 by means of the DTI structure 5 (the DTI contact 73). Moreover, it is possible to produce the DTI structure 5 having the thus formed split structure (the DTI electrode 68) according to the same process as the trench gate structure 19 having the aforementioned split gate structure (the gate electrode 25). This makes it possible to further improve the heat dissipation capability of the semiconductor device 1. Additionally, the number of manufacturing steps never increases only for forming the DTI structure 5.

<n-MIS Region 61/p-MIS Region 62>

As shown in FIG. 5, a p type well region 81 is formed in the epitaxial layer 12 in the n-MIS region 61. The p type well region 81 is formed, for example, from the surface of the epitaxial layer 12 to a depth that has a region facing the lower DTI electrode layer 69 with the DTI insulating film 64 therebetween. An n$^+$ type source region 82 and an n$^+$ type drain region 83 are selectively formed with an interval therebetween in the inner region of p type well region 81.

An n-MIS gate electrode 84 is formed on the surface of the epitaxial layer 12 in the n-MIS region 61 with the surface insulating film 40 therebetween. In other words, the surface insulating film 40 formed in the n-MIS region 61 serves also as an n-MIS gate insulating film 85. The n-MIS gate electrode 84 has its surface covered with a gate surface insulating film 86. The gate surface insulating film 86 may have a thickness of, for example, 400 Å.

The impurity concentration of the p type well region 81 may be, for example, $1.0 \times 10^{15}$ cm$^{-3}$ to $1.0 \times 10^{17}$ cm$^{-3}$. The impurity concentration of the n$^+$ type source region 82 and that of the n$^+$ type drain region 83 may be each, for example, $1.0 \times 10^{18}$ cm$^{-3}$ to $1.0 \times 10^{20}$ cm$^{-3}$.

The region between the n$^+$ type source region 82 and the n$^+$ type drain region 83 is an n-MIS channel region 87 of the n-MIS region 61. The channel formation in the n-MIS channel region 87 is controlled by the n-MIS gate electrode 84. The n-MIS gate electrode 84 is formed so as to face the n-MIS channel region 87 with the n-MIS gate insulating film 85 therebetween.

An n type well region 91 is formed in the surface of the epitaxial layer 12 in the p-MIS region 62. The n type well region 91 is formed, for example, from the surface of the epitaxial layer 12 to a depth that has a region facing the lower DTI electrode layer 69 with the DTI insulating film 64 therebetween. A p$^+$ type source region 92 and a p$^+$ type drain region 93 are selectively formed with an interval therebetween in the inner region of the n type well region 91.

A p-MIS gate electrode 94 is formed on the surface of the epitaxial layer 12 in the p-MIS region 62 with the surface insulating film 40 therebetween. In other words, the surface insulating film 40 formed in the p-MIS region 62 serves also as a p-MIS gate insulating film 95. The p-MIS gate electrode 94 has its surface covered with the gate surface insulating film 96. The gate surface insulating film 96 may have a thickness of, for example, 400 Å.

The impurity concentration of the n type well region 91 may be, for example, $1.0 \times 10^{15}$ cm$^{-3}$ to $1.0 \times 10^{17}$ cm$^{-3}$. The impurity concentration of the p$^+$ type source region 92 and that of the p$^+$ type drain region 93 may be each, for example, $1.0 \times 10^{18}$ cm$^{-3}$ to $1.0 \times 10^{20}$ cm$^{-3}$.

The region between the p$^+$ type source region 92 and the p$^+$ type drain region 93 is a p-MIS channel region 97 of the p-MIS region 62. The channel formation in the p-MIS channel region 97 is controlled by the p-MIS gate electrode 94. The p-MIS gate electrode 94 is formed so as to face the p-MIS channel region 97 with the p-MIS gate insulating film 95 therebetween.

The interlayer insulating film 42 and the USG film 55 are formed in this order in the CMIS region 3 so as to cover the epitaxial layer 12 in the same way as in the VDMIS region 2 mentioned above.

An n-MIS source contact 100, an n-MIS drain contact 101, an n-MIS gate contact 102, a p-MIS source contact 103, a p-MIS drain contact 104, and a p-MIS gate contact 105 are formed on the interlayer insulating film 42 and the USG film 55. Each contact 100 to 105 has an arrangement in which a conductor layer is buried in a trench in the same way as the aforementioned gate contact 43 and the like. A specific arrangement of each contact 100 to 105 is the same as that of the gate contact 43 and the like, and therefore a description of the specific arrangement is omitted.

The n-MIS source contact 100 and the p-MIS source contact 103 are formed so as to pass through the interlayer insulating film 42, the USG film 55, and the surface insulating film 40 in this order. The n-MIS source contact 100 is connected to the n⁺ type source region 82 exposed from the surface of the epitaxial layer 12. On the other hand, the p-MIS source contact 103 is connected to the p⁺ type source region 92 exposed from the surface of the epitaxial layer 12. For example, the source electrode film 59 or another source electrode film is connected to the n-MIS source contact 100 and to the p-MIS source contact 103, and a ground potential is applied thereto.

The n-MIS drain contact 101 and the p-MIS drain contact 104 are formed so as to pass through the interlayer insulating film 42, the USG film 55, and the surface insulating film 40 in this order. The n⁺ type drain region 83 exposed from the surface of the epitaxial layer 12 and a drain electrode film 107a formed on the USG film 55 are connected to the n-MIS drain contact 101. On the other hand, the p⁺ type drain region 93 exposed from the surface of the epitaxial layer 12 and a drain electrode film 107b formed on the USG film 55 are connected to the p-MIS drain contact 104.

The n-MIS gate contact 102 and the p-MIS gate contact 105 are formed so as to pass through the interlayer insulating film 42, the USG film 55, and the gate surface insulating films 86 and 96 in this order. The n-MIS gate electrode 84 and a gate electrode film 108a formed on the USG film 55 are connected to the n-MIS gate contact 102. On the other hand, the p-MIS gate electrode 94 and a gate electrode film 108b formed on the USG film 55 are connected to the p-MIS gate contact 105.

As described above, the semiconductor device 1 of the present preferred embodiment includes the CMIS region 3 and the passive element region 4 that are electrically separated from the VDMIS region 2 by means of the DTI structure 5, in addition to the VDMIS region 2 (see FIG. 1). This makes it possible to provide a semiconductor device 1 provided with an IPM (Intelligent Power Module) structure that has excellent reliability.

<Manufacturing Method of Semiconductor Device 1>

Figure 6A:
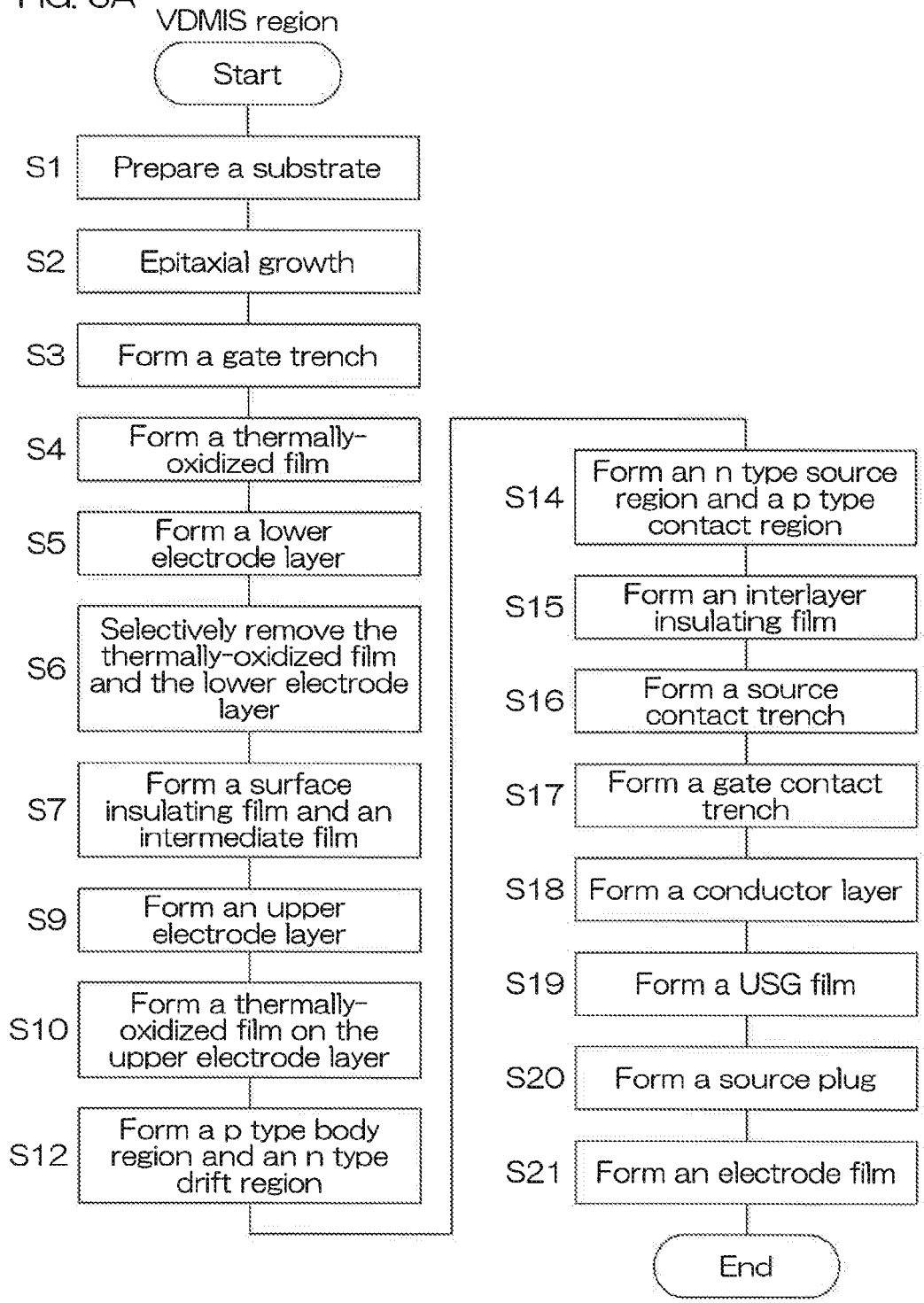

FIG. 6A and FIG. 6B are flowcharts to describe one example of a manufacturing process of the VDMIS region 2 and the CMIS region 3 according to the semiconductor device 1 of FIG. 1.

Each arrangement according to the VDMIS region 2 and to the CMIS region 3 is formed concurrently. As shown in FIG. 6A and FIG. 6B, the semiconductor substrate 11 is first prepared (step S1), and then epitaxial growth is performed (step S2), and the epitaxial layer 12 is formed. Thereafter, the gate trench 14 is formed in the VDMIS region 2, and the DTI trench 63 is formed in the CMIS region 3 (step S3). Thereafter, a thermally-oxidized film is formed on the inner surface of the gate trench 14 and on the inner surface of the DTI trench 63 (step S4).

Thereafter, the lower electrode layer 26 is formed at the gate trench 14, and the lower DTI electrode layer 69 is formed at the DTI trench 63 (step S5). Thereafter, the thermally-oxidized film and the lower electrode layer 26 formed at the gate trench 14 are selectively removed in the VDMIS region 2, and the thermally-oxidized film formed on the epitaxial layer 12 in the CMIS region 3 is selectively removed (step S6). Thereafter, a thermally-oxidized film that serves as the surface insulating film 40, and that serves as the intermediate insulating film 24, and that serves as the intermediate DTI insulating film 67 is formed in the VDMIS region 2 and in the CMIS region 3 (step S7). Thereafter, the p type well region 81 and the n type well region 91 are formed in the CMIS region 3 (step S8).

Thereafter, the upper electrode layer 30 is formed in the gate trench 14, and the upper DTI electrode layer 70 is formed in the DTI trench 63 (step S9). Thereafter, a thermally-oxidized film that serves as the second thin film portion 23 and that serves as the second part 66 is formed on the upper electrode layer 30 and on the upper DTI electrode layer 70 (step S10). Thereafter, the gate electrode 25 is formed in the CMIS region 3 (step S11). Thereafter, the p type body region 15 and the n type drift region 16 are formed in the VDMIS region 2 (step S12). Thereafter, the n⁺ type source region 82 and the n⁺ type drain region 83 are formed in the CMIS region 3 (step S13).

Thereafter, the n type source region 17 and the p type contact region 18 are formed in the VDMIS region 2 (step S14). Thereafter, the interlayer insulating film 42 is formed on the epitaxial layer 12 (step S15). Thereafter, the source contact trench 49 passing through the interlayer insulating film 42 is formed in the VDMIS region 2 (step S16). Thereafter, the gate contact trench 44 passing through the interlayer insulating film 42 is formed in the VDMIS region 2, and the DTI contact trench 74 passing through the interlayer insulating film 42 is formed in the CMIS region 3 (step S17).

Thereafter, the conductor layer 45 is formed at the gate contact trench 44 and the source contact trench 49 in the VDMIS region 2, and is formed at the DTI contact trench 74 in the CMIS region 3 (step S18). Thereafter, the USG film 55 is formed on the interlayer insulating film 42 (step S19). Thereafter, the source plug 56 is formed so as to pass through the USG film 55 in the VDMIS region 2, and the DTI plug 76 and each contact 100 to 105 is formed in the CMIS region 3 (step S20). Thereafter, the source electrode film 59, the drain electrode films 107a and 107b, and the gate electrode films 108a and 108b are formed on the USG film 55 (step S21).

Hereinafter, a method for manufacturing the semiconductor device 1 will be described in more detail with reference to FIG. 7A to FIG. 7W and FIG. 8A to FIG. 8W.

Figure 7C:
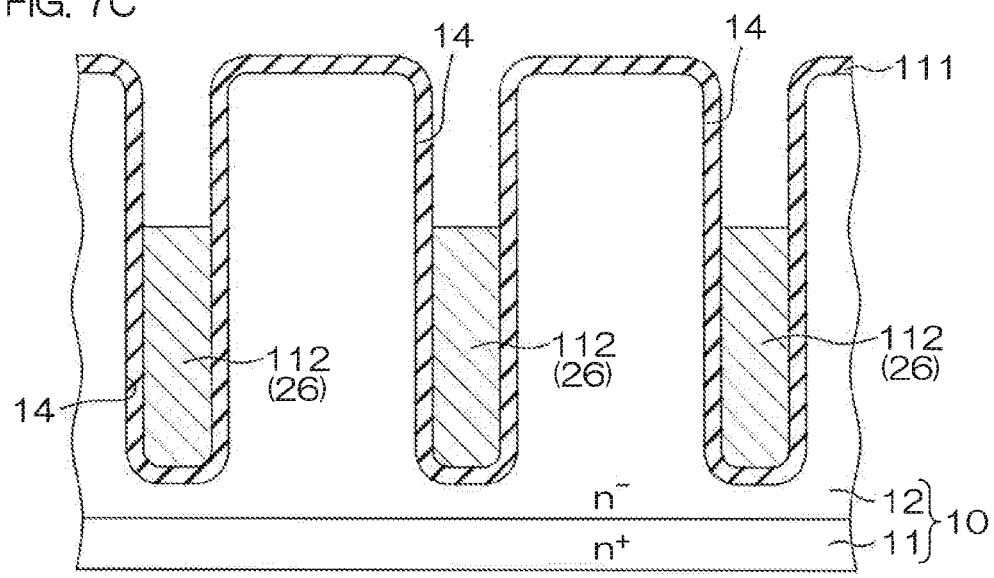
FIG. 7A to FIG. 7W are cross-sectional views to describe one example of a manufacturing process of the VDMIS region according to the semiconductor device of FIG. 1, corresponding to FIG. 3.
Figure 7D:
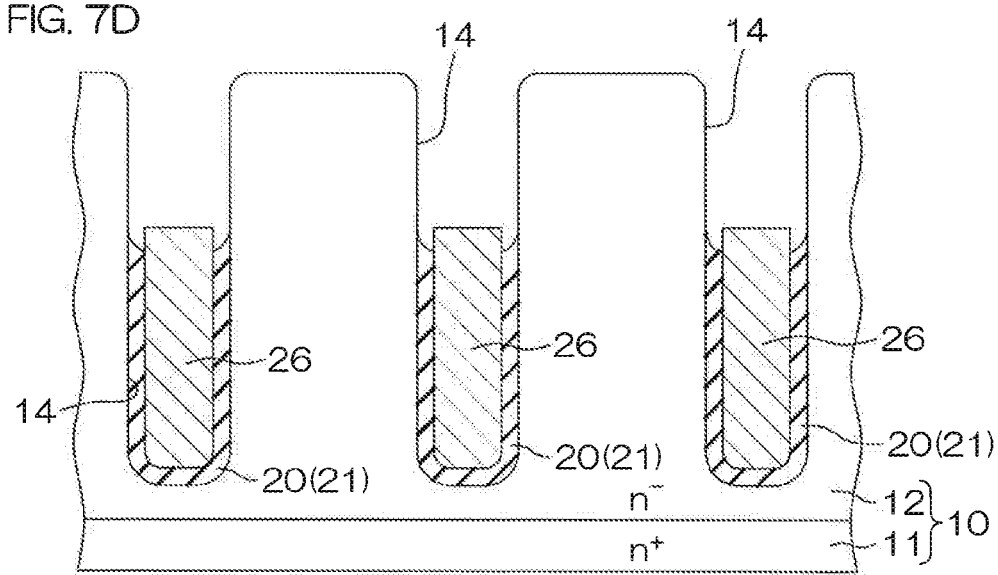
Figure 7E:
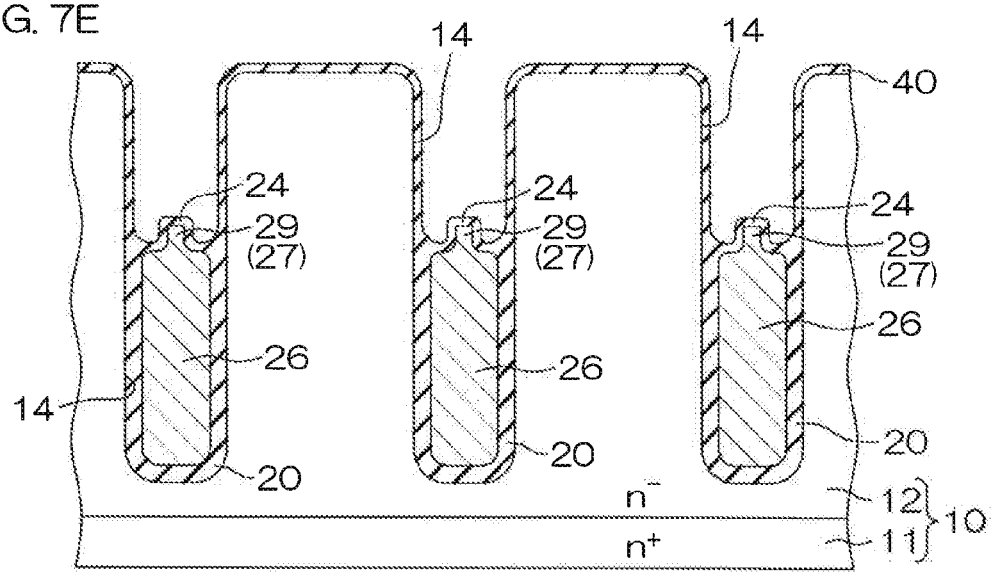
Figure 7F:
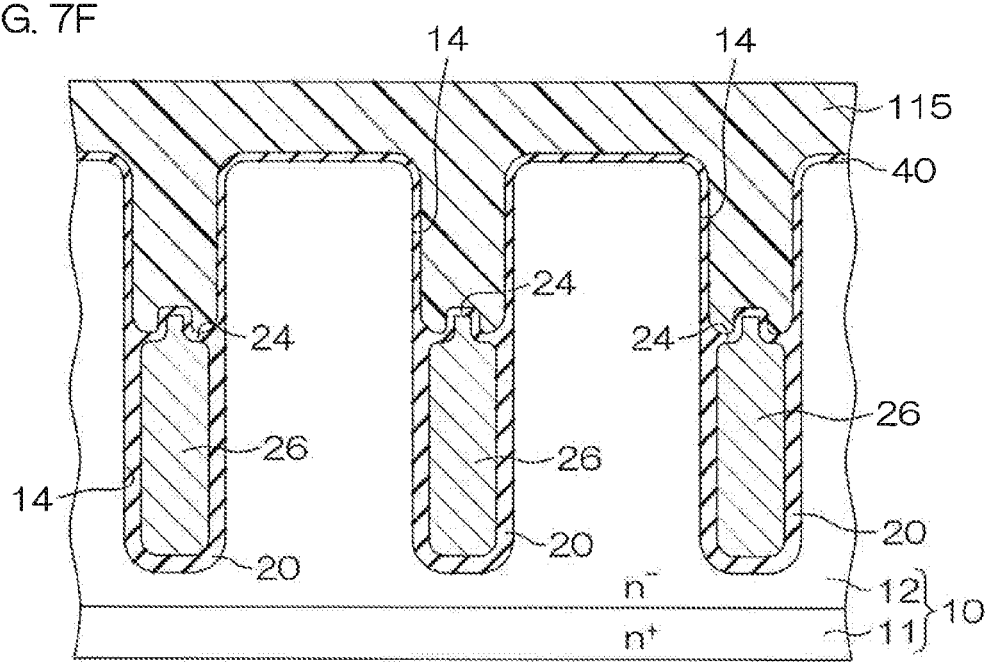
Figure 7G:
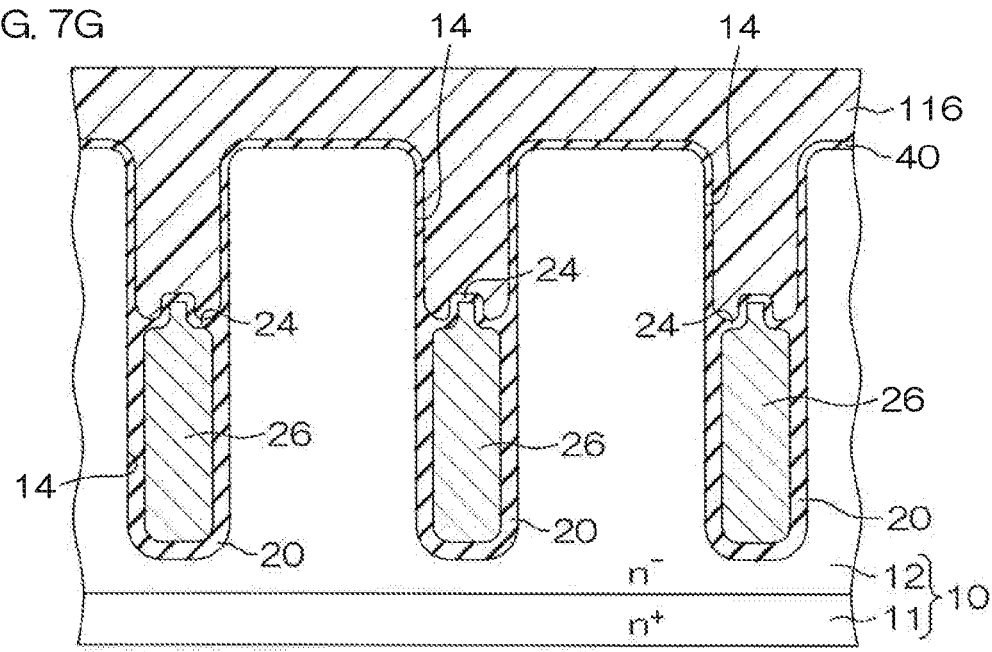
Figure 7H:
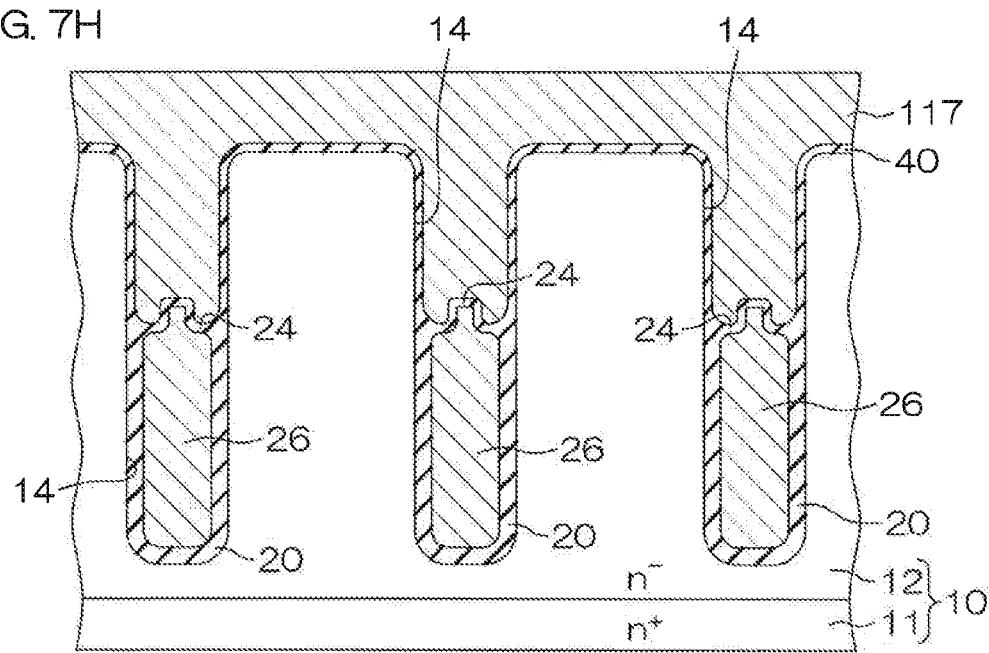
Figure 7I:
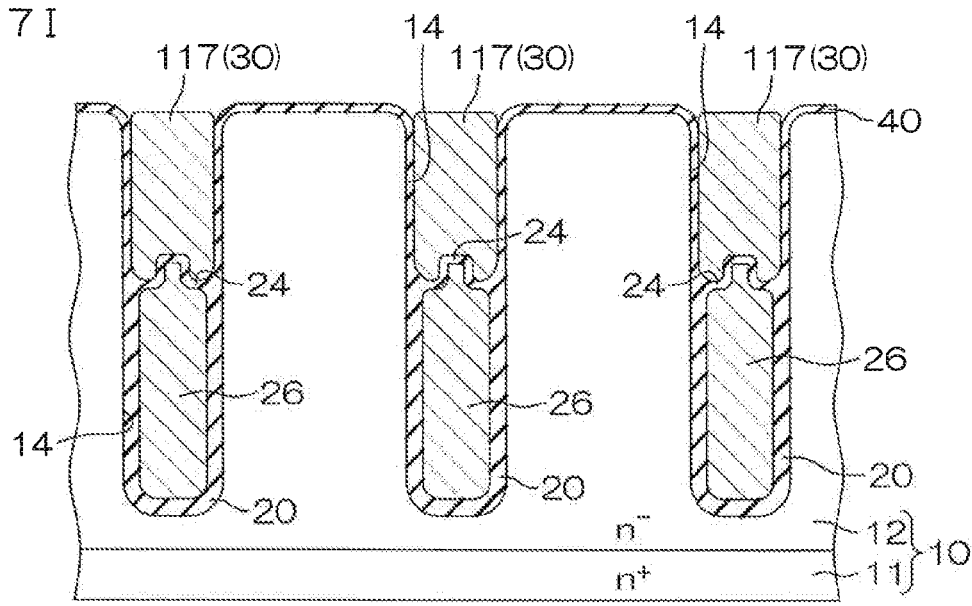
Figure 7J:
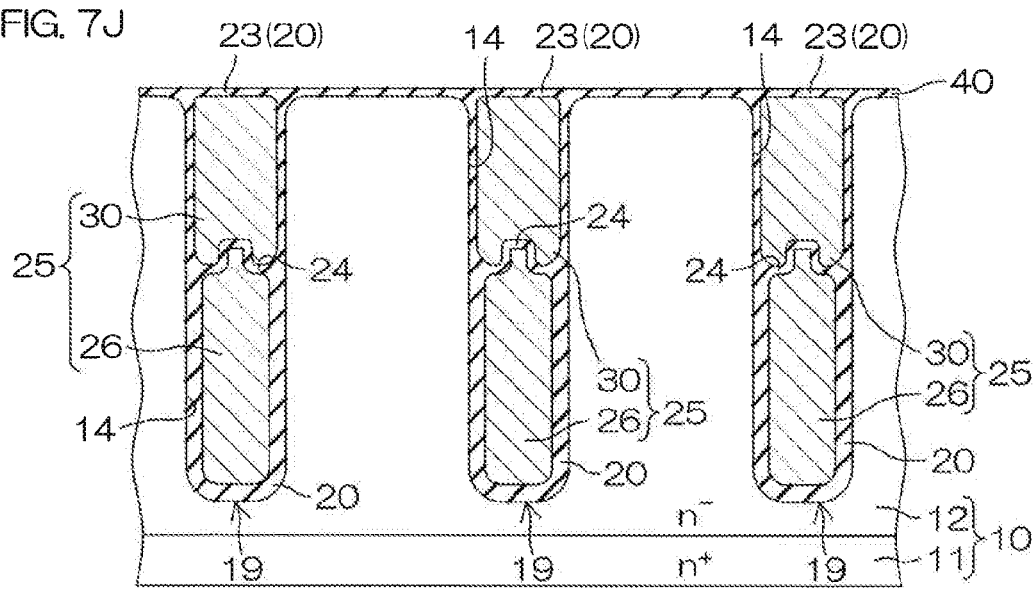
Figure 7K:
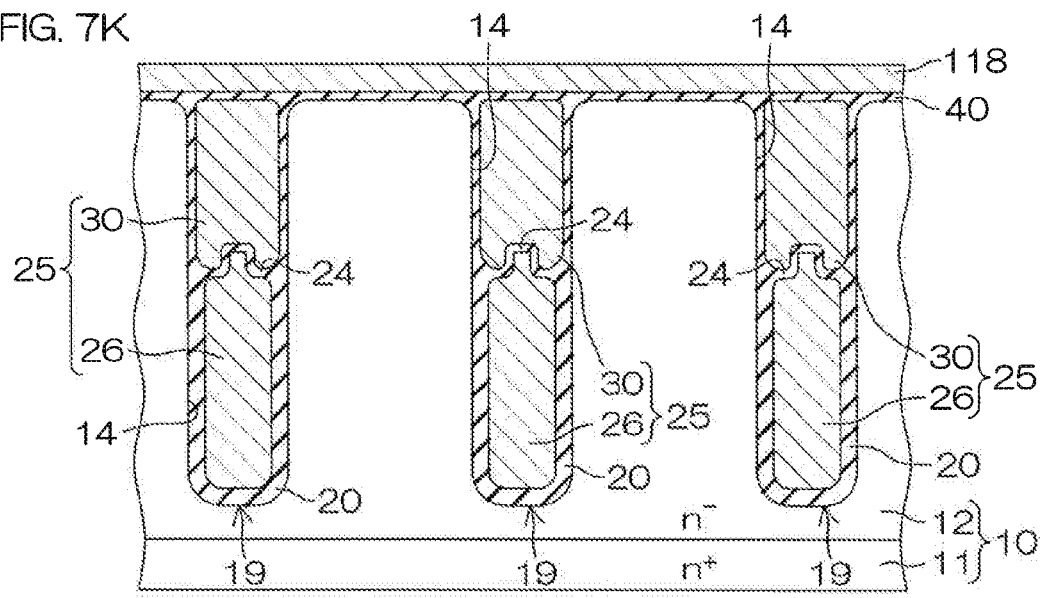
Figure 7L:
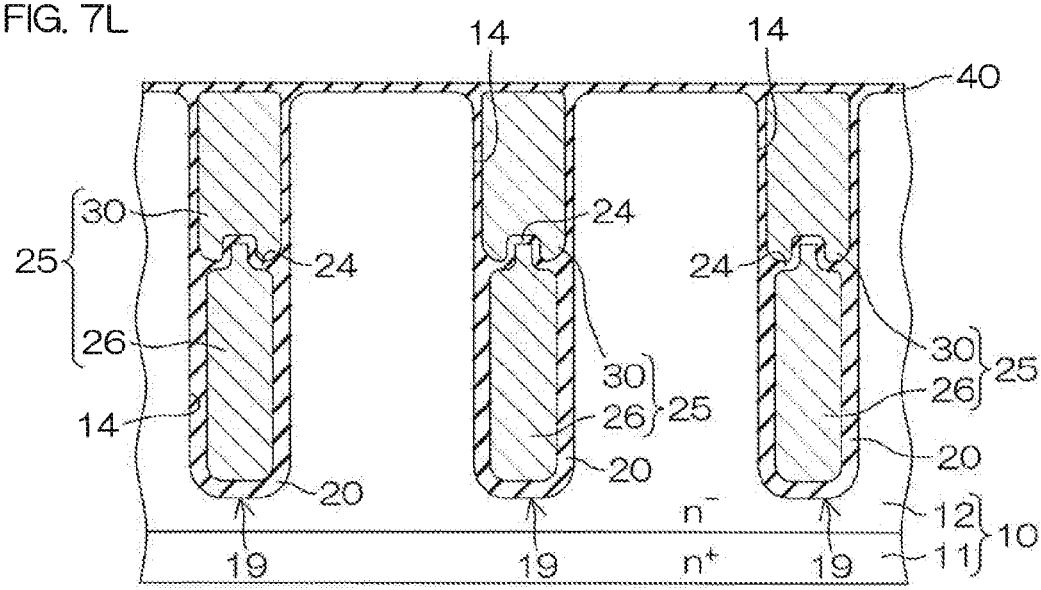
Figure 7M:
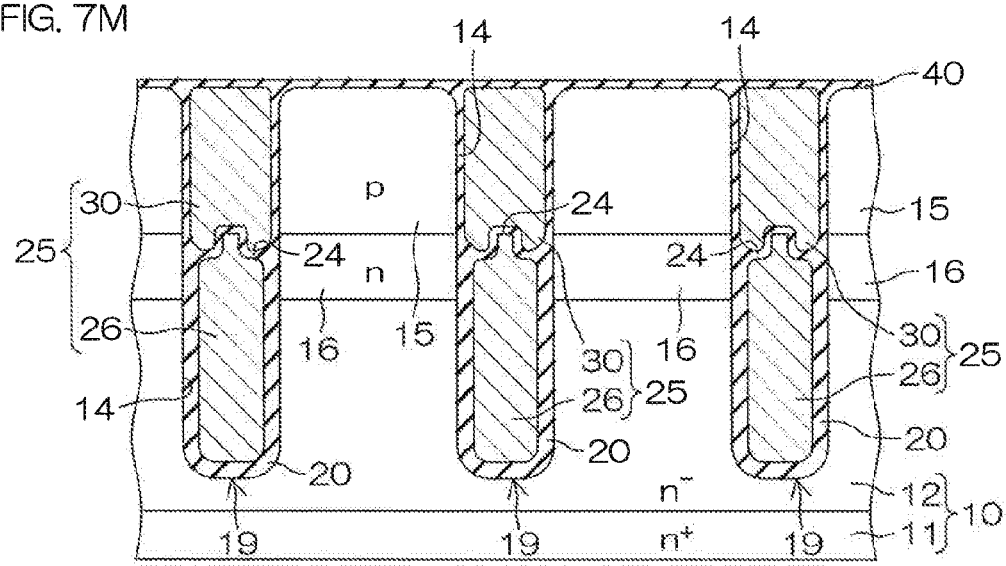
Figure 7N:
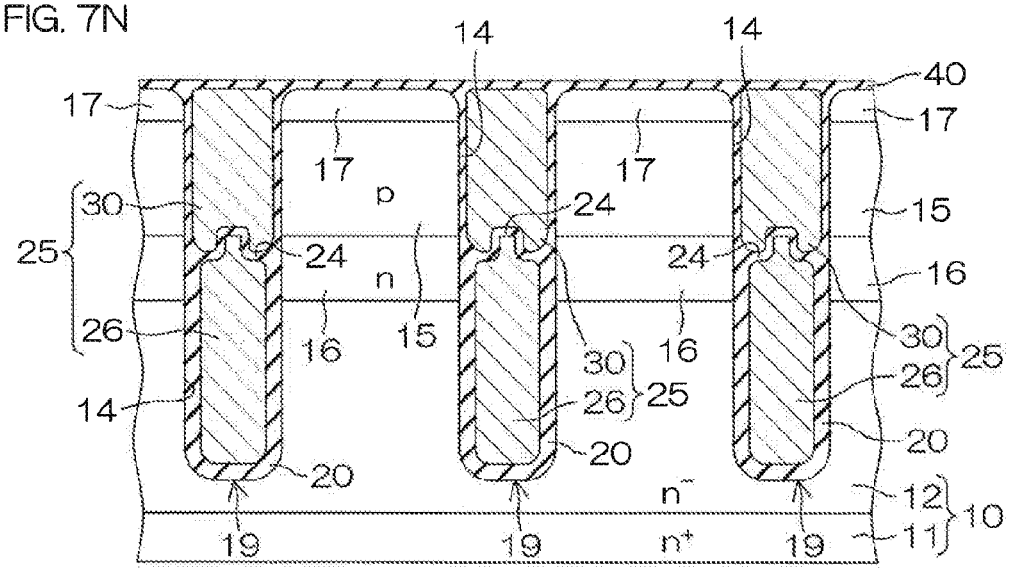
Figure 7O:
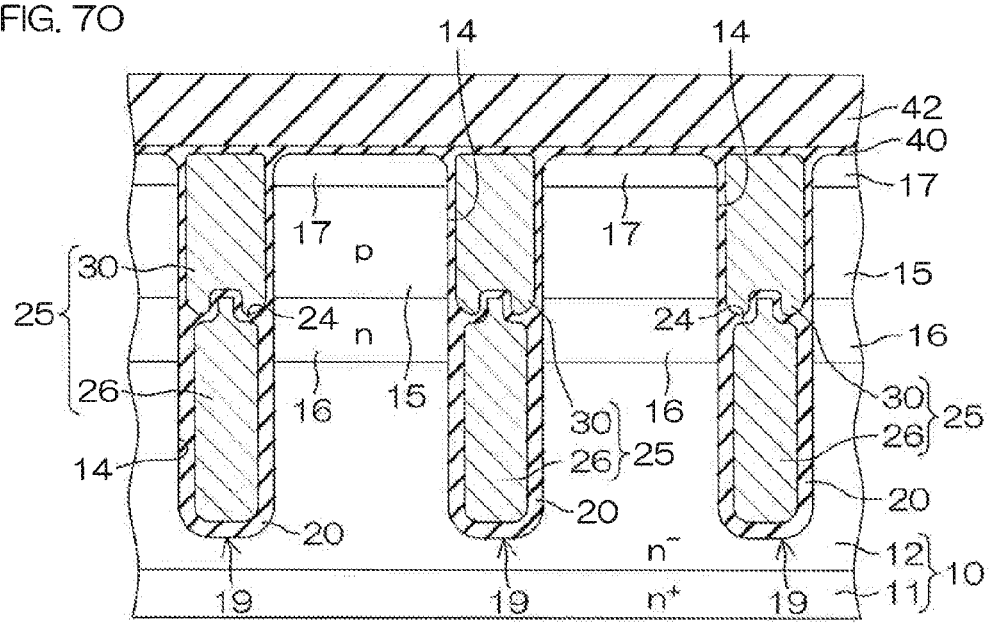
Figure 7P:
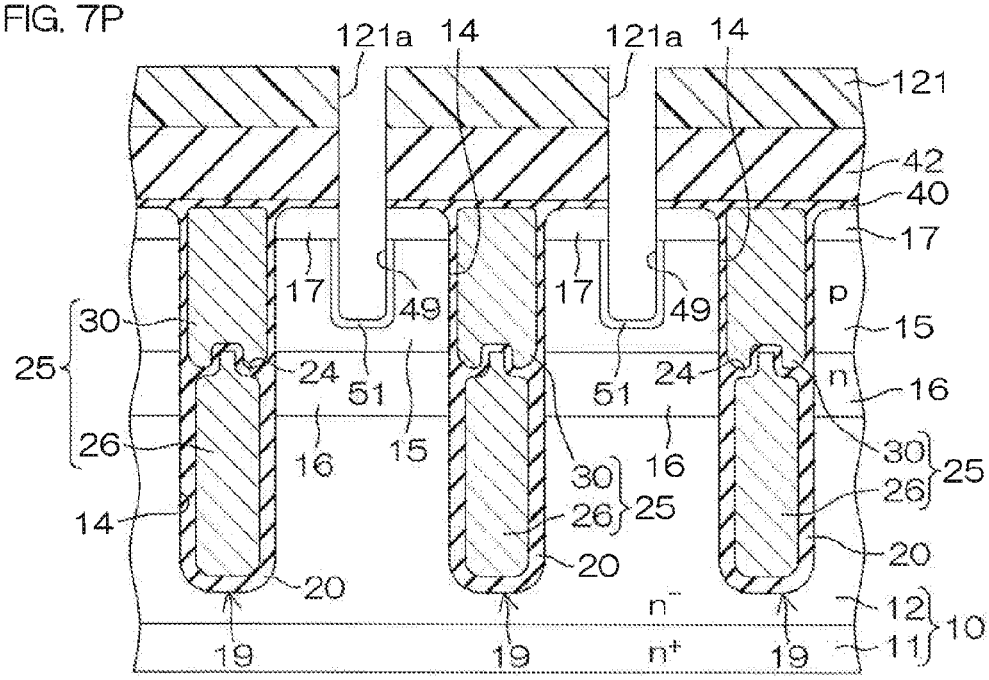
Figure 7S:
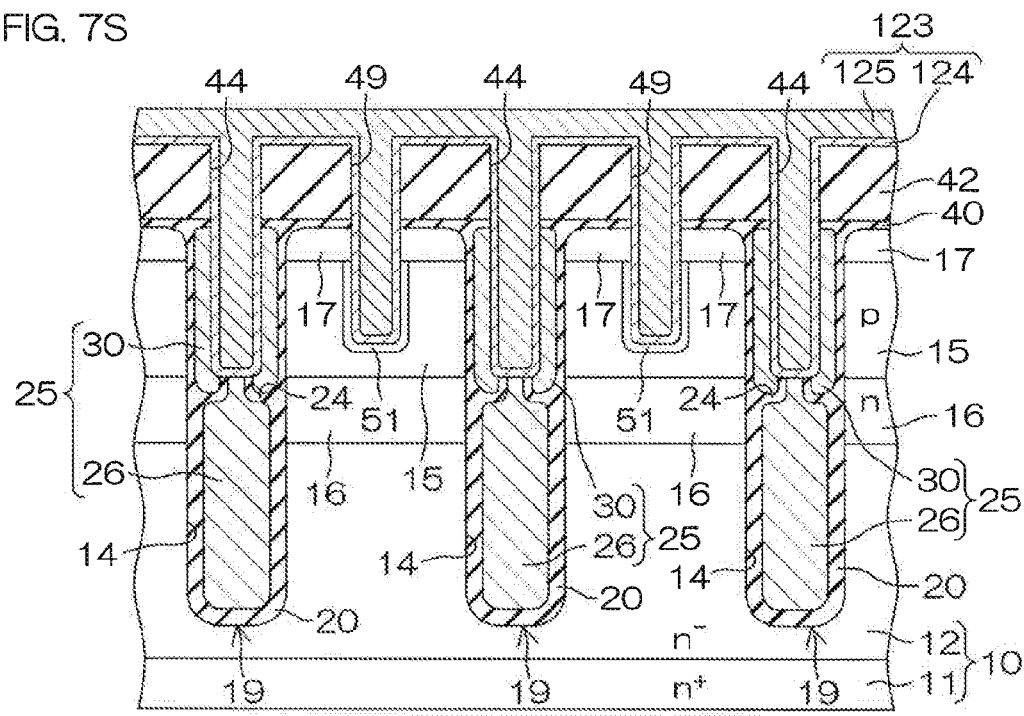
Figure 7T:
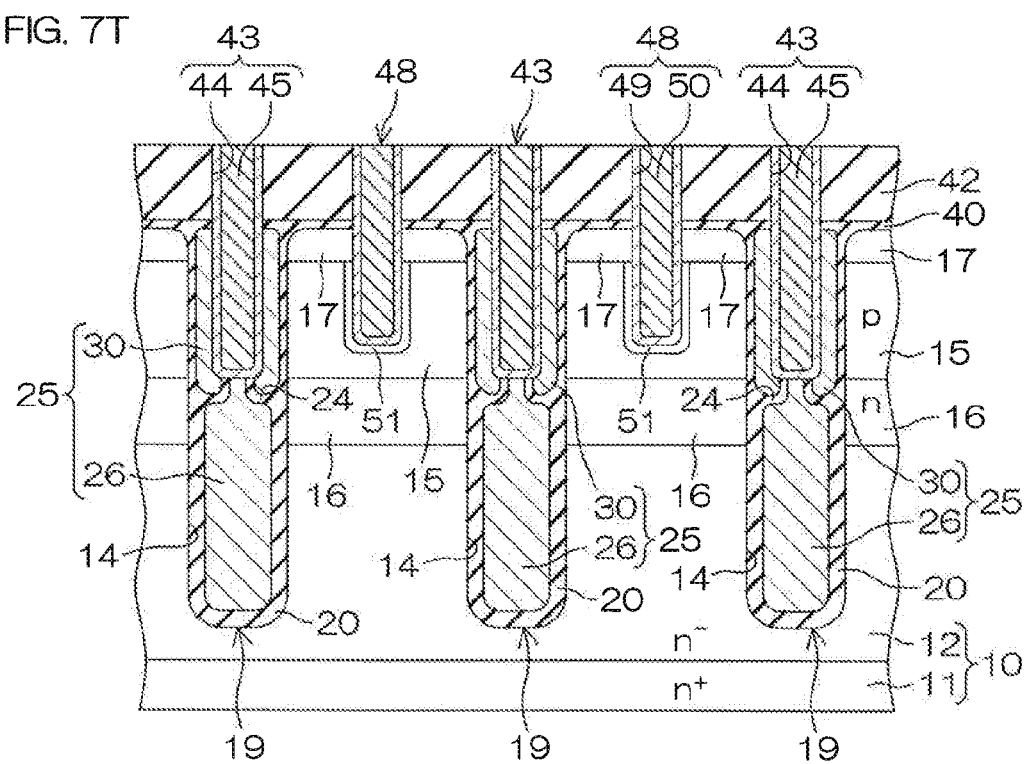
Figure 7U:
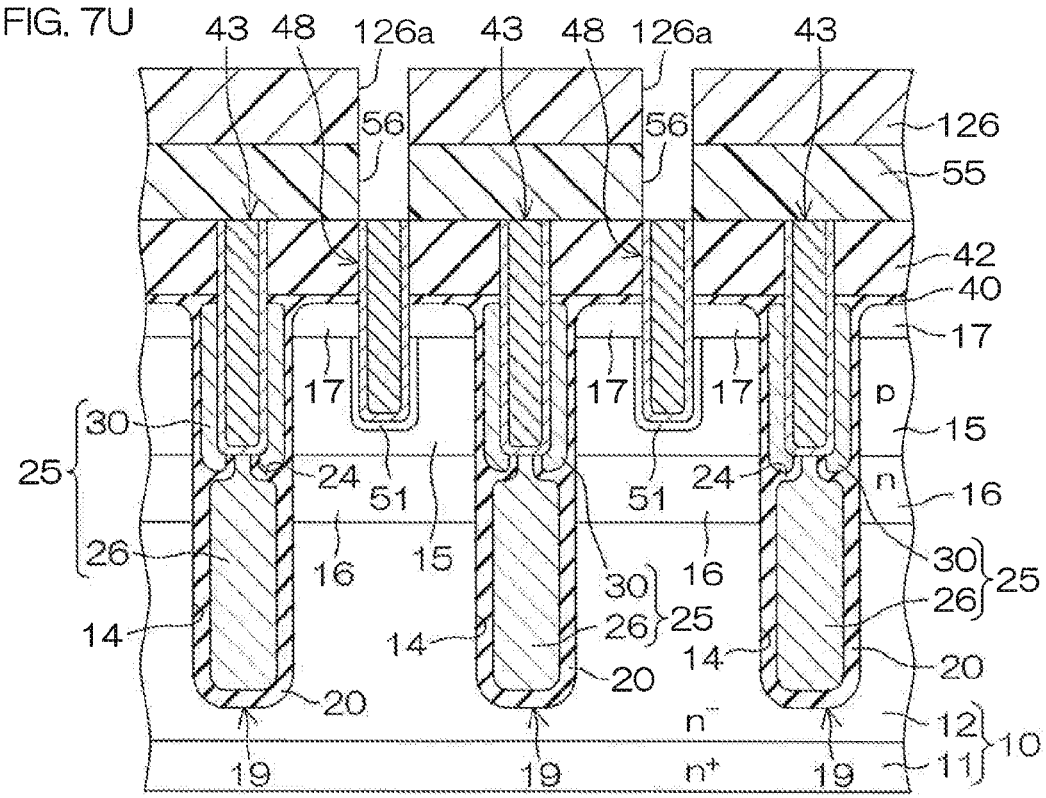
Figure 7V:
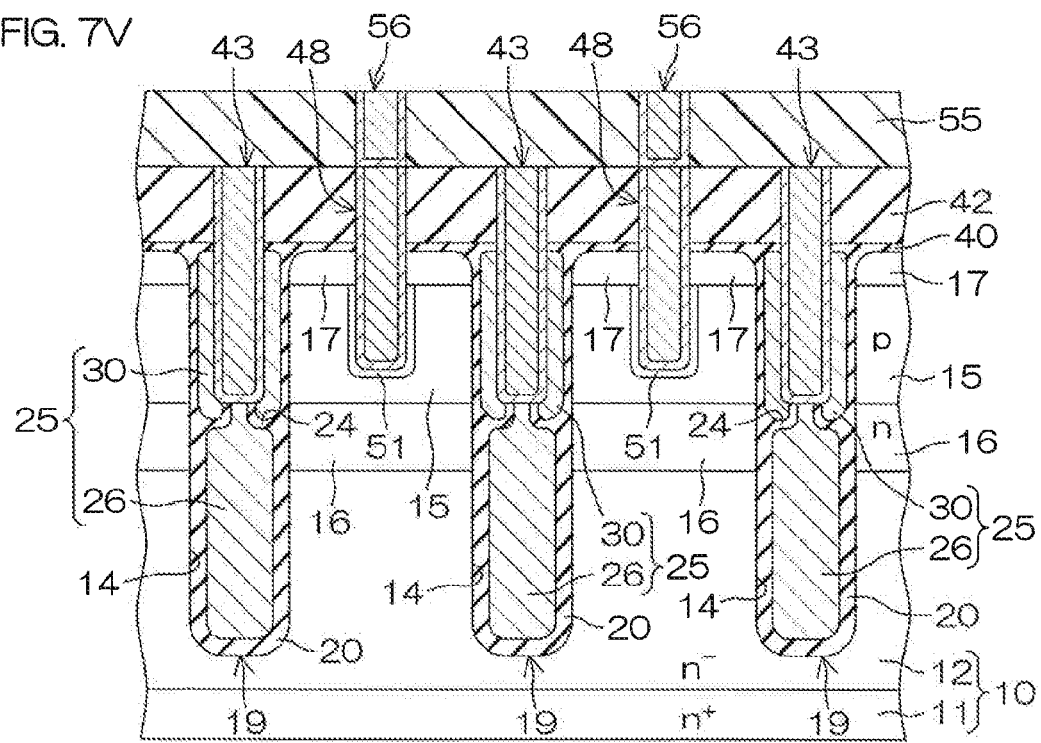
Figure 7W:
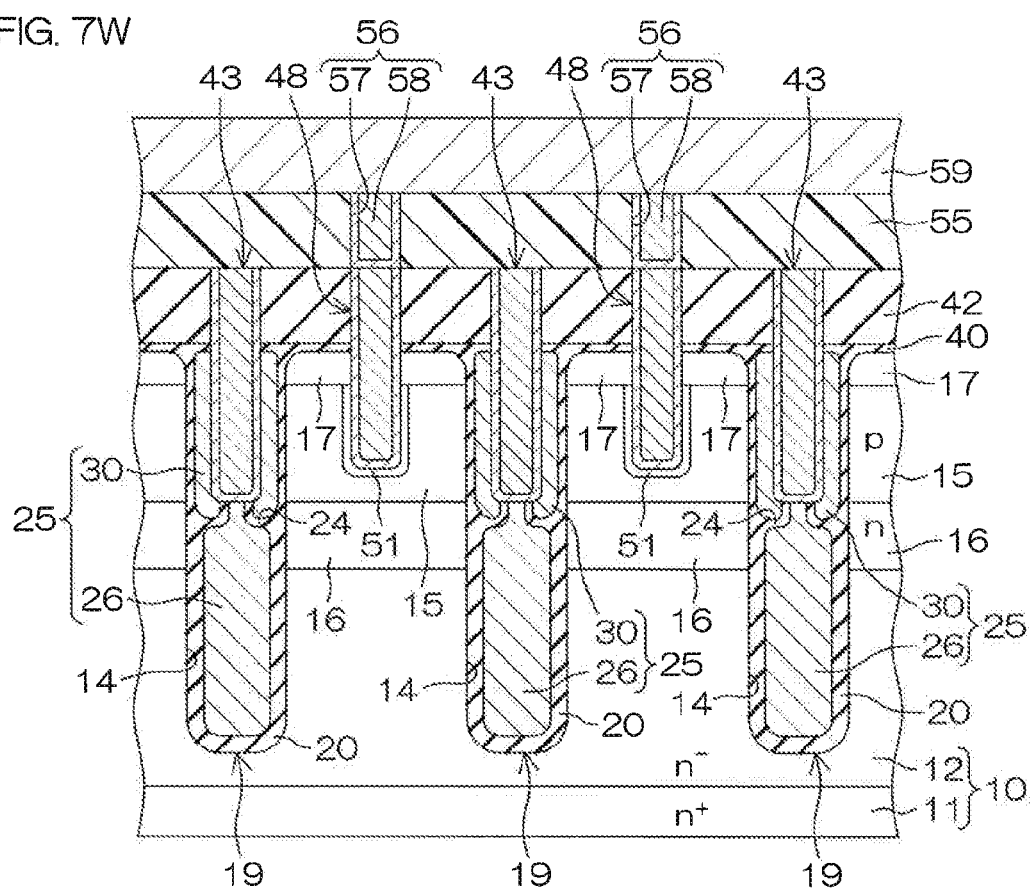
Figure 8A:
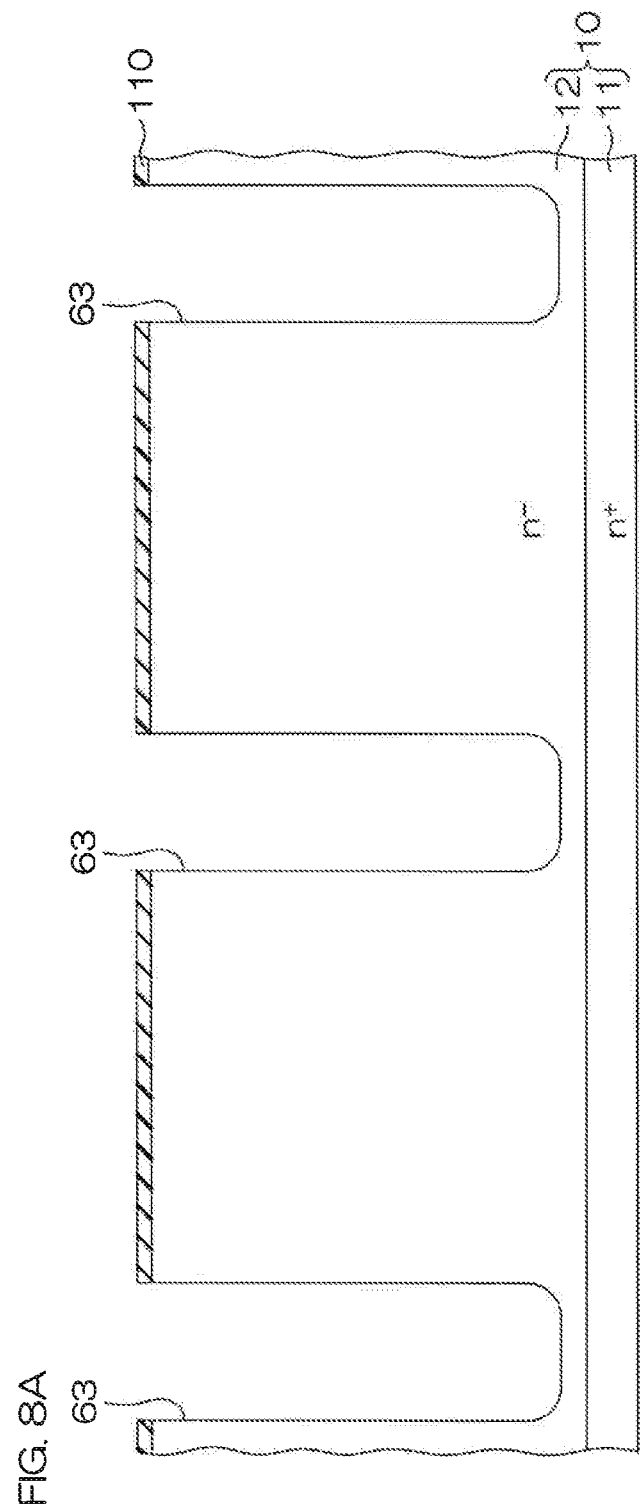
FIG. 8A to FIG. 8W are cross-sectional views to describe one example of a manufacturing process of a CMIS region according to the semiconductor device of FIG. 1, corresponding to FIG. 5.

FIG. 7A to FIG. 7W are cross-sectional views to describe one example of a process for manufacturing the VDMIS region 2 according to the semiconductor device 1 of FIG. 1, corresponding to FIG. 3. FIG. 8A to FIG. 8W are cross-sectional views to describe one example of a process for manufacturing the CMIS region 3 according to the semiconductor device 1 of FIG. 1, corresponding to FIG. 5.

As shown in FIG. 7A and FIG. 8A, the n type semiconductor substrate 11 is first prepared (step S1). Thereafter, the semiconductor substrate 11 undergoes epitaxial growth (step S2). For example, phosphorus (P) that is an n type impurity is implanted during epitaxial growth. As a result, the n type epitaxial layer 12 is formed on the semiconductor substrate 11, and the semiconductor layer 10 is acquired.

Thereafter, the thermally-oxidized film 110 is formed on the surface of the epitaxial layer 12 according to a thermal oxidation method. The thermally-oxidized film 110 may be formed with a thickness of, for example, 6000 Å. Thereafter, a resist mask (not shown) that selectively has an opening in a region in which the gate trench 14 and the DTI trench 63 are to be formed is formed. An unnecessary part of the thermally-oxidized film 110 is removed by etching (for example, wet etching) by use of the resist mask. Thereafter, the resist mask is removed.

Thereafter, the epitaxial layer 12 is etched (for example, by dry etching) while using the thermally-oxidized film 110 as a mask. As a result, the gate trench 14 and the DTI trench 63 are formed (step S3). Thereafter, the thermally-oxidized film 110 is removed by etching (for example, wet etching).

A shaping step in which the shape of the gate trench 14 and that of the DTI trench 63 are adjusted may be added after the thermally-oxidized film 110 is removed. More specifically, a liner oxide film (not shown) may be formed on the surface of the epitaxial layer 12 including the inner surface of the gate trench 14 and the inner surface of the DTI trench 63 according to the thermal oxidation method. The liner oxide film may be formed with a thickness of, for example, 1500 Å. It is possible to adjust the shape of the gate trench 14 and the shape of the DTI trench 63 by removing the liner oxide film by means of wet etching.

Figure 8B:
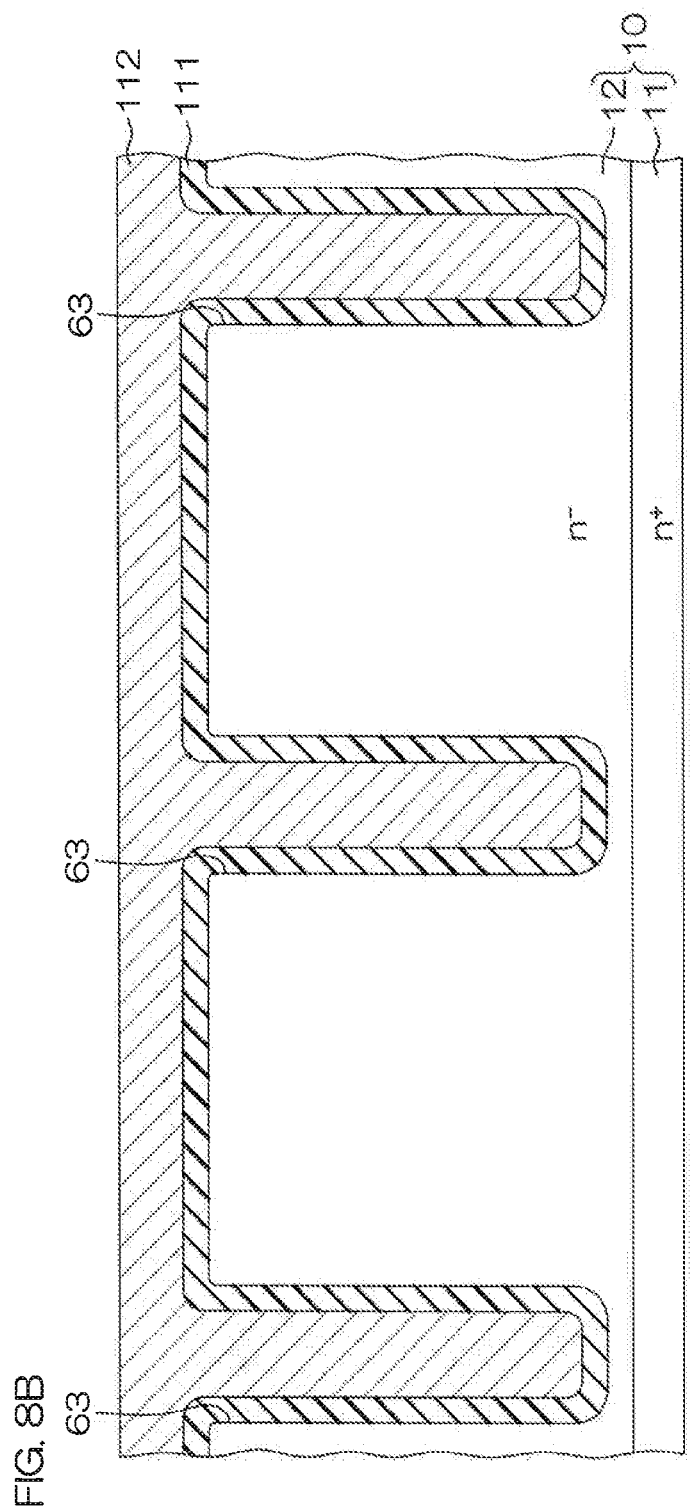

Thereafter, as shown in FIG. 7B and FIG. 8B, the thermally-oxidized film 111 is formed on the surface of the epitaxial layer 12 including the inner surface of the gate trench 14 and the inner surface of the DTI trench 63 according to the thermal oxidation method (step S4). The thermally-oxidized film 111 may be formed with a thickness of, for example, 3000 Å to 5000 Å. Thereafter, the polysilicon layer 112 is formed so as to backfill the gate trench 14 and the DTI trench 63 according to, for example, a CVD (Chemical Vapor Deposition) method (step S5).

Figure 8C:
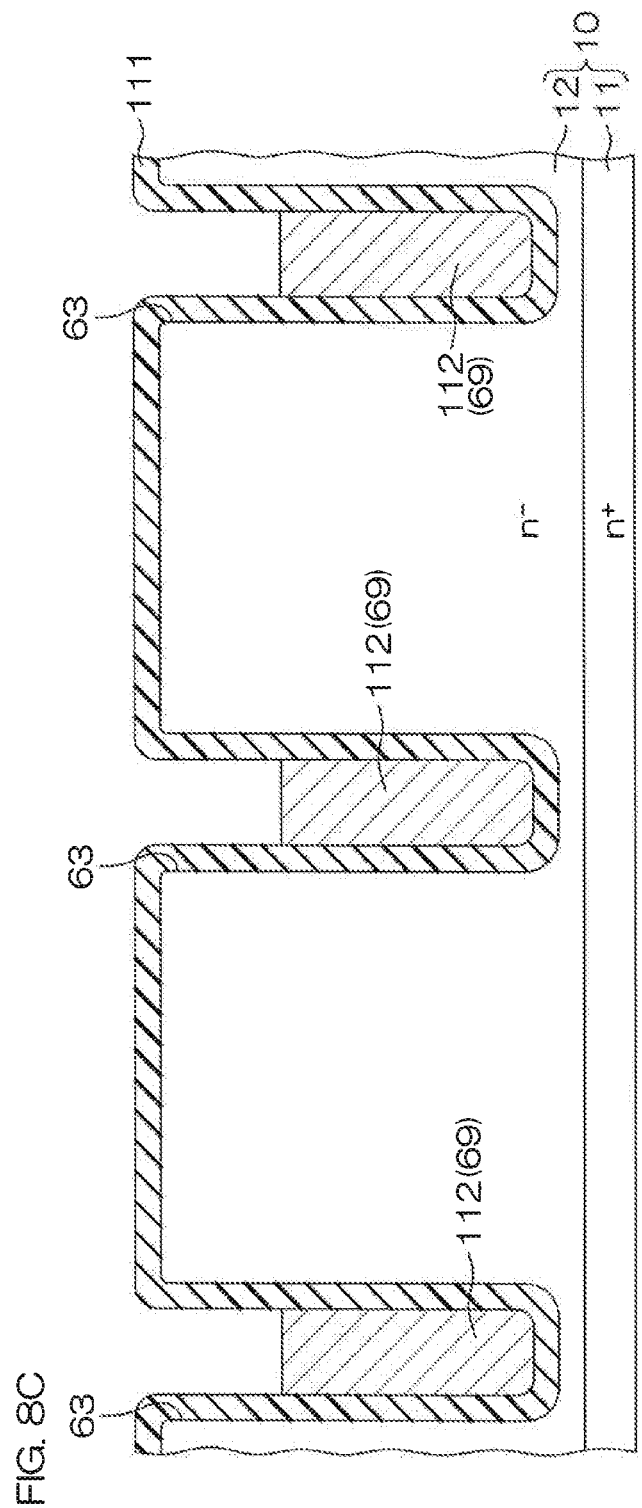

Thereafter, as shown in FIG. 7C and FIG. 8C, an unnecessary part of the polysilicon layer 112 is etchbacked, and the polysilicon layer 112 is buried to a halfway portion in the depth direction of each of the gate trench 14 and the DTI trench 63. The etchback amount of the polysilicon layer 112 may be, for example, about 1 μm in the depth direction from the opening of the gate trench 14. Thereafter, phosphorus (P) that is an n type impurity is diffused into each polysilicon layer 112 buried in the gate trench 14 and in the DTI trench 63 according to a so-called phosphorus-deposit method. At this time, phosphorus is diffused in the depth direction from the surface of each polysilicon layer 112. As a result, the lower electrode layer 26 is formed in the VDMIS region 2, and the lower DTI electrode layer 69 is formed in the CMIS region 3.

Thereafter, as shown in FIG. 7D and FIG. 8D, a resist mask 113 with which the DTI trench 63 is covered is selectively formed on the epitaxial layer 12 in the CMIS region 3. Thereafter, the thermally-oxidized film 111 formed in the VDMIS region 2 and in the CMIS region 3 is selectively removed by, for example, wet etching by use of the resist mask 113 (step S6).

The thermally-oxidized film 111 formed along the inner surface of the gate trench 14 is removed so as to expose the side portion of the lower electrode layer 26 in the VDMIS region 2. As a result, in the gate trench 14, the thermally-oxidized film 111 remains as the thick film portion 21 of the gate insulating film 20. At this time, a part of the upper end portion of the lower electrode layer 26 may be removed. On the other hand, in the CMIS region 3, the thermally-oxidized film 111 remains in the DTI trench 63 as the first part 65 of the DTI insulating film 64. Thereafter, the resist mask 113 is removed.

Thereafter, as shown in FIG. 7E and FIG. 8E, the surface insulating film 40 that is a thermally-oxidized film is formed on the surface of the epitaxial layer 12 including the inner surface of each of the gate trench 14 and the DTI trench 63 according to the thermal oxidation method (step S7). The surface insulating film 40 may be formed with a thickness of, for example, 250 Å. In the VDMIS region 2, the intermediate insulating film 24 is formed on the surface of the lower electrode layer 26. Furthermore, the upper end portion 28 that has the convex portion 29 is formed at the lower electrode layer 26 in accordance with the formation of the intermediate insulating film 24 (see FIG. 4 also). On the other hand, in the CMIS region 3, the intermediate DTI insulating film 67 is formed on the surface of the lower DTI electrode layer 69. At this time, the intermediate insulating film 24 and the intermediate DTI insulating film 67 may be formed thicker than the surface insulating film 40.

Figure 8F:
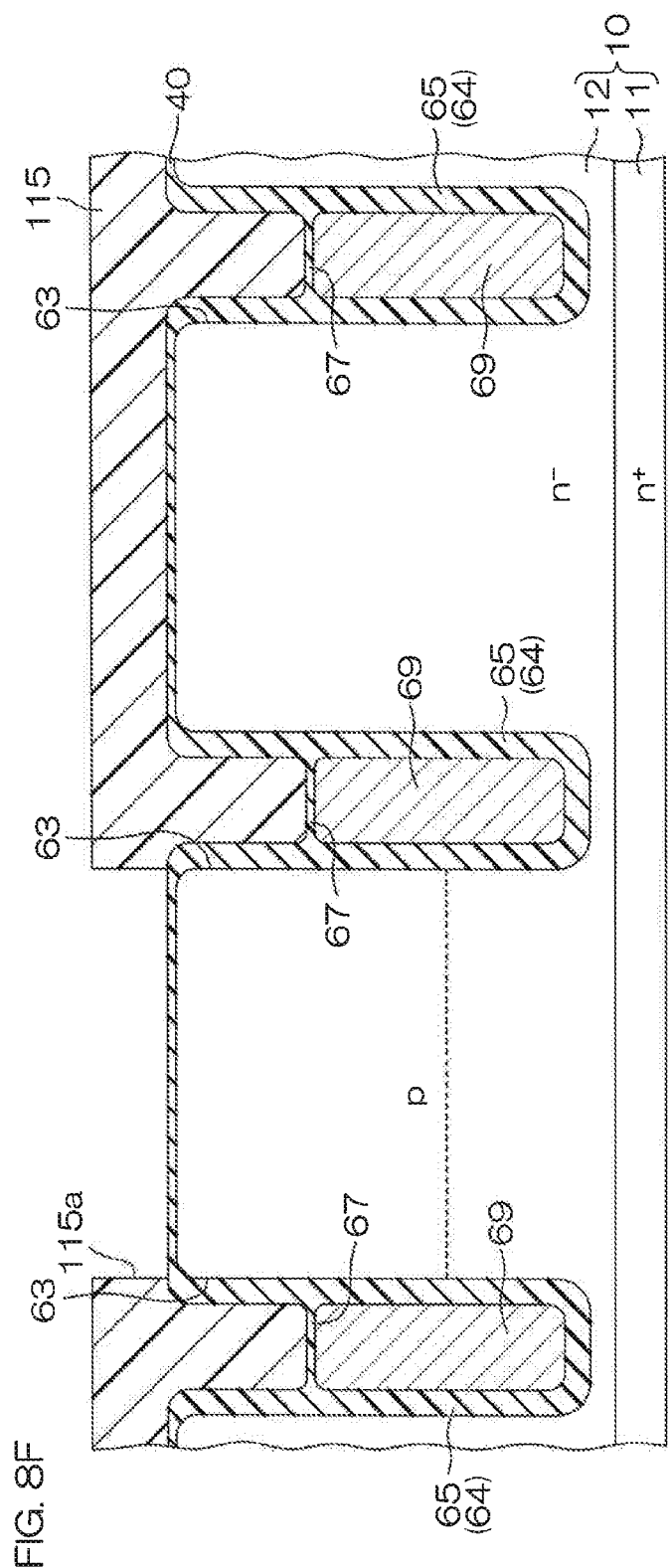

Thereafter, as shown in FIG. 7F and FIG. 8F, an ion implanting mask 115 that selectively has an opening 115a in a region in which the p type well region 81 is to be formed is formed on the epitaxial layer 12. Thereafter, a p type impurity is implanted through the opening 115a of the ion implanting mask 115. The implantation of the p type impurity is performed through the surface insulating film 40. The ion implanting mask 115 is removed after the p type impurity is implanted.

Figure 8G:
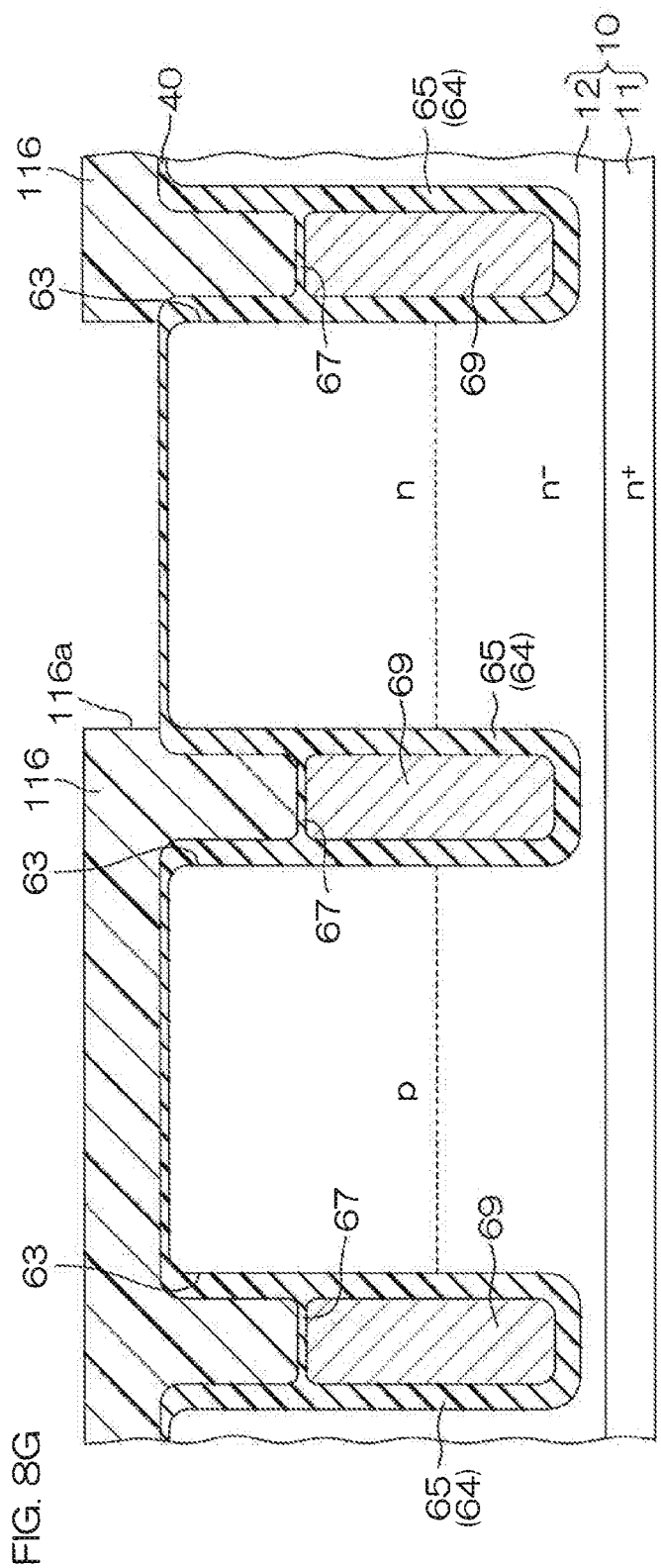

Thereafter, as shown in FIG. 7G and FIG. 8G, another ion implanting mask 116 that selectively has an opening 116a in a region in which the n type well region 91 is to be formed is formed on the epitaxial layer 12. Thereafter, an n type impurity is implanted through the opening 116a of the ion implanting mask 116. The implantation of the n type impurity is performed through the surface insulating film 40. The ion implanting mask 116 is removed after the n type impurity is implanted. Thereafter, annealing is applied, and the p type well region 81 and the n type well region 91 are formed in the CMIS region 3 (step S8).

Figure 8H:
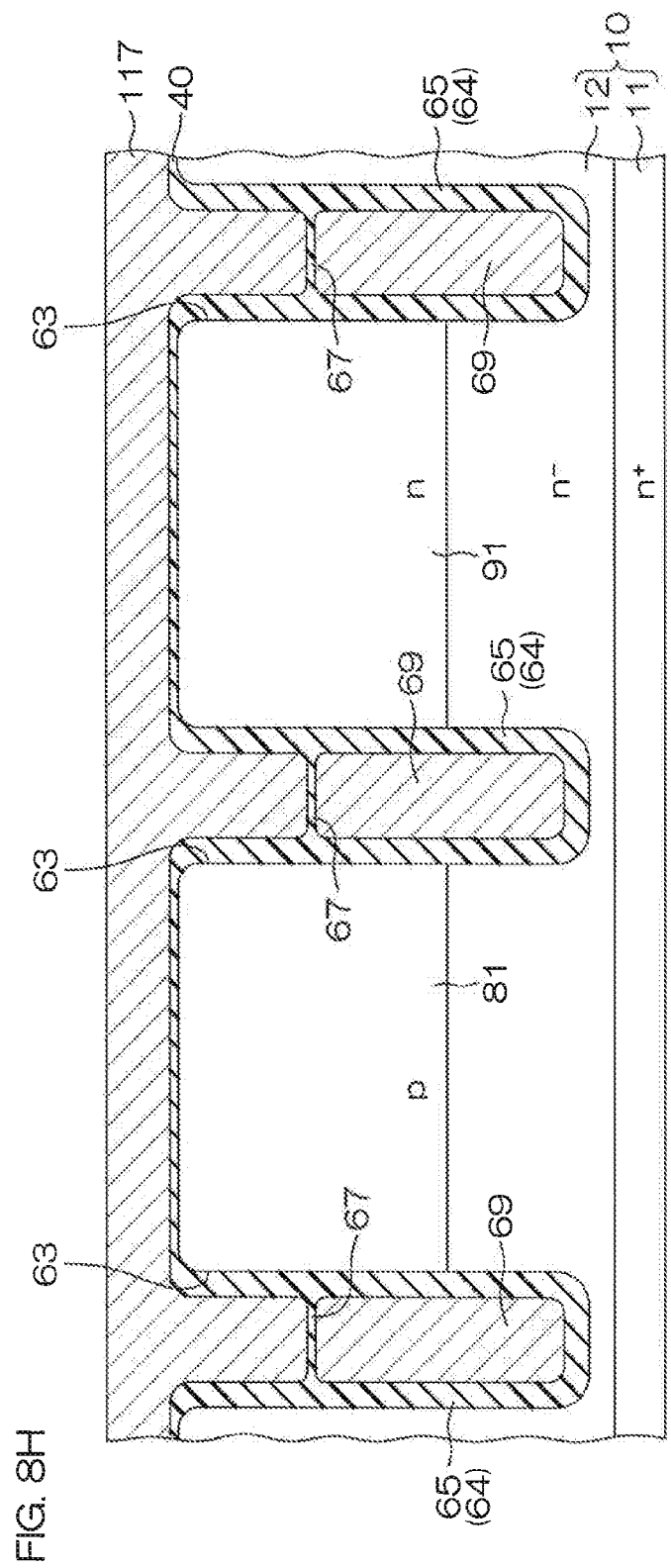

Thereafter, as shown in FIG. 7H and FIG. 8H, the polysilicon layer 117 is deposited so as to backfill the gate trench 14 and the DTI trench 63 according to, for example, the CVD method (step S9). In the VDMIS region 2, the polysilicon layer 117 is formed so as to backfill the gate trench 14 from above the intermediate insulating film 24. On the other hand, in the CMIS region 3, the polysilicon layer 117 is formed so as to backfill the DTI trench 63 from above the intermediate DTI insulating film 67.

Figure 8I:
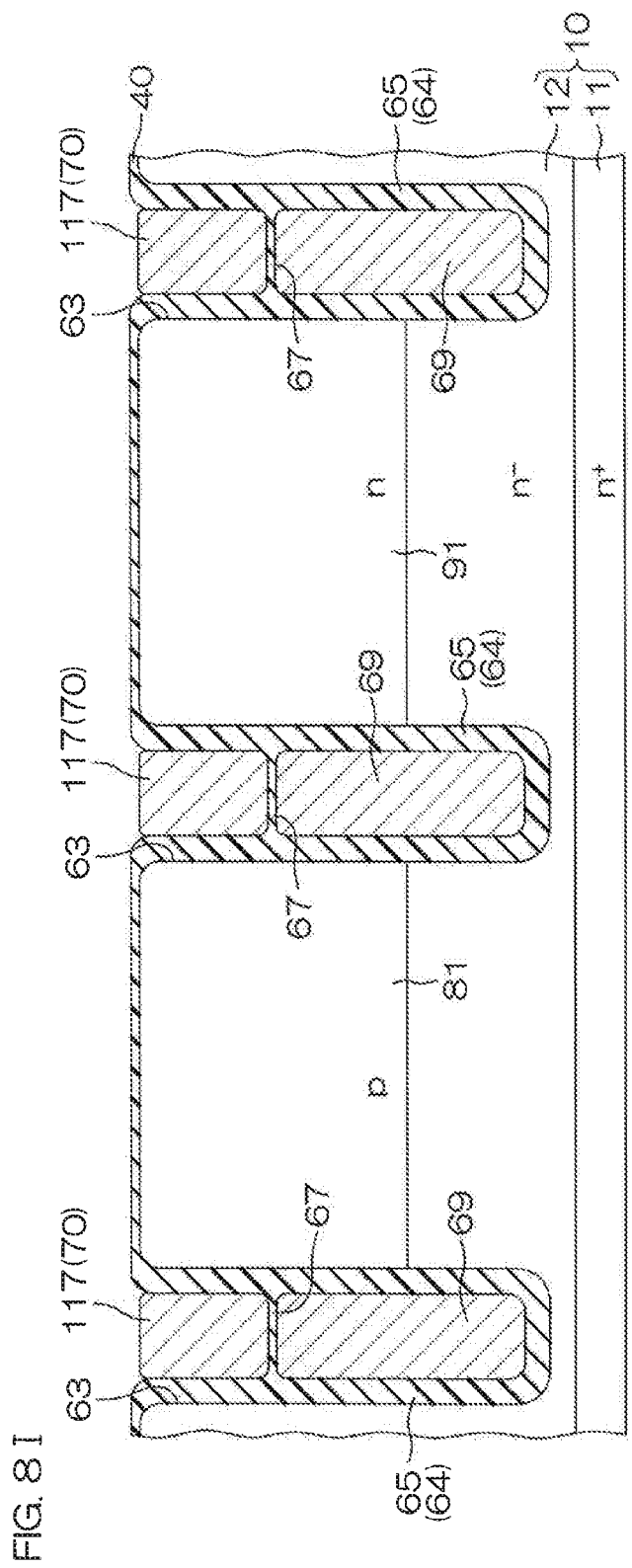

Thereafter, as shown in FIG. 7I and FIG. 8I, an unnecessary part of the polysilicon layer 117 is etchbacked, and the polysilicon layer 117 is buried in the gate trench 14 and in the DTI trench 63. Thereafter, phosphorus (P) that is an n type impurity is diffused into each polysilicon layer 117 buried in the gate trench 14 and in the DTI trench 63 according to the so-called phosphorus-deposit method. At this time, phosphorus is diffused in the depth direction from the surface of each polysilicon layer 117. As a result, the upper electrode layer 30 is formed in the VDMIS region 2, whereas the upper DTI electrode layer 70 is formed in the CMIS region 3.

Figure 8J:
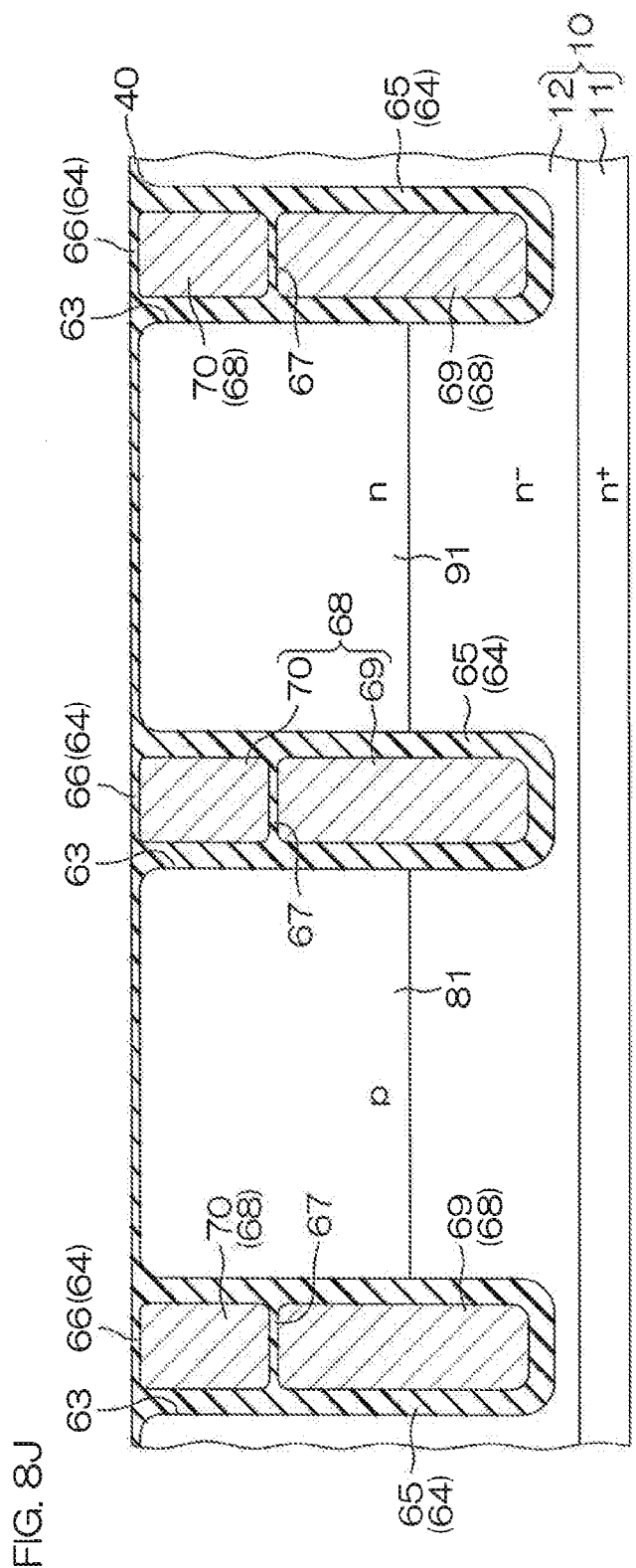

Thereafter, as shown in FIG. 7J and FIG. 8J, the second thin film portion 23 serving as the gate insulating film 20 is formed so as to cover the upper electrode layer 30, and the second part 66 serving as the DTI insulating film 64 is formed so as to cover the upper DTI electrode layer 70 according to, for example, the thermal oxidation method (step S10). As a result, in the VDMIS region 2, the trench gate structure 19 in which the gate electrode 25 (the lower electrode layer 26 and the upper electrode layer 30) is buried in the gate trench 14 is acquired. On the other hand, in the CMIS region 3, a structure in which the DTI electrode 68 (the lower DTI electrode layer 69 and the upper DTI electrode layer 70) is buried in the DTI trench 63 is acquired.

Figure 8K:
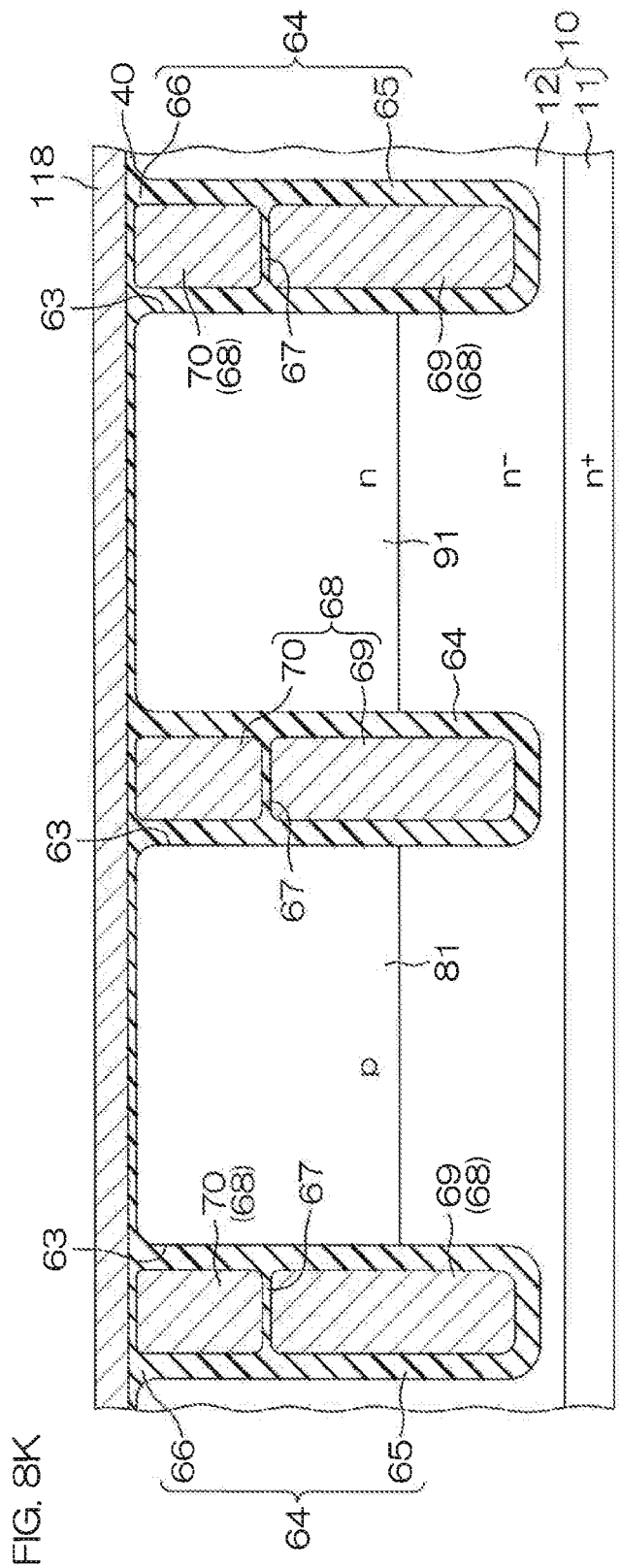

Thereafter, as shown in FIG. 7K and FIG. 8K, a polysilicon layer 118 is formed on the epitaxial layer 12 according to, for example, the CVD method (step S11). Thereafter, phosphorus (P) that is an n type impurity is diffused into the polysilicon layer 118 according to the so-called phosphorus-deposit method. At this time, phosphorus is diffused in the depth direction from the surface of the polysilicon layer 118.

Figure 8L:
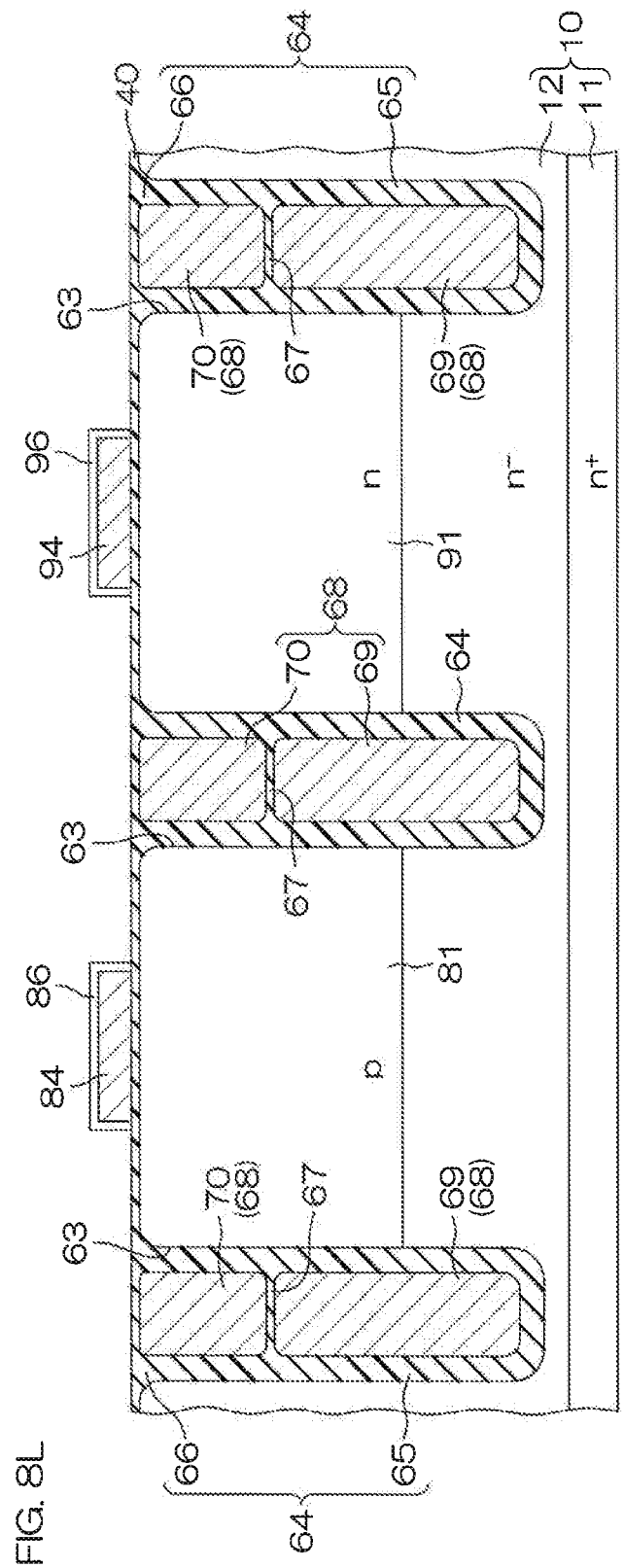

Thereafter, as shown in FIG. 7L and FIG. 8L, an unnecessary part of the polysilicon layer 118 is removed, and the n-MIS gate electrode 84 and the p-MIS gate electrode 94 are formed in the CMIS region 3. Thereafter, the gate surface insulating films 86 and 96 are formed so as to cover the surface of each of the n-MIS gate electrode 84 and the p-MIS gate electrode 94 according to, for example, the thermal oxidation method. The gate surface insulating films 86 and 96 may be formed with a thickness of, for example, 400 Å.

Figure 8M:
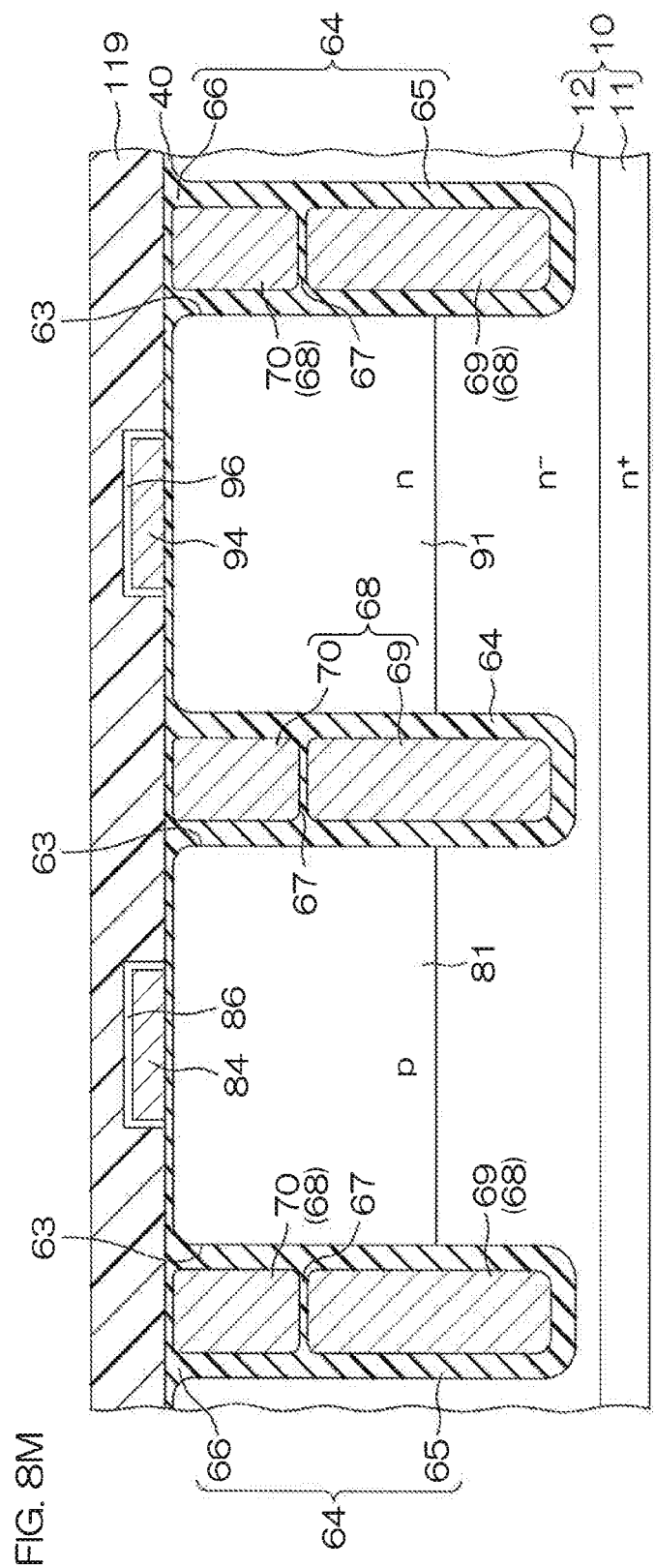

Thereafter, as shown in FIG. 7M and FIG. 8M, an ion implanting mask 119 by which the VDMIS region 2 is exposed is formed so as to cover the CMIS region 3. Thereafter, boron (B) that is a p type impurity is implanted in a multistage manner (in this step, two-stage implantation) through the ion implanting mask 119. The p type impurity is implanted, and then phosphorus (P) that is an n type impurity is implanted in a multistage manner (in this step, two-stage implantation) continuously through the ion implanting mask 119 at a position deeper than a region into which the p type impurity has been implanted. The ion implanting mask 119 is removed after the n type impurity is implanted. Thereafter, annealing is applied, and the p type body region 15 and the n type drift region 16 are formed (step S12).

Thereafter, in the CMIS region 3, an ion implanting mask (not shown) that selectively has an opening is formed on the epitaxial layer 12 in a region in which the $n^+$ type source region 82 and the $n^+$ type drain region 83 are to be formed. Thereafter, an n type impurity is implanted through the ion implanting mask. The ion implanting mask is removed after the n type impurity is implanted.

The ion implanting mask is removed, and then another ion implanting mask (not shown) that selectively has an opening in a region in which the $p^+$ type source region 92 and the $p^+$ type drain region 93 are to be formed is formed. Thereafter, a p type impurity is implanted through this ion implanting mask. The ion implanting mask is removed after the p type impurity is implanted. Thereafter, annealing is applied, and the $n^+$ type source region 82, the $n^+$ type drain region 83, the $p^+$ type source region 92, and the $p^+$ type drain region 93 are formed in the CMIS region 3 (step S13).

Figure 8N:
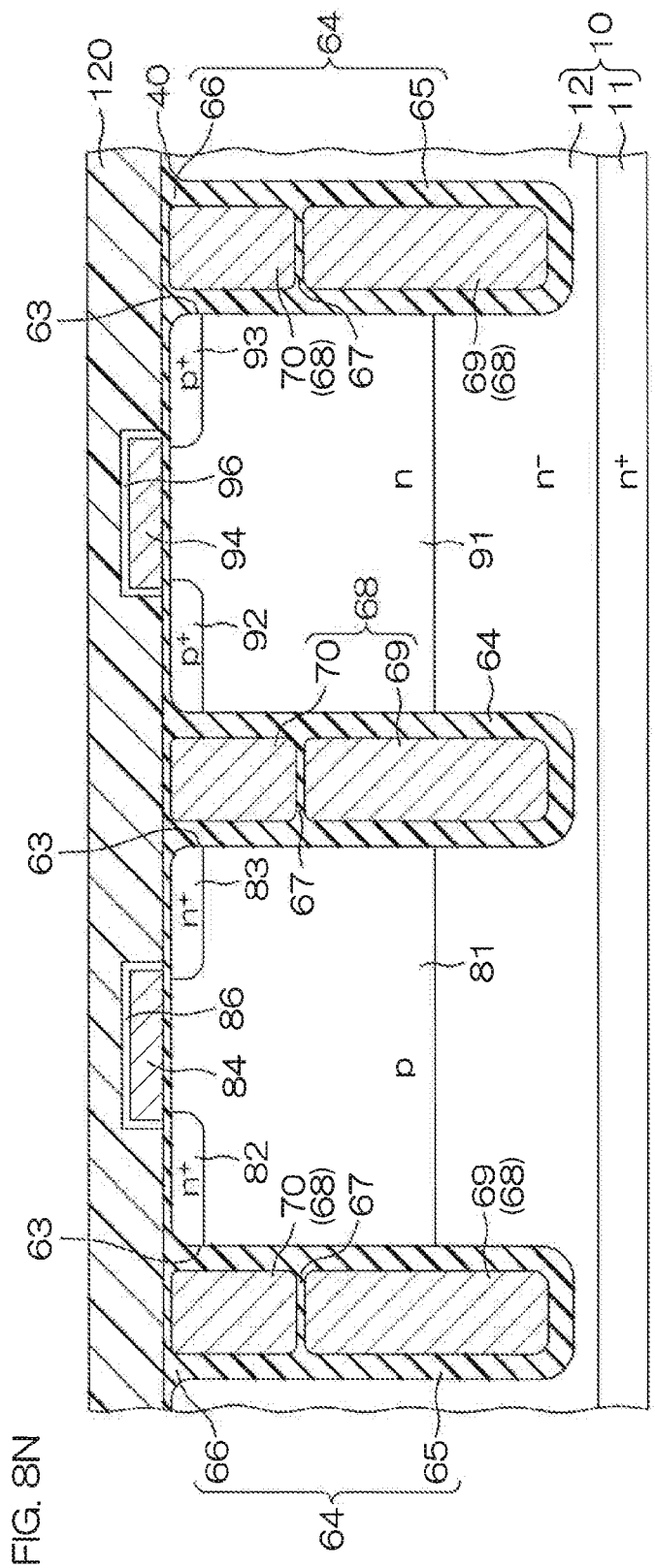
Figure 80:
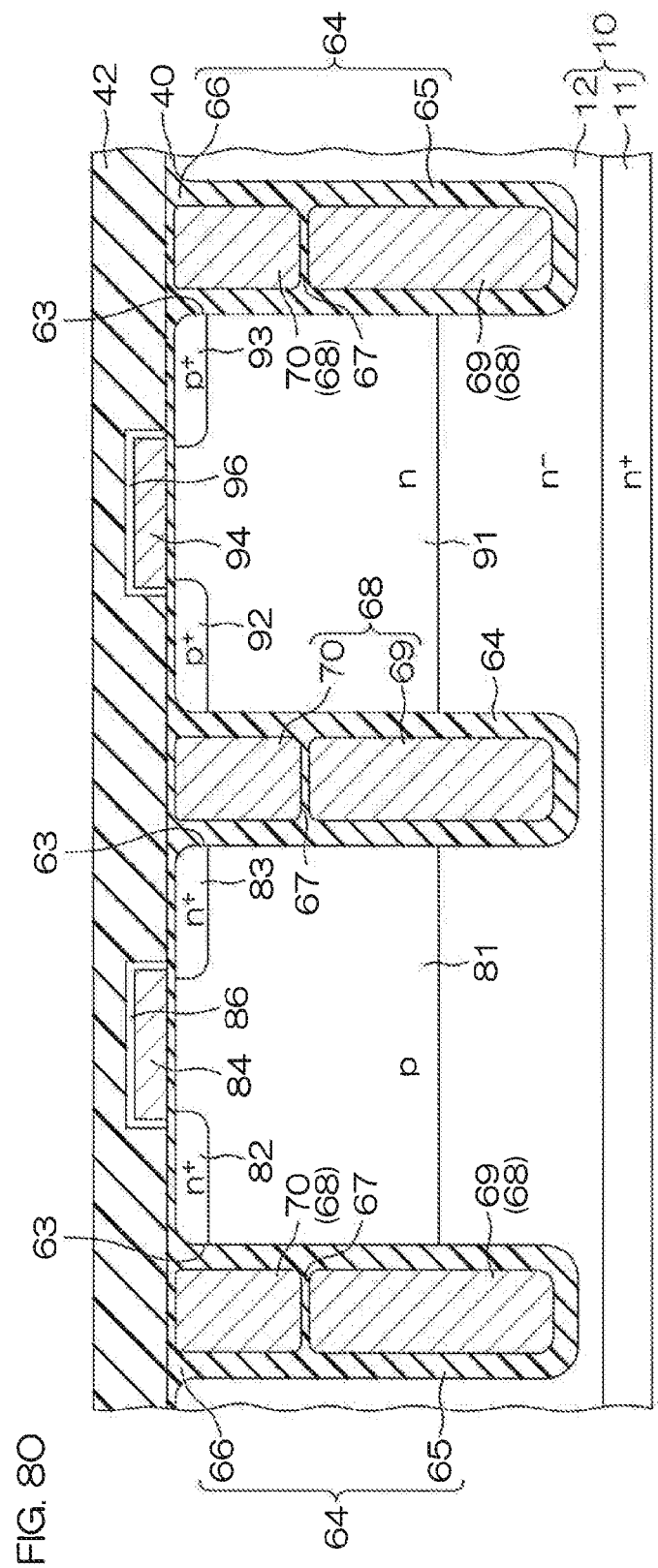

Thereafter, as shown in FIG. 7N and FIG. 8N, an ion implanting mask 120 that selectively exposes the VDMIS region 2 is formed on the epitaxial layer 12. Thereafter, arsenic (As) that is an n type impurity is implanted through the ion implanting mask 120. The n type impurity is implanted, and then the ion implanting mask 120 is removed. Thereafter, annealing is applied, and the n type source region 17 is formed in the VDMIS region 2.

Thereafter, an ion implanting mask (not shown) that selectively exposes a region in which the p type contact region 18 (see FIG. 2) is to be formed is formed on the epitaxial layer 12. Thereafter, boron (B) that is a p type impurity is implanted through this ion implanting mask. The p type impurity is implanted, and then the ion implanting mask is removed. Thereafter, annealing is applied, and the p type contact region 18 is formed in the VDMIS region 2 (step S14).

Thereafter, as shown in FIG. 7O and FIG. 8O, the interlayer insulating film 42 made of silicon nitride is formed on the epitaxial layer 12 according to, for example, the CVD method (step S15). If needed, the surface of the interlayer insulating film 42 may be flattened after this step. The flattening of the interlayer insulating film 42 may be carried out through the following step. For example, a USG film (not shown) is formed on the interlayer insulating film 42 according to the CVD method. Thereafter, according to a CMP (Chemical Mechanical Polishing) method, the USG film is ground until the surface of the interlayer insulating film 42 is exposed. As a result, a rugged state generated in the interlayer insulating film 42 is backfilled by the USG, and the surface of the interlayer insulating film 42 is flattened.

Figure 8P:
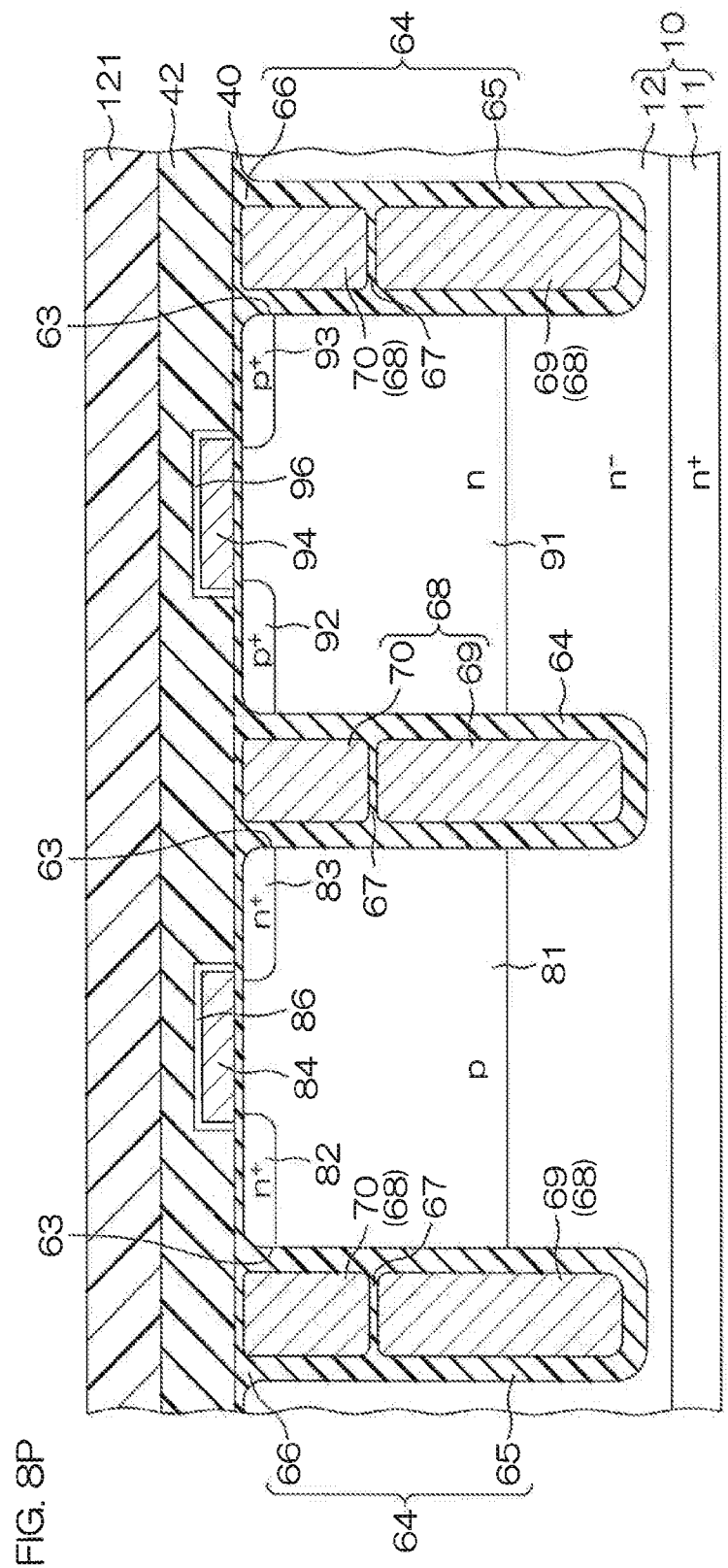

Thereafter, as shown in FIG. 7P and FIG. 8P, a resist mask 121 that selectively has an opening 121*a* in a region in which the source contact trench 49 is to be formed is formed on the interlayer insulating film 42 (step S16). Thereafter, the interlayer insulating film 42, the surface insulating film 40, and the epitaxial layer 12 (the n type source region 17, the p type contact region 18, and the p type body region 15) are selectively removed according to dry etching through the resist mask 121 (for example, according to a RIE (Reactive Ion Etching) method). As a result, the source contact trench 49 is formed. Thereafter, boron (B) that is a p type impurity is selectively implanted along the inner surface of the source contact trench 49 from which the p type body region 15 is exposed while using the resist mask 121 as an ion implanting mask. At this time, the p type impurity may be implanted by diagonal irradiation with respect to the inner surface of the source contact trench 49. As a result, the p type extra contact region 51 is formed. The p type extra contact region 51 is formed, and then the resist mask 121 is removed.

Figure 8Q:
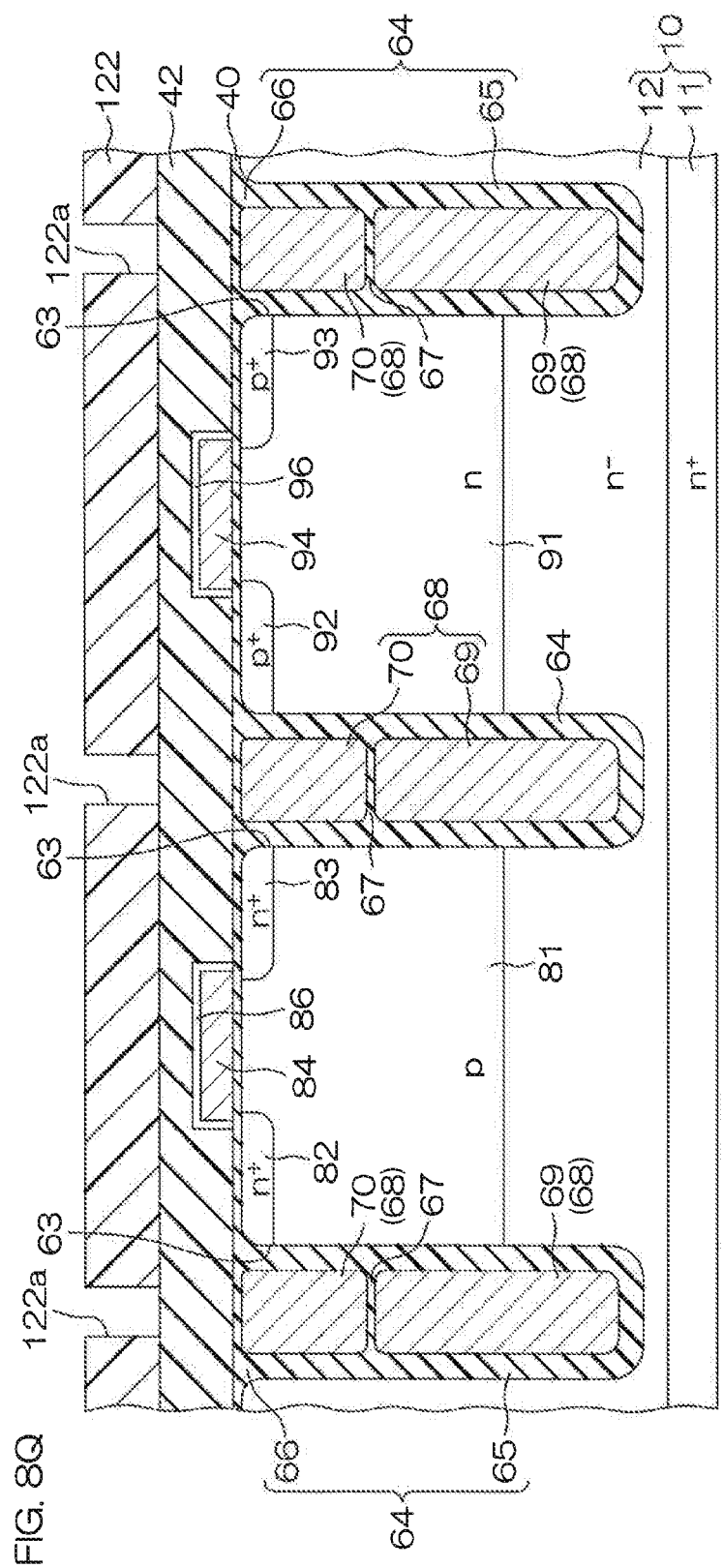

Thereafter, as shown in FIG. 7Q and FIG. 8Q, a resist mask 122 that selectively has an opening 122*a* in a region in which the gate contact trench 44 and the DTI contact trench 74 are to be formed is formed on the interlayer insulating film 42 (step S17). At this time, the resist mask 122 is formed on the interlayer insulating film 42 so as to backfill the source contact trench 49.

Thereafter, as shown in FIG. 7R and FIG. 8R, the interlayer insulating film 42, the second thin film portion 23 of the gate insulating film 20 (the second part 66 of the DTI insulating film 64), the upper electrode layer 30 (the upper DTI electrode layer 70), the intermediate insulating film 24 (the intermediate DTI insulating film 67), and the lower electrode layer 26 (the lower DTI electrode layer 69) are removed in this order according to dry etching (for example, the RIE method) through the resist mask 122.

This five-layer etching is performed while appropriately changing the kind of etching gas. As a result, in the VDMIS region 2, the gate contact trench 44 that has a bottom portion passing through the intermediate insulating film 24 and reaching the upper end portion 28 (the convex portion 29) of the lower electrode layer 26 is formed. On the other hand, in the CMIS region 3, the DTI contact trench 74 that has a bottom portion passing through the intermediate DTI insulating film 67 and reaching the lower DTI electrode layer 69 is formed. The gate contact trench 44 and the DTI contact trench 74 are formed, and then the resist mask 122 is removed.

Figure 8S:
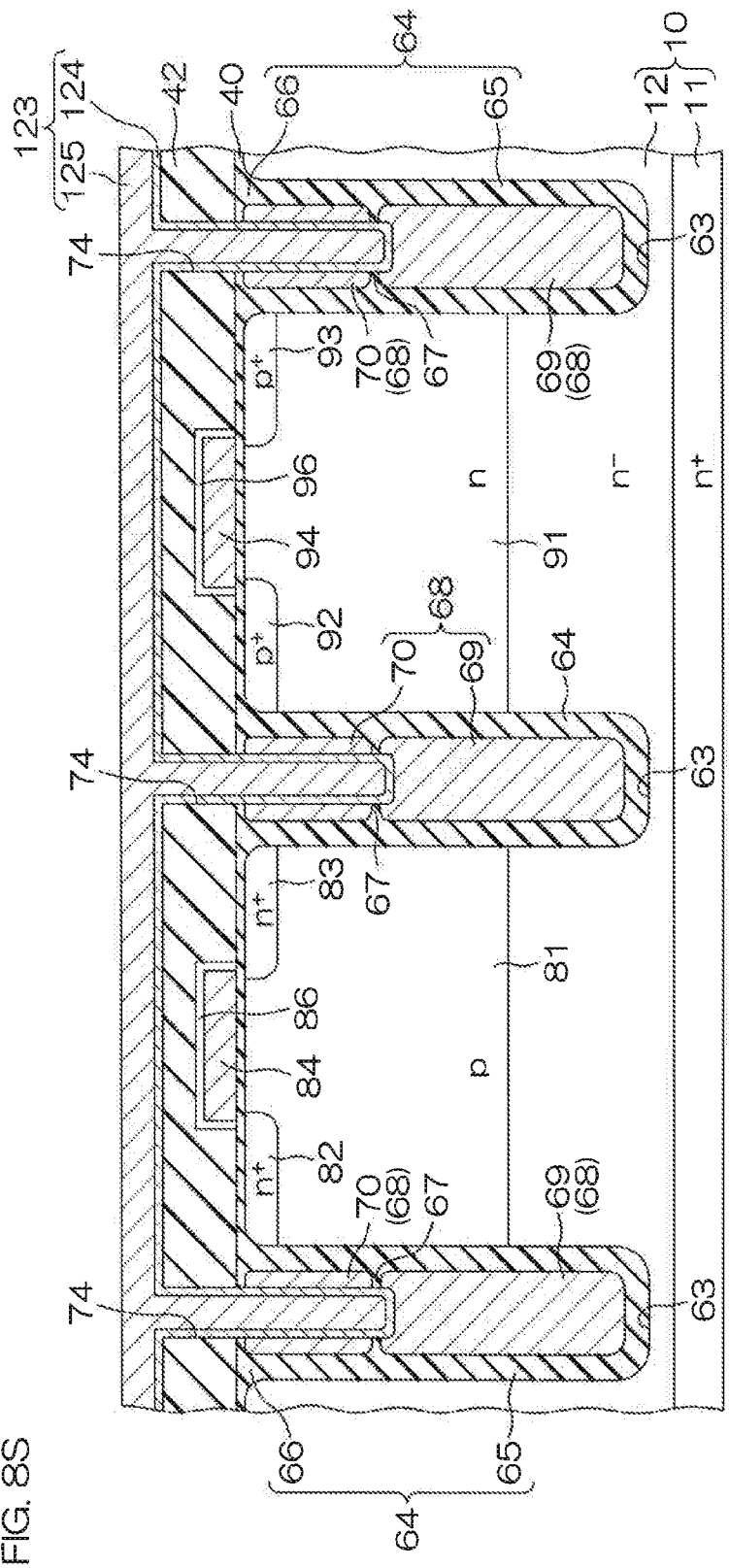

Thereafter, as shown in FIG. 7S and FIG. 8S, a conductor layer 123 is formed so as to backfill each contact trench 44, 49, and 74 and so as to cover the interlayer insulating film 42 (step S18). In a step of forming the conductor layer 123, a first conductor layer 124 including titanium or titanium nitride is first formed along the inner surface of each contact trench 44, 49, and 74 and along the surface of the interlayer insulating film 42 according to, for example, the CVD method. Thereafter, each contact trench 44, 49, and 74 is backfilled, and the second conductor layer 125 including tungsten with which the interlayer insulating film 42 is covered is formed according to, for example, the CVD method. As a result, the conductor layer 123 including the first conductor layer 124 and the second conductor layer 125 is formed.

Figure 8T:
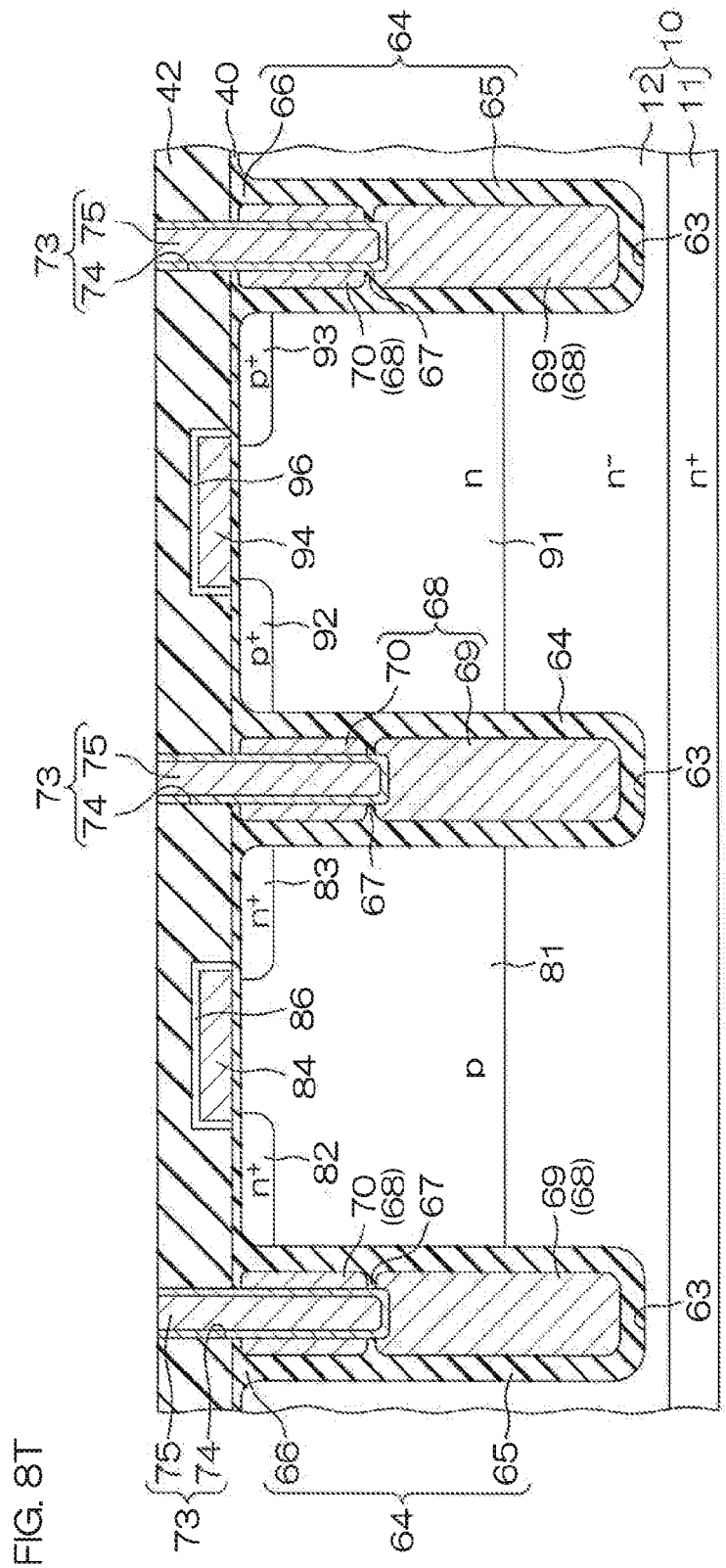

Thereafter, as shown in FIG. 7T and FIG. 8T, an unnecessary part of the conductor layer 45 formed on the interlayer insulating film 42 excluding each contact trench 44, 49, and 74 is removed by etchback. As a result, the conductor layers 45, 50, and 75 are buried in the contact trenches 44, 49, and 74, respectively, and the gate contact 43, the source contact 48, and the DTI contact 73 are formed.

Figure 8U:
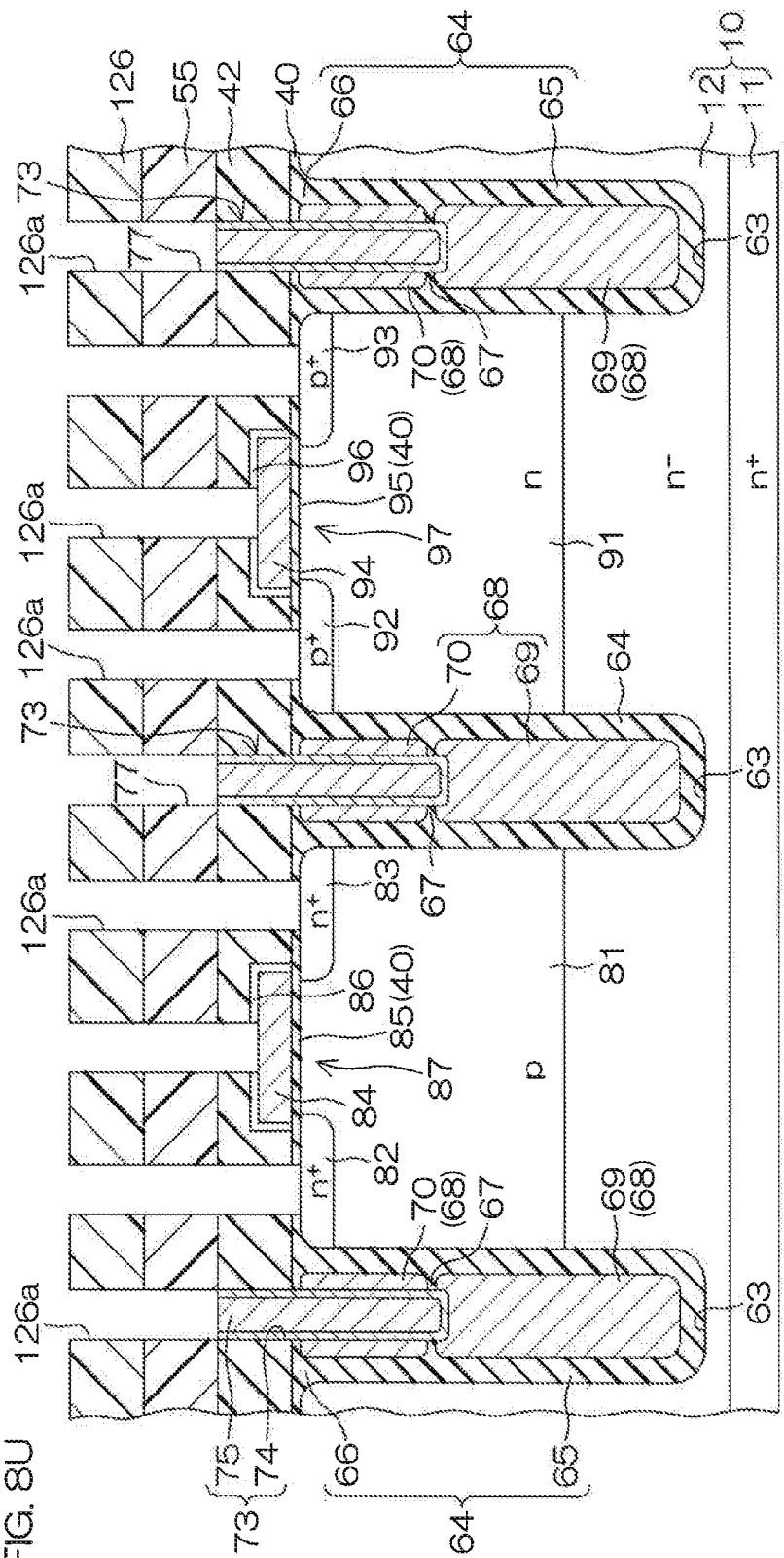

Thereafter, as shown in FIG. 7U and FIG. 8U, the USG film 55 is formed on the interlayer insulating film 42 so as to cover each contact 43, 48, and 73 (step S19). Thereafter, a resist mask 126 that selectively has an opening 126a in a region in which the source plug 56, the DTI plug 76, and each contact 100 to 105 (see FIG. 5 also) are to be formed is formed on the USG film 55 (step S20). Thereafter, the plug trench 57, the DTI plug trench 77, and trenches for each contact 100 to 105 are formed according to dry etching through the resist mask 126 (for example, the RIE method). Thereafter, the resist mask 126 is removed.

Figure 8V:
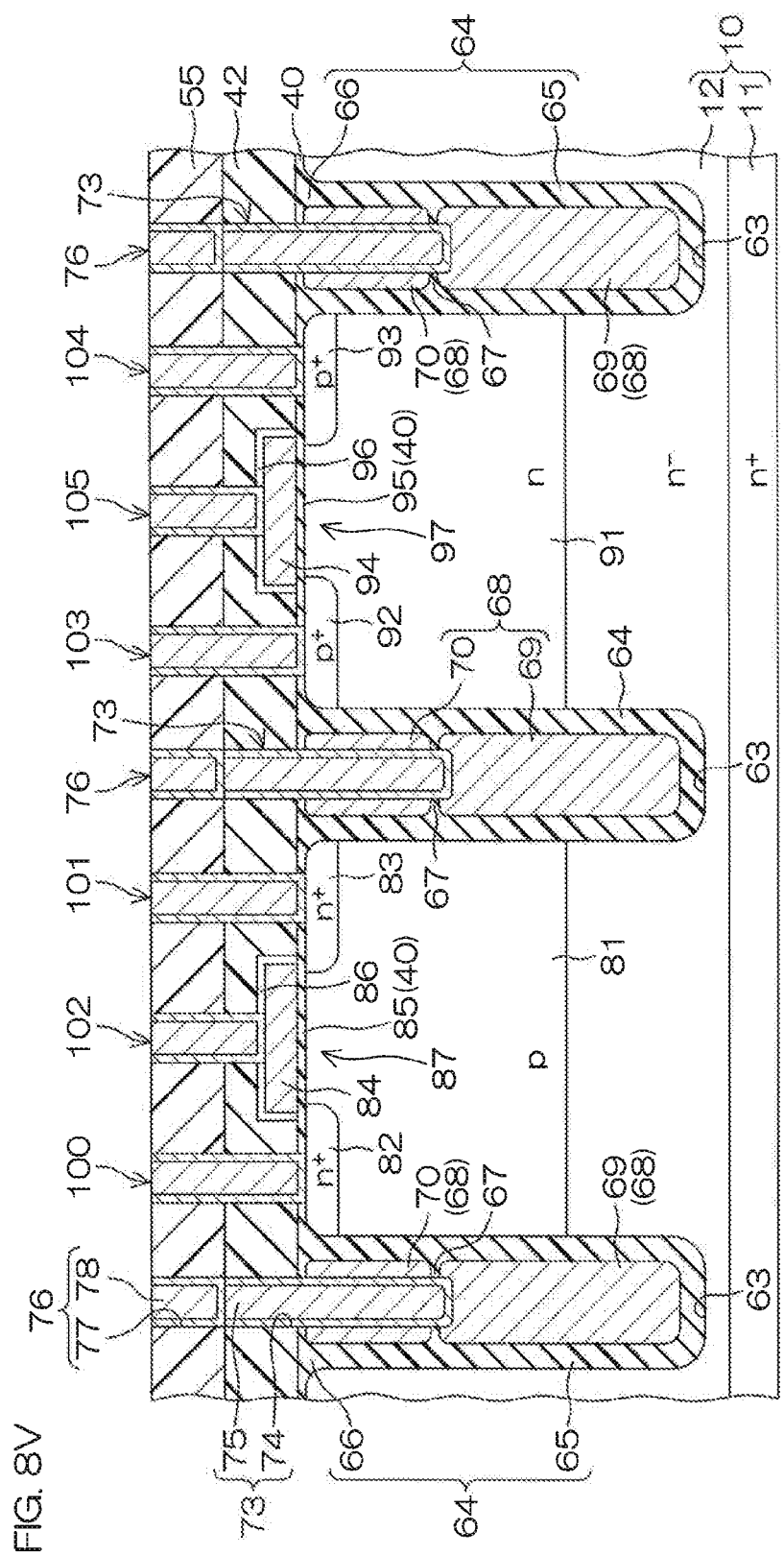
Figure 8W:
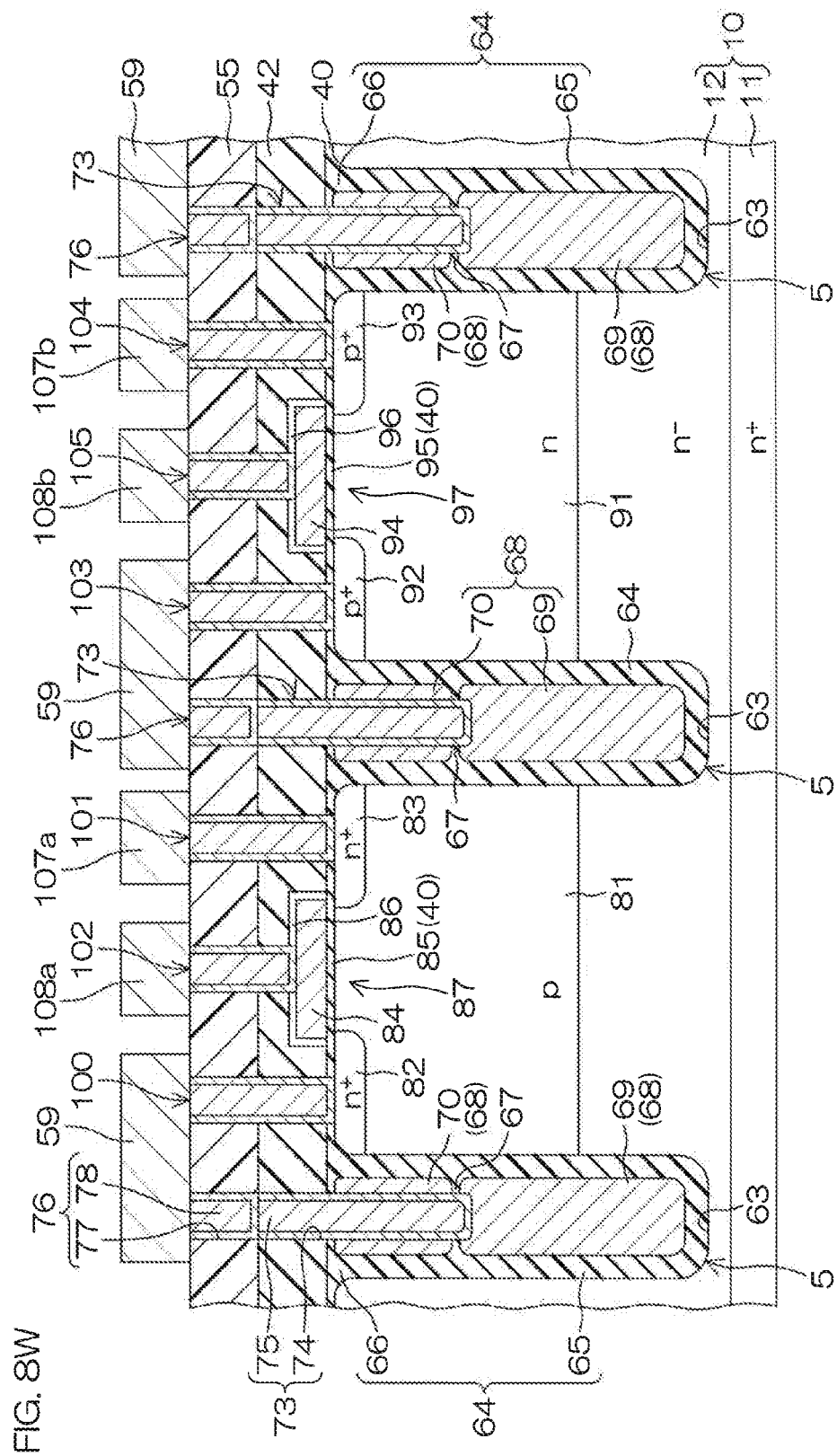

Thereafter, as shown in the FIG. 7V and the FIG. 8V, a conductor layer is embedded in each trench according to the same method as in the step of forming the conductor layers 45, 50, and 75. As a result, the source plug 56, the DTI plug 76, and each contact 100 to 105 are formed.

Thereafter, as shown in the FIG. 7W and the FIG. 8W, an electrode film including an AlCu film is formed on the USG film 55 so as to cover the source plug 56, the DTI plug 76, and each contact 100 to 105 according to, for example, a plating method (step S21). Thereafter, the electrode film is selectively removed, and is separated into the source electrode film 59, each drain electrode film 107a and 107b, and each gate electrode film 108a and 108b. Thereafter, the drain electrode 60 is formed on the reverse surface of the semiconductor substrate 11. The semiconductor device 1 is formed through these steps.

According to the aforementioned method, the source contact trench 49 that is comparatively shallow is formed (step S16: see FIG. 7P and FIG. 8P), and then the gate contact trench 44 and the DTI contact trench 74 that are deeper than the source contact trench 49 are formed (step S17: see FIG. 7R and FIG. 8R).

In a case in which the source contact trench 49 that is comparatively shallow is formed after the gate contact trench 44 and the DTI contact trench 74 that are comparatively deep are formed, the resist mask 122 must be formed so as to backfill the gate contact trench 44 and the DTI contact trench 74 that are comparatively deep. Additionally, the resist mask 122 must be removed from the gate contact trench 44 and from the DTI contact trench 74 after the source contact trench 49 is formed.

Therefore, the manufacturing process becomes not only difficult but also long in time required to perform the process.

Therefore, it is possible to avoid a step of burying and removing the resist mask 122 in and from the comparatively deep gate contact trench 44 and the comparatively deep DTI contact trench 74 by previously forming the comparatively shallow source contact trench 49. As a result, it is possible to accurately form the source contact trench 49, the gate contact trench 44, and the DTI contact trench 74, and, in addition, it is possible to shorten the duration of time required in the manufacturing process.

Second Preferred Embodiment

Figure 9:
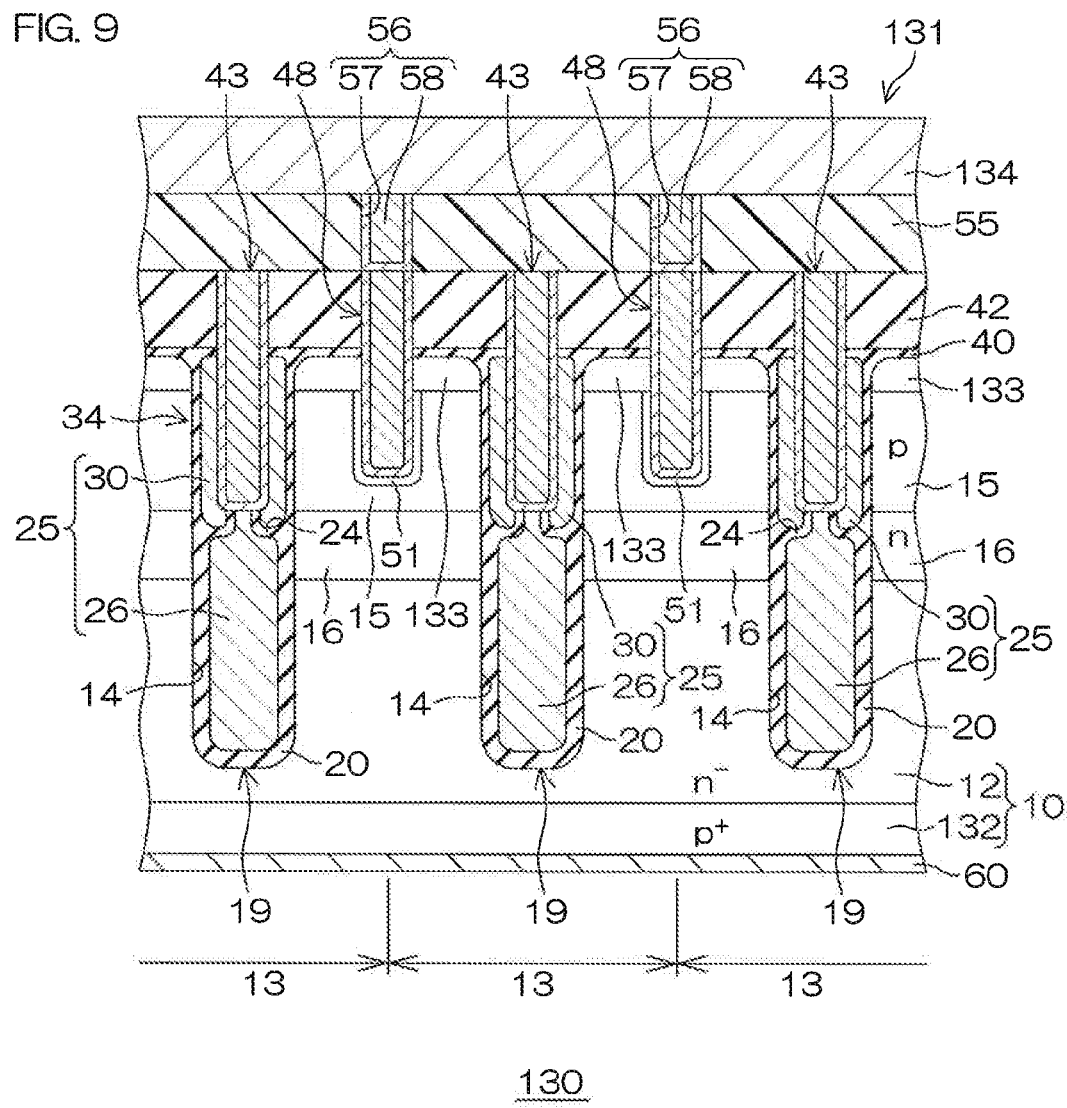
FIG. 9 is a schematic cross-sectional view of a semiconductor device according to a second preferred embodiment of the present invention.

FIG. 9 is a schematic cross-sectional view of a semiconductor device 130 according to a second preferred embodiment of the present invention. The semiconductor device 130 differs from the aforementioned semiconductor device 1 in the fact that an IGBT region 131 is formed instead of the VDMIS region 2. A main arrangement of the semiconductor device 130 is the same as that of the semiconductor device 1 (see FIG. 3 also). In FIG. 9, the same reference sign as in FIG. 1 to FIG. 8W is given to a component corresponding to each component of FIG. 1 to FIG. 8W mentioned above, and a description of this component is omitted.

As shown in FIG. 9, the semiconductor device 130 has the semiconductor layer 10 including a $p^+$ type semiconductor substrate 132 instead of the $n^+$ type semiconductor substrate 11. The semiconductor device 130 additionally has an n type emitter region 133 and an emitter electrode film 134 instead of the n type source region 17 and the source electrode film 59 of the VDMIS region 2. The n type emitter region 133 is one example of the first conductivity type region of the present invention. It is also possible to fulfill the same effect as the semiconductor device 1 by means of the semiconductor device 130 including the IGBT region 131 as described above.

Third Preferred Embodiment

Figure 10:
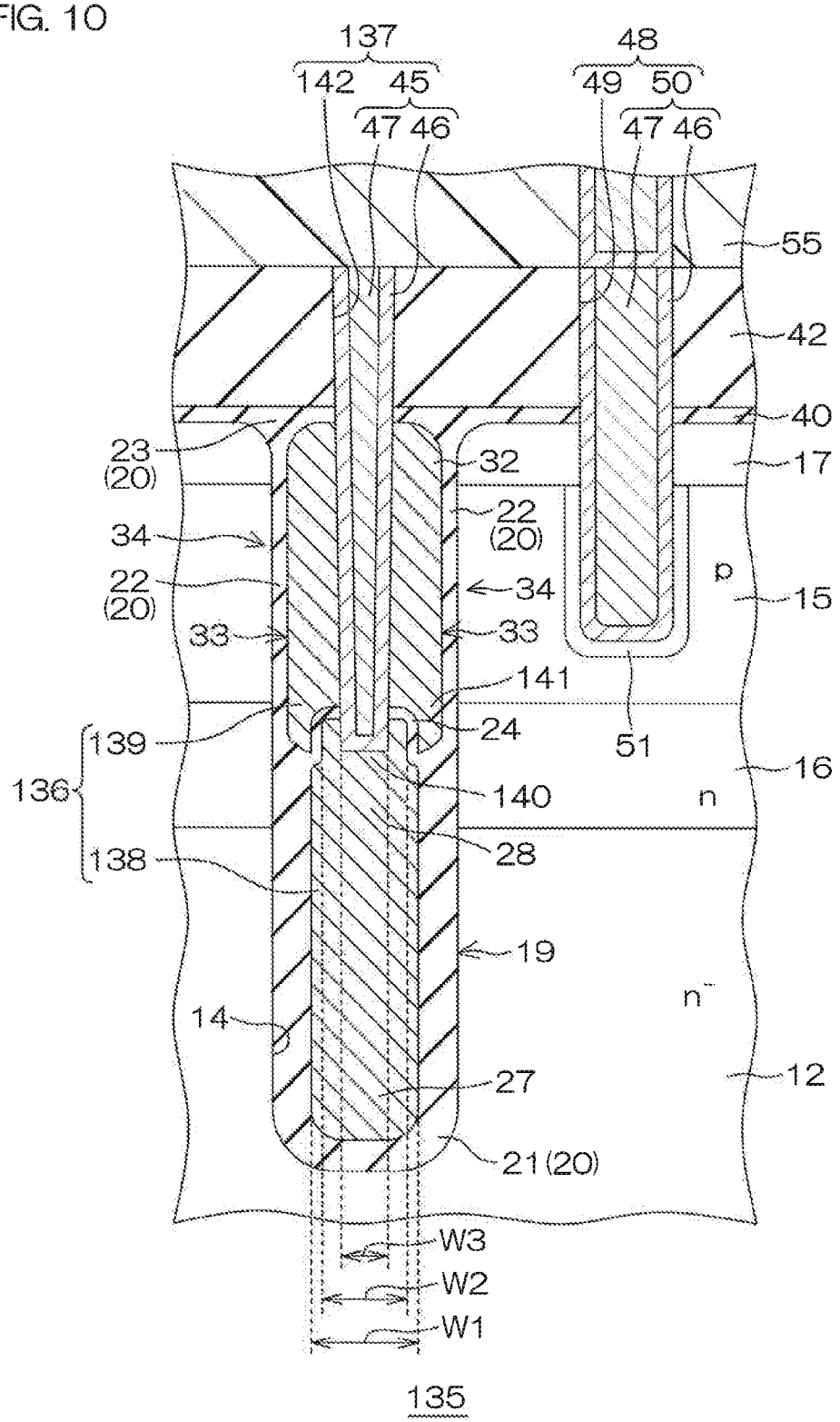
FIG. 10 is an enlarged cross-sectional view showing a trench gate structure of a semiconductor device according to a third preferred embodiment of the present invention.

FIG. 10 is an enlarged cross-sectional view showing the trench gate structure 19 of the semiconductor device 135 according to a third preferred embodiment of the present invention. The semiconductor device 135 according to the third preferred embodiment differs from the semiconductor device 1 in the fact that a gate electrode 136 is formed instead of the gate electrode 25 and in the fact that a gate contact 137 is formed instead of the gate contact 43. In the other respects, the semiconductor device 135 is arranged in the same way as the semiconductor device 1 (see FIG. 3 also). In FIG. 10, the same reference sign as in FIG. 1 to FIG. 9 is given to a component corresponding to each component of FIG. 1 to FIG. 9 mentioned above, and a description of this component is omitted.

As shown in FIG. 10, the gate electrode 136 includes a lower electrode layer 138 and an upper electrode layer 139 that are separated upwardly and downwardly from each other by means of the intermediate insulating film 24. The upper end portion 28 of the lower electrode layer 138 includes a convex portion 140. The upper end portion 28 may be arranged so as to be regarded as not having the convex portion 140 by forming the convex portion 140 of the lower electrode layer 138 with substantially the same width as the other parts of the lower electrode layer 138 (width W1≈width W2).

The intermediate insulating film 24 is formed along the convex portion 140 of the lower electrode layer 138 so as to be integrally continuous with the thick film portion 21 and the first thin film portion 22 of the gate insulating film 20. The upper electrode layer 139 has a lower end portion 141 facing the convex portion 140 (the upper end portion 28) of the lower electrode layer 138 with the intermediate insulating film 24 therebetween. The upper electrode layer 139 is formed so as to overlap with the convex portion 140 of the lower electrode layer 26.

The gate contact 137 is formed so as to pass through the interlayer insulating film 42, the second thin film portion 23 of the gate insulating film 20, the upper electrode layer 139, and the intermediate insulating film 24 in this order and so as to reach the lower electrode layer 138. The gate contact 137 has a side portion contiguous to the interlayer insulating film 42, to the second thin film portion 23 of the gate insulating film 20, to the upper electrode layer 139, to the intermediate insulating film 24, and to the lower electrode layer 138 and a bottom portion contiguous to the convex portion 140 (the upper end portion 28) of the lower electrode layer 26.

The gate contact 137 has a trench contact structure that includes a gate contact trench 142 having a tapered shape in which the width of an opening becomes narrower from the opening toward the bottom portion when viewed cross-sectionally and the conductor layer 45 buried in this gate contact trench 142.

The gate contact trench 142 is formed by digging down the interlayer insulating film 42, the second thin film portion 23 of the gate insulating film 20, the upper electrode layer 139, and the intermediate insulating film 24 in this order so as to reach the lower electrode layer 138. The gate contact trench 142 has a side portion from which the interlayer insulating film 42, the second thin film portion 23 of the gate insulating film 20, the upper electrode layer 139, the intermediate insulating film 24, and the lower electrode layer 138 are exposed and a bottom portion from which the lower electrode layer 138 is exposed.

With respect to the direction perpendicular to the depth direction of the gate trench 14, the bottom portion of the gate contact trench 142 has a width W3 smaller than a width W1 of the upper end portion 28 (parts other than the convex portion 140) of the lower electrode layer 138. More specifically, the bottom portion of the gate contact trench 142 has a width W3 smaller than a width W2 of the convex portion 140 of the lower electrode layer 138. The width of the opening of the gate contact trench 142 may be smaller than the width W1 of the upper end portion 28 of the lower electrode layer 138, or may be greater than the width W1 of the upper end portion 28 of the lower electrode layer 138.

As described above, it is possible to fulfill the same effects as the semiconductor device 1 also by means of the semiconductor device 135. Additionally, it is possible to excellently electrically connect (short-circuit) the upper electrode layer 139 and the lower electrode layer 138 together by positioning the bottom portion of the gate contact 137 at a depth lower than the intermediate insulating film 24.

It is possible to embody the present invention in other modes although the modes according to the preferred embodiments of the present invention have been described as above.

Figure 11:
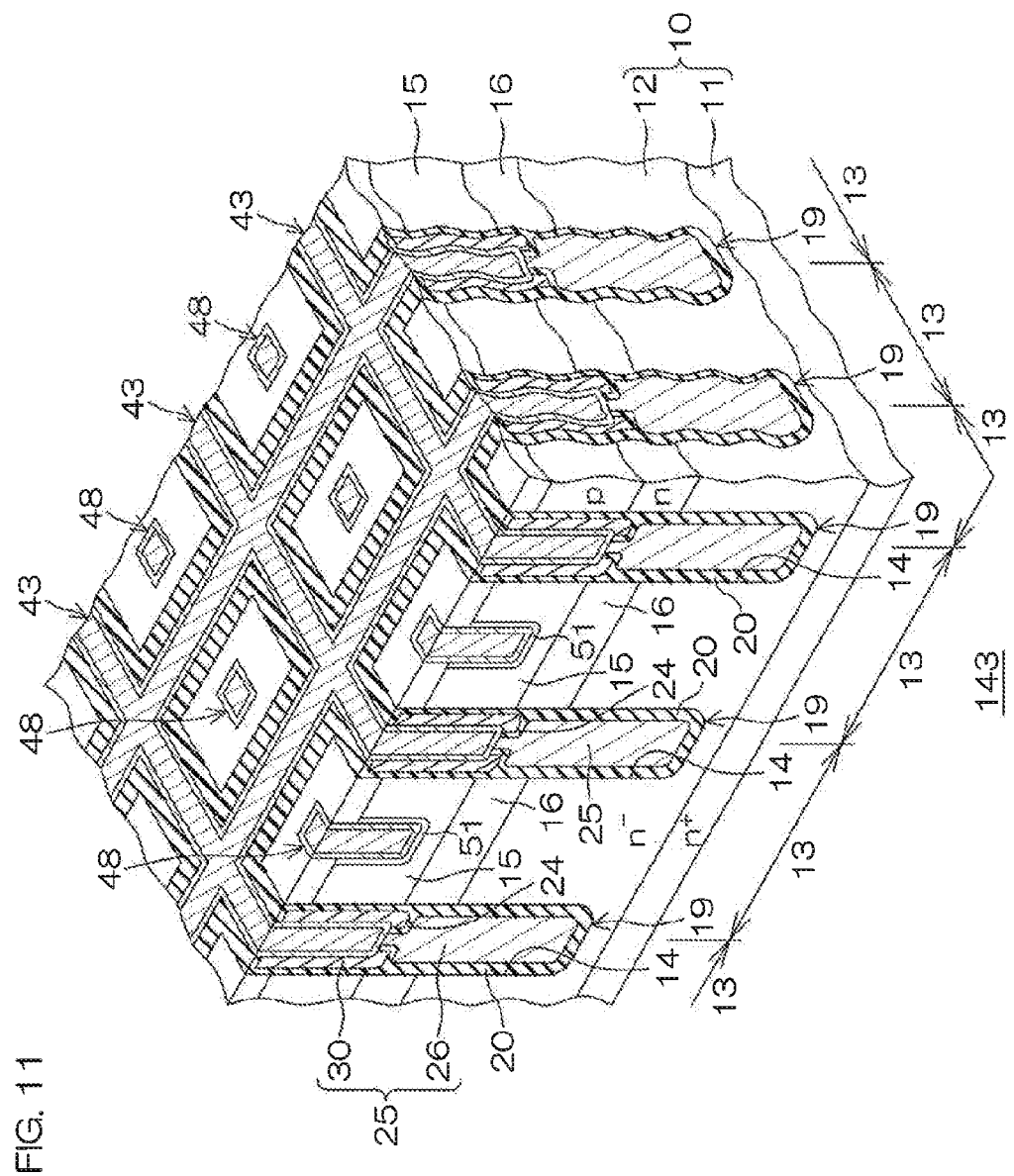
FIG. 11 is a schematic perspective cross-sectional view of a semiconductor device according to a first modification.

For example, an arrangement shown in FIG. 11 may be employed although the trench gate structure 19 is formed in a stripe manner as described in each preferred embodiment mentioned above. FIG. 11 is a schematic perspective cross-sectional view of a semiconductor device 143 according to a first modification.

Of course, the arrangement of the semiconductor device 143 is also applicable to the arrangement according to the semiconductor device 130 of the second preferred embodiment and applicable to the arrangement according to the semiconductor device 135 of the third preferred embodiment although the semiconductor device 143 is shown as a modification of the semiconductor device 1 according to the first preferred embodiment in FIG. 11. In FIG. 11, the same reference sign is given to an arrangement common to that of the semiconductor device 1, and a description of this arrangement is omitted.

As shown in FIG. 11, the trench gate structure 19 may have a gate trench 14 formed in a grid-shaped manner when viewed planarly. In other words, a plurality of unit cells 13 may be formed so as to be arranged in a square matrix. Each unit cell 13 is defined by a single square-matrix region that is partitioned by the straight line passing through the center of the trench gate structure 19 when viewed planarly.

The gate contact 43 is formed in a grid-shaped manner, when viewed planarly, along the longitudinal direction of the gate trench 14. The source contact 48 (the source contact trench 49) is formed in a quadrangular region surrounded by the gate trench 14 when viewed planarly. The n type source region 17 and the p type contact region 18 are selectively formed in a region between the side portion of the source contact trench 49 and the side portion of the gate trench 14, not shown in FIG. 11. The other arrangements are the same as those of the semiconductor device 1.

Figure 12:
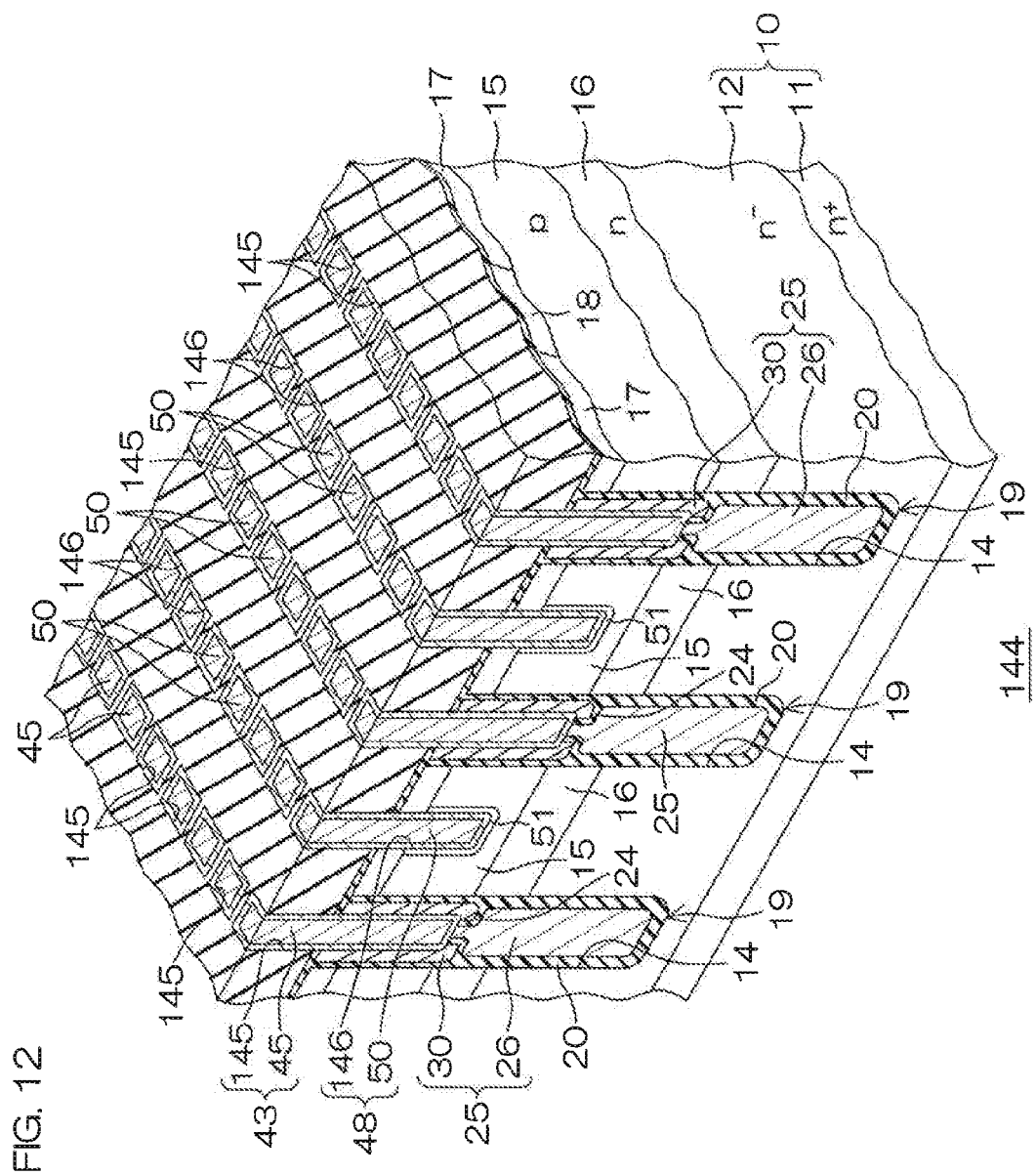
FIG. 12 is a schematic perspective cross-sectional view of a semiconductor device according to a second modification.

Additionally, an arrangement shown in FIG. 12 may be employed although the gate contacts 43 and 137 are formed in a stripe manner along the trench gate structure 19 as described in each of the aforementioned preferred embodiments. FIG. 12 is a schematic perspective cross-sectional view of a semiconductor device 144 according to a second modification.

Of course, the arrangement of the semiconductor device 144 is also applicable to the arrangement according to the semiconductor device 130 of the second preferred embodiment and applicable to the arrangement according to the semiconductor device 135 of the third preferred embodiment although the semiconductor device 144 is shown as a modification of the semiconductor device 1 according to the first preferred embodiment in FIG. 12. In FIG. 12, the same reference sign is given to an arrangement common to that of the semiconductor device 1, and a description of this arrangement is omitted.

As shown in FIG. 12, the gate contact 43 may include a plurality of gate contact holes 145 formed so as to be spaced out and conductor layers 45 buried in the gate contact holes 145, respectively, along the stripe direction of the gate trench 14. The gate contact hole 145 may be polygonal when viewed planarly, i.e., may be quadrangular when viewed planarly or may be hexagonal when viewed planarly. Additionally, the gate contact hole 145 may be circular or elliptical when viewed planarly.

Additionally, as shown in FIG. 12, the source contact 48 may include a plurality of source contact holes 146 formed so as to be spaced out and conductor layers 50 buried in the source contact holes 146, respectively, along the stripe direction of the gate trench 14 although the source contact 48 is formed in a stripe manner as described in each of the aforementioned preferred embodiments. Of course, each arrangement of the gate contact holes 145 and each arrangement of the source contact holes 146 may be applied to each arrangement of the DTI contact 73, the source plug 56, the DTI plug 76, and the contacts 100 to 105.

When an arrangement, such as that of the gate contact holes 145 and that of the source contact holes 146, is applied, an area that functions as a heat dissipation material becomes smaller with respect to the gate contact 43, the source contact 48, and the like. Therefore, it can be said that the arrangement according to the first to third preferred embodiments is more desirable.

Figure 13:
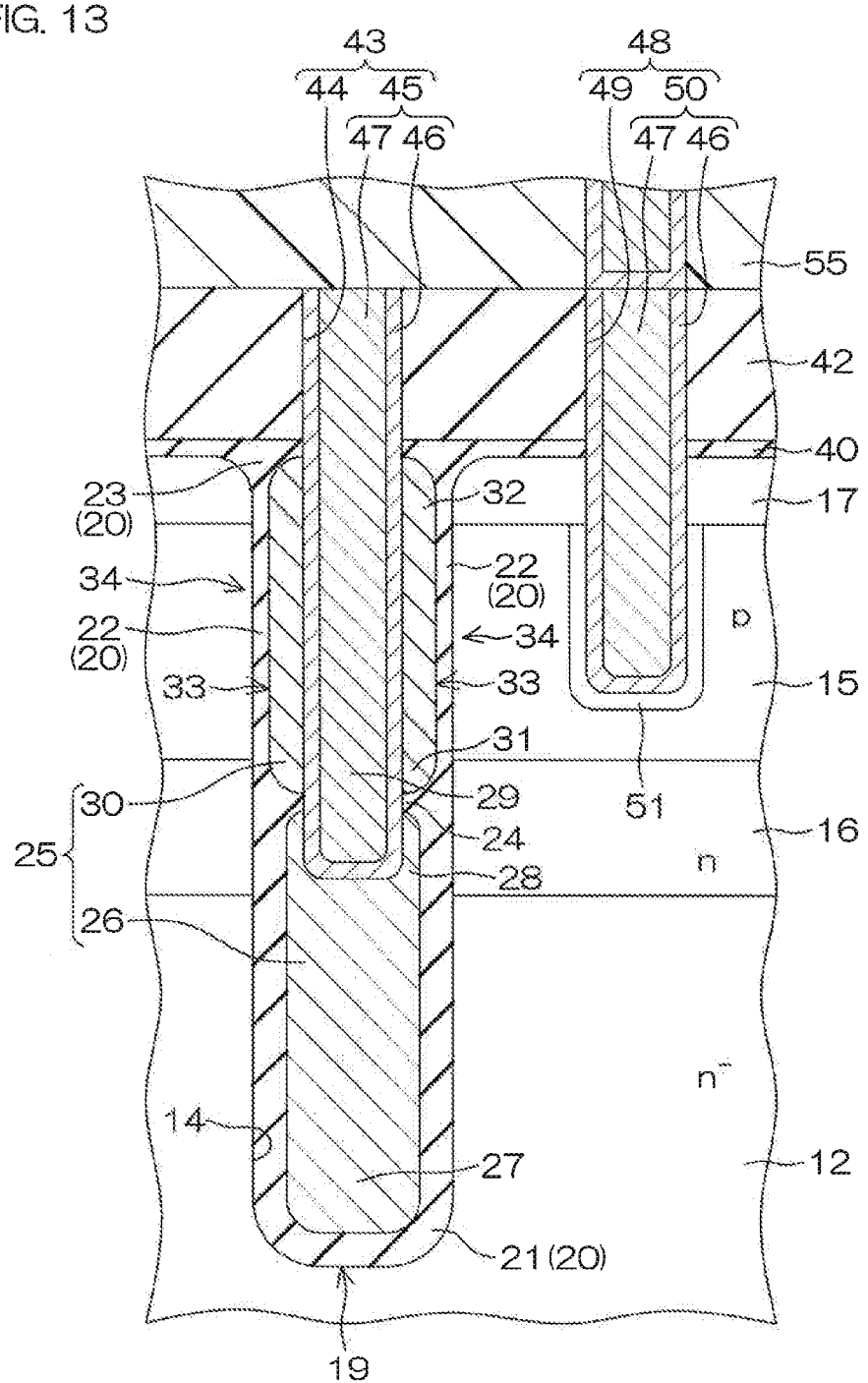
FIG. 13 is a schematic enlarged cross-sectional view showing a trench gate structure of a semiconductor device according to a third modification.

Additionally, an arrangement shown in FIG. 13 may be employed although the gate contact 43 (the gate contact trench 44) has the bottom portion contiguous to the convex portion 29 of the lower electrode layer 26 as described in the first and second preferred embodiments. FIG. 13 is a schematic enlarged cross-sectional view showing the trench gate structure 19 of a semiconductor device 147 according to a third modification.

Of course, the arrangement of the semiconductor device 147 is also applicable to the arrangement according to the semiconductor device 130 of the second preferred embodiment although the semiconductor device 147 is shown as a modification of the semiconductor device 1 according to the first preferred embodiment in FIG. 13. In FIG. 13, the same reference sign is given to an arrangement common to that of the semiconductor device 1, and a description of this arrangement is omitted.

As shown in FIG. 13, the gate contact trench 44 is formed by digging down the interlayer insulating film 42, the second thin film portion 23 of the gate insulating film 20, the upper electrode layer 30, and the intermediate insulating film 24 in this order so as to reach the lower electrode layer 26. The gate contact trench 44 has a side portion from which the interlayer insulating film 42, the second thin film portion 23 of the gate insulating film 20, the upper electrode layer 30, the intermediate insulating film 24, and the lower electrode layer 26 are exposed and a bottom portion from which the lower electrode layer 26 is exposed. This arrangement also makes it possible to fulfill the same effects as the semiconductor device 1.

Figure 14:
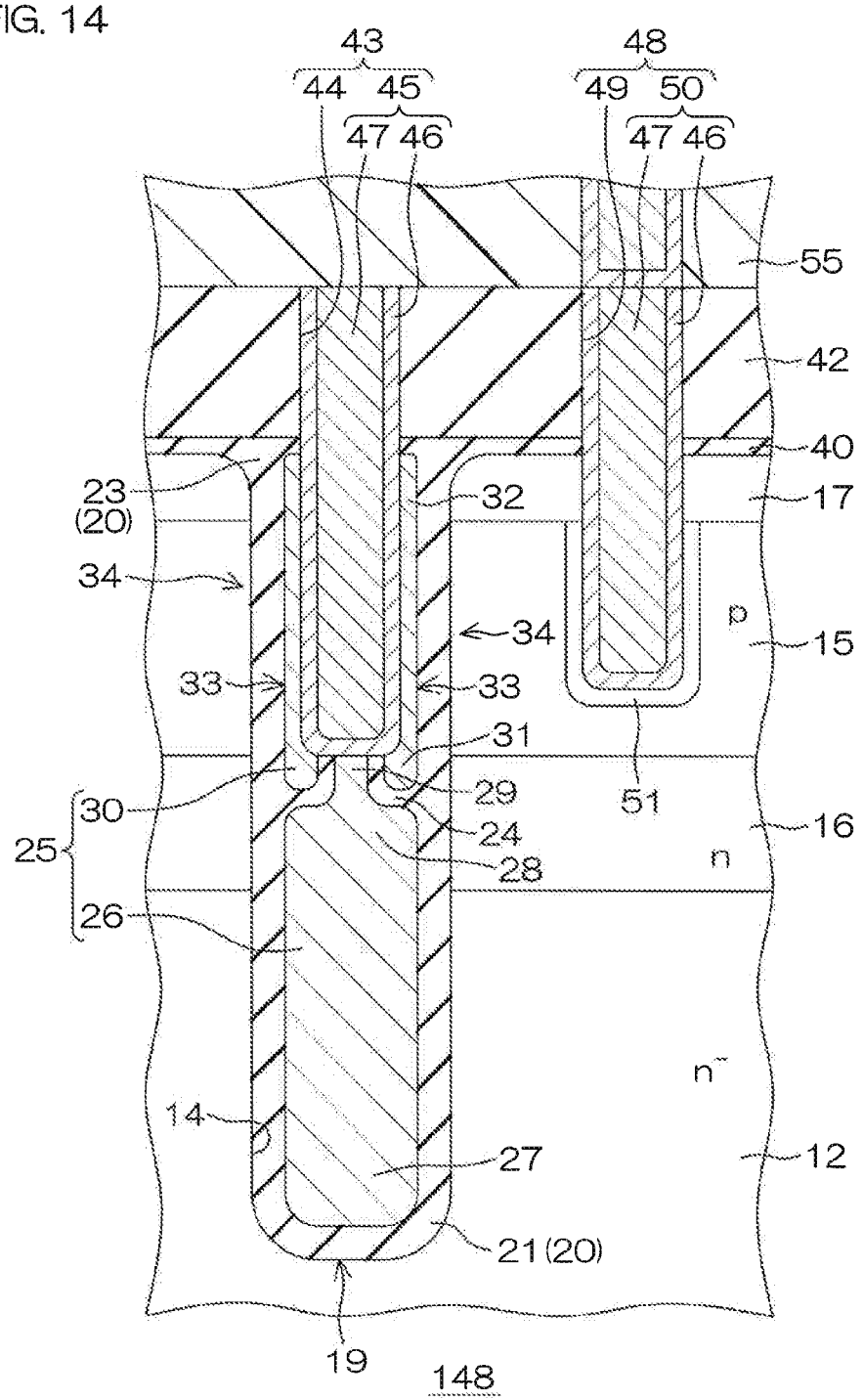
FIG. 14 is a schematic enlarged cross-sectional view showing a trench gate structure of a semiconductor device according to a fourth modification.

Additionally, the gate insulating film 20 may be formed with a uniform thickness although the gate insulating film 20 includes the thick film portion 21 and the first thin film portion 22 as described in each of the aforementioned preferred embodiments. If so, the gate insulating film 20 may have an arrangement shown in FIG. 14. FIG. 14 is a schematic enlarged cross-sectional view showing the trench gate structure 19 of a semiconductor device 148 according to a fourth modification.

Of course, the arrangement of the semiconductor device 148 is also applicable to the arrangement according to the semiconductor device 130 of the second preferred embodiment and applicable to the arrangement according to the semiconductor device 135 of the third preferred embodiment although the semiconductor device 148 is shown as a modification of the semiconductor device 1 according to the first preferred embodiment in FIG. 14. In FIG. 14, the same reference sign is given to an arrangement common to that of the semiconductor device 1, and a description of this arrangement is omitted.

As shown in FIG. 14, the gate insulating film 20 does not have the first thin film portion 22, and includes the thick film portion 21 formed along the whole area of the inner surface of the gate trench 14. According to this arrangement, in the manufacturing process, it is possible to exclude the step of selectively removing the thermally-oxidized film 111 formed in the gate trench 14 and the lower electrode layer 26 (step S6) (see FIG. 7D and the like). As a result, it is possible to simplify the manufacturing process, and hence is possible to shorten the period of time required in the manufacturing process. However, the side portion 33 of the upper electrode layer 30 faces the p type body region 15 with the thick film portion 21 therebetween, and therefore, in consideration of channel controllability, it can be said that the arrangement of each of the aforementioned preferred embodiments is more desirable.

Of course, the gate insulating film 20 does not have the thick film portion 21, and may be arranged so as to include the first thin film portion 22 formed along the whole area of the inner surface of the gate trench 14. If so, channel controllability is improved while a capacitance value in a lower part of the gate trench 14 (the trench gate structure 19) is increased, and therefore, it can be said that the arrangement of each of the aforementioned preferred embodiments is more desirable.

Additionally, the gate trench 14 and the DTI trench 63 may have a tapered shape in which the width of an opening becomes narrower from the opening toward the bottom portion when viewed cross-sectionally although each of the gate trench 14 and the DTI trench 63 has the side portion perpendicular to the surface of the epitaxial layer 12 as described in each of the aforementioned preferred embodiments.

Additionally, the gate contact trench 44 may have a tapered shape in which the width of an opening becomes narrower from the opening toward the bottom portion when viewed cross-sectionally although the gate contact trench 44 has the side portion perpendicular to the surface of the epitaxial layer 12 as described in the first and second preferred embodiments.

Additionally, the source contact trench 49 may have a tapered shape in which the width of an opening becomes narrower from the opening toward the bottom portion when viewed cross-sectionally although the source contact trench 49 has the side portion perpendicular to the surface of the epitaxial layer 12 as described in each of the aforementioned preferred embodiments.

Additionally, the source contact trench 49 may have a bottom portion contiguous to the n type source region 17 without passing through the p type body region 15 or a bottom portion contiguous to the surface of the epitaxial layer 12 from which the n type source region 17 is exposed without passing through the p type body region 15 although the source contact trench 49 having the bottom portion in the p type body region 15 is formed as described in each of the aforementioned preferred embodiments.

Additionally, in each of the aforementioned preferred embodiments, the gate trench 14 and the source contact trench 49 may be formed with the same depth. In this case, the gate trench 14 and the source contact trench 49 may be formed through the same step.

Additionally, although an example in which the DTI structure 5 is formed in a square annular shape when viewed planarly has been described in each of the aforementioned preferred embodiments, the present invention is not limited to this example if the CMIS region 3 and the passive element region 4 are electrically separable from the VDMIS region 2. Therefore, the DTI structure 5 may be formed in an annular shape when viewed planarly or in an elliptic annular shape when viewed planarly, or may be formed in a polygonal annular shape when viewed planarly, such as a triangular shape when viewed planarly or a hexagonal shape when viewed planarly.

Additionally, the DTI structure 5 may be formed so as to surround the periphery of the VDMIS region 2 although the DTI structure 5 is formed so as to surround the periphery of the CMIS region 3 and the periphery of the passive element region 4 as described in each of the aforementioned preferred embodiments. In this case, either the CMIS region 3 or the passive element region 4 is not necessarily required to be surrounded by the DTI structure 5.

Additionally, a semiconductor device that has characteristics of both the VDMIS (MISFET) and the IGBT may be manufactured by combining the first and second preferred embodiments together so as to form the semiconductor substrate 11 that has both the $n^+$ type impurity region and the $p^+$ type impurity region.

Additionally, in the semiconductor devices 1, 130, 135, 143, 144, 147, 148 mentioned above, an arrangement in which the conductivity type of each semiconductor part is reversed may be employed. In other words, the p type part may be an n type, and the n type part may be a p type.

Additionally, in each of the aforementioned preferred embodiments, a BJT (Bipolar Junction Transistor) region, a JFET (Junction Field Effect Transistor) region, or a non-volatile memory region that has a control gate and a floating gate may be formed instead of the CMIS region 3. Additionally, all or some of these regions may be selectively formed on the epitaxial layer 12. Additionally, an integrated circuit, such as LSI (Large Scale Integration), SSI (Small Scale Integration), MSI (Medium Scale Integration), VLSI (Very Large Scale Integration), or ULSI (Ultra-Very Large Scale Integration), may be arranged by combining these regions together.

Additionally, the aforementioned semiconductor devices 1, 130, 135, 143, 144, 147, and 148 may be mounted in a semiconductor package. If so, the examples shown in FIG. 15 to FIG. 21 may be employed.

Figure 15:
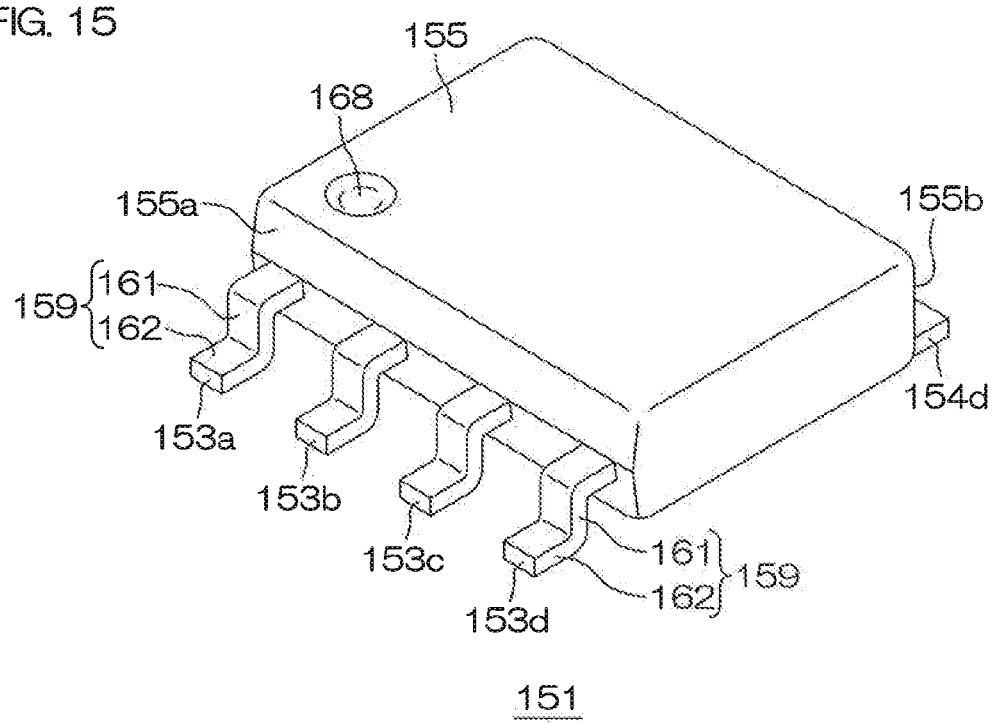
FIG. 15 is an upper-surface perspective view showing one example of a semiconductor package in which a semiconductor device according to the present invention and according to the modifications is mounted.
Figure 16:
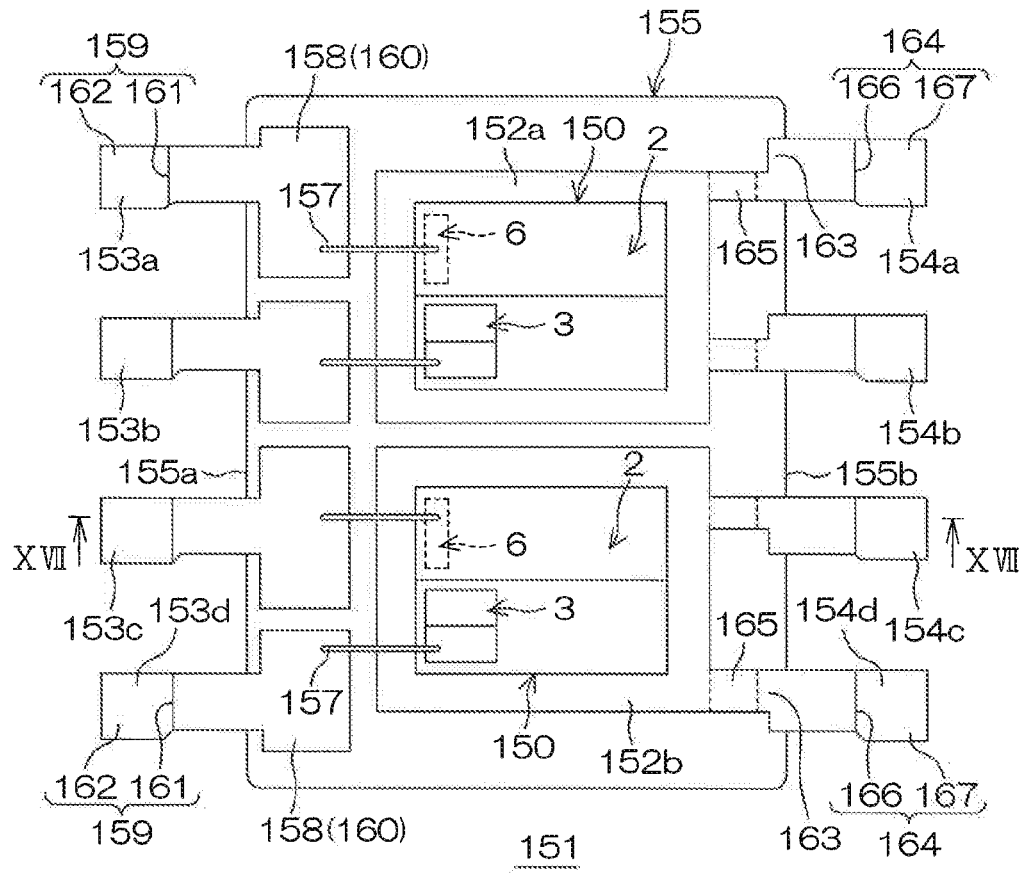
FIG. 16 is a plan view showing an internal structure of the semiconductor package shown in FIG. 15.
Figure 17:
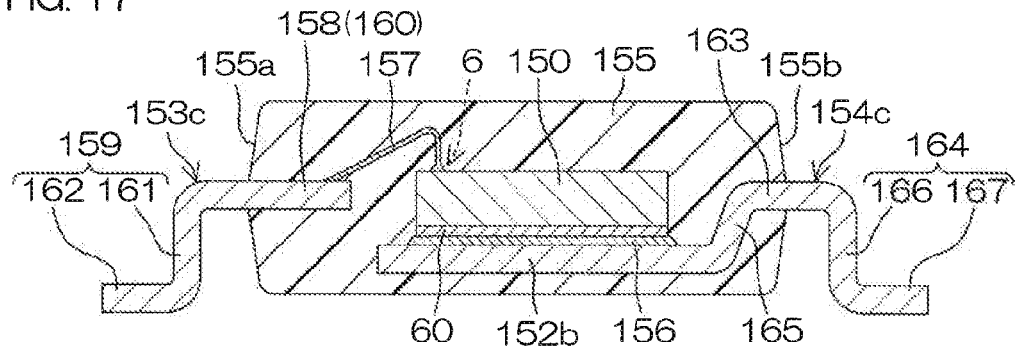
FIG. 17 is a cross-sectional view taken along line XVII-XVII shown in FIG. 16.

FIG. 15 is an upper-surface perspective view showing one example of a semiconductor package 151 in which the semiconductor device 1, 130, 135, 143, 144, 147, or 148 is mounted. FIG. 16 is a plan view showing an internal structure of the semiconductor package 151 shown in FIG. 15. FIG. 17 is a cross-sectional view taken along line XVII-XVII shown in FIG. 16. Hereinafter, the aforementioned semiconductor device 1, 130, 135, 143, 144, 147, or 148 is referred to simply as a "semiconductor chip 150."

As shown in FIG. 15 to FIG. 17, the semiconductor package 151 includes lead frames 152a and 152b to which the semiconductor chip 150 is connected, a plurality of (in this example, four) input terminals 153a to 153d that form outer terminals and that supply electric power to the semiconductor chip 150 from the outside, a plurality of (in this example, four) output terminals 154a to 154d that form outer terminals and that output an electric signal acquired from the semiconductor chip 150 to the outside, and a package body 155 that seals the semiconductor chip 150, the lead frames 152a and 152b, a part of the input terminals 153a to 153d, and a part of the output terminals 154a to 154d.

As shown in FIG. 15, the package body 155 is formed in, for example, a substantially rectangular shape of about 4 mm×5 mm. The package body 155 has a pair of first side portion 155a and second side portion 155b along the longitudinal direction of the package body 155. The package body 155 includes sealing resin such as epoxy resin.

As shown in FIG. 16, the pair of lead frames 152a and 152b each of which is substantially rectangular are disposed in the package body 155 when the surface of the package body 155 is viewed from the normal direction (hereinafter, referred to simply as "when viewed planarly"). The lead frames 152a and 152b are disposed with an interval therebetween along the longitudinal direction of the package body 155 so as to be electrically separated from each other. Each of the lead frames 152a and 152b has an area that is greater than the area of the semiconductor chip 150 when viewed planarly.

As shown in FIG. 17, the semiconductor chip 150 is a vertical semiconductor device that has the drain electrode 60 (see FIG. 3 also) serving as a back-surface electrode on the reverse surface side. The drain electrode 60 of each semiconductor chip 150 is connected to the corresponding lead frames 152a and 152b through a solder 156. Each semiconductor chip 150 is connected so as to be installed in the corresponding lead frames 152a and 152b.

As shown in FIG. 15 and FIG. 16, each input terminal 153a to 153d is disposed on the side of the first side portion 155a of the package body 155. The input terminals 153a to 153d are spaced out along the longitudinal direction of the first side portion 155a so as to be electrically separated from each other. Furthermore, each input terminal 153a to 153d is disposed with an interval from each of the lead frames 152a and 152b so as to be electrically separated from each of the lead frames 152a and 152b.

As shown in FIG. 16, the input terminal 153a and the input terminal 153b form a pair of input terminals with respect to the semiconductor chip 150 connected to the lead frame 152a disposed on one side. Likewise, the input terminal 153c and the input terminal 153d form a pair of input terminals with respect to the semiconductor chip 150 connected to the lead frame 152b disposed on the other side.

Each of the input terminals 153a and 153c is electrically connected to the source pad 6 disposed in the VDMIS region 2 of the corresponding semiconductor chip 150 through a bonding wire 157. In other words, the input terminal 153a and the input terminal 153c form a ground terminal to which a ground potential is applied. On the other hand, each of the input terminals 153b and 153d is electrically connected to the CMIS region 3 of the corresponding semiconductor chip 150 through a bonding wire 157.

Every one of the input terminals 153a to 153d integrally has an inner lead 158 disposed in the package body 155 and an outer lead 159 disposed outside the package body 155.

Each inner lead 158 includes a flat plate portion 160 that has a flat surface formed substantially horizontally with respect to the surface of each of the lead frames 152a and 152b. Each flat plate portion 160 is positioned above the surface of each of the lead frames 152a and 152b (on the surface side of the package body 155). Each flat plate portion 160 may have a flat surface that is substantially flush with the surface of the semiconductor chip 150 (the surface on the side on which the drain electrode 60 is not formed). Each flat plate portion 160 is electrically connected to each semiconductor chip 150 through a bonding wire 157.

A comparatively large voltage is applied to the VDMIS region 2. From the viewpoint of restraining or preventing the increase of the resistance value, the input terminal 153a and the input terminal 153c may be electrically connected to the corresponding semiconductor chip 150 through a plurality of (two or more) bonding wires 157. Additionally, instead of a plurality of bonding wires 157, one thick wire that has a wire diameter corresponding to the total value of each wire diameter of the plurality of bonding wires 157, a conductor plate, or the like may be used. The bonding wire 157, the thick wire, the conductor plate, or the like may include any one of, for example, gold (Au), copper (Cu), aluminum (Al), or an alloy of these elements.

On the other hand, each outer lead 159 includes an extension portion 161 that extends from the inner lead 158 toward the reverse surface side of the package body 155 and a lower end portion 162 that extends from the lower end of the extension portion 161 in the direction opposite to the package body 155. The lower end portion 162 of the outer lead 159 is positioned below the reverse surface of the package body 155, and is connected to a wire or the like disposed on a mounting substrate or the like by means of, for example, a solder. Electric power input from the outside into the outer lead 159 is supplied to the semiconductor chip 150 through the inner lead 158 and through the bonding wire 157.

On the other hand, as shown in FIG. 15 to FIG. 17, each output terminal 154a to 154d is disposed on the side of the second side portion 155b of the package body 155. The output terminals 154a to 154d are spaced out along the longitudinal direction of the second side portion 155b.

The output terminal 154a and the output terminal 154b form a pair of drain terminals electrically connected to the drain electrode 60 of the semiconductor chip 150 through the lead frame 152a and the solder 156 that are disposed on one side. Likewise, the output terminal 154c and the output terminal 154d form a pair of drain terminals electrically connected to the drain electrode 60 of the semiconductor chip 150 through the lead frame 152*b* and the solder 156 that are disposed on the other side.

As shown in FIG. 16, every one of the output terminals 154*a* to 154*d* integrally has an inner lead 163 disposed in the package body 155 and an outer lead 164 disposed outside the package body 155.

As shown in FIG. 17, each inner lead 163 is positioned above the surface of each of the lead frames 152*a* and 152*b* (on the surface side of the package body 155). Each inner lead 163 is formed so as to be integrally continuous with the corresponding lead frames 152*a* and 152*b* through a connection portion 165 extending toward the reverse surface side of the package body 155 in the package body 155. The inner lead 163 is electrically connected to the semiconductor chip 150 through the connection portion 165, the lead frame 152, and the solder 156.

On the other hand, each outer lead 164 includes an extension portion 166 that extends from the inner lead 163 toward the reverse surface side of the package body 155 and a lower end portion 167 that extends from the lower end of the extension portion 166 in the direction opposite to the package body 155. The lower end portion 167 of the outer lead 164 is positioned so as to be flush with the lower end portion 162 of each input terminal 153*a* to 153*d*, and is connected to a wire or the like disposed on the mounting substrate or the like by means of, for example, a solder. An electric signal acquired from the semiconductor chip 150 is output to the outside from the outer lead 164 through the solder 156, the lead frame 152, and the inner lead 163.

Referring again to FIG. 15, the package body 155 has its surface having an index 168 that determines a mounting direction. The index 168 may be a concave portion that is hollowed toward the reverse surface side of the package body 155, or may be a mark attached to the surface of the package body 155. In this example, a concave portion is formed as the index 168. The index 168 is formed at a corner portion of the surface of the package body 155 positioned near the input terminal 153*a* when viewed planarly. This makes it possible to indicate the position of the input terminal 153*a*, and makes it possible to determine the mounting direction of the semiconductor package 151.

According to this arrangement, it is possible to provide a two-channel semiconductor package 151 whose semiconductor chip 150 is connected to each of the pair of lead frames 152*a* and 152*b*.

The semiconductor chips 150 connected to each of the lead frames 152*a* and 152*b* may be the same as each other in specifications, or may differ from each other in specifications so as to have, for example, different input voltages and different output signals. Additionally, although the two-channel semiconductor package 151 has been described in this example, a multichannel (three-channel or more) semiconductor package may be employed. Additionally, a one-channel semiconductor package may be employed. If the one-channel semiconductor package is employed, an example shown in FIG. 18 may be employed.

Figure 18:
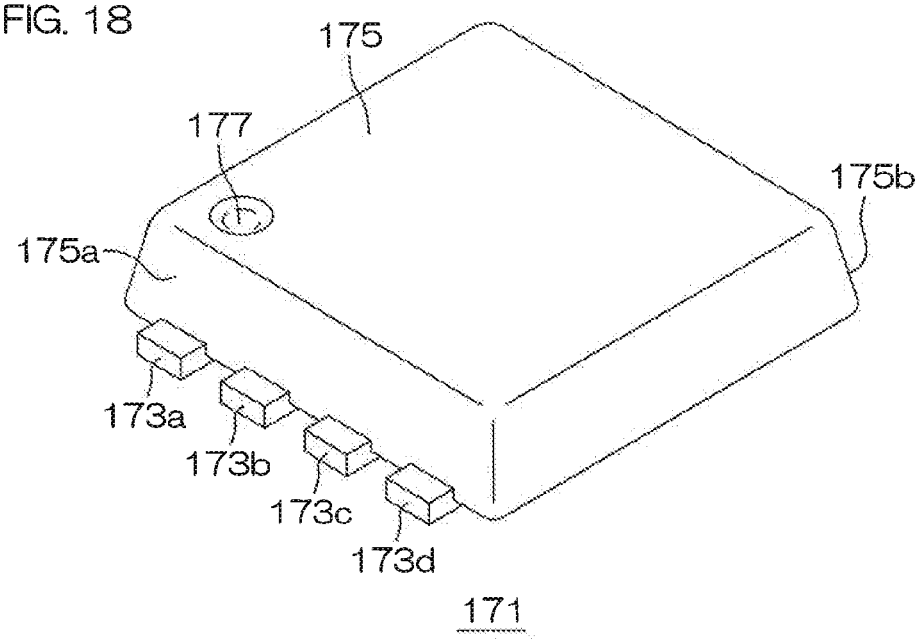
FIG. 18 is an upper-surface perspective view showing another example of a semiconductor package in which a semiconductor device according to the present invention and according to the modifications is mounted.
Figure 19:
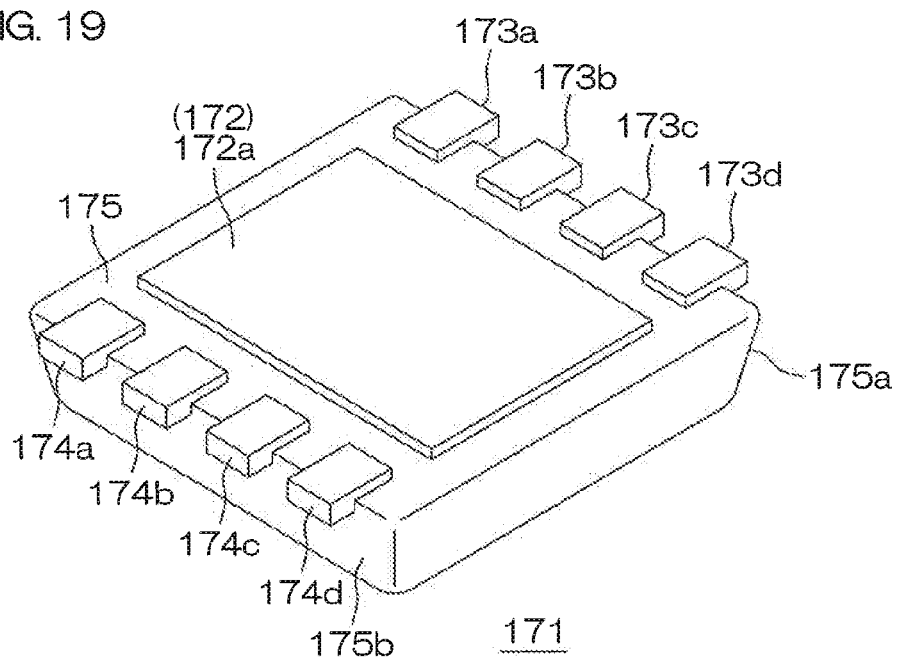
FIG. 19 is an undersurface perspective view of the semiconductor package shown in FIG. 18.
Figure 20:
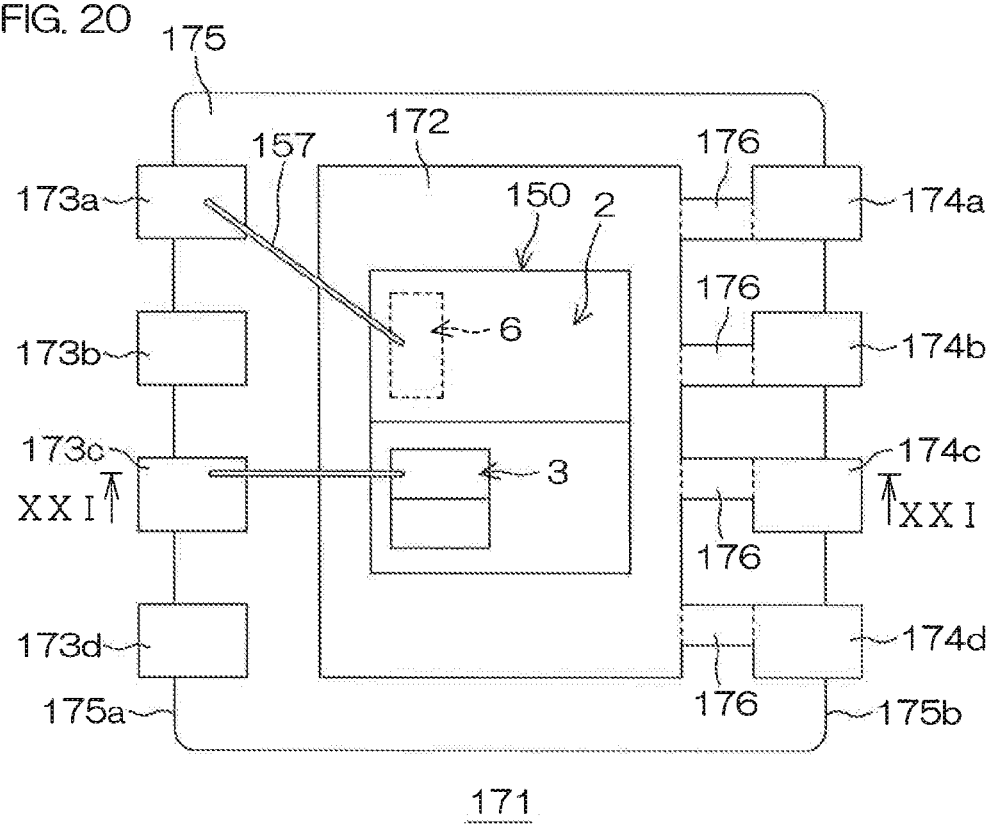
FIG. 20 is a plan view showing an internal structure of the semiconductor package shown in FIG. 18.
Figure 21:
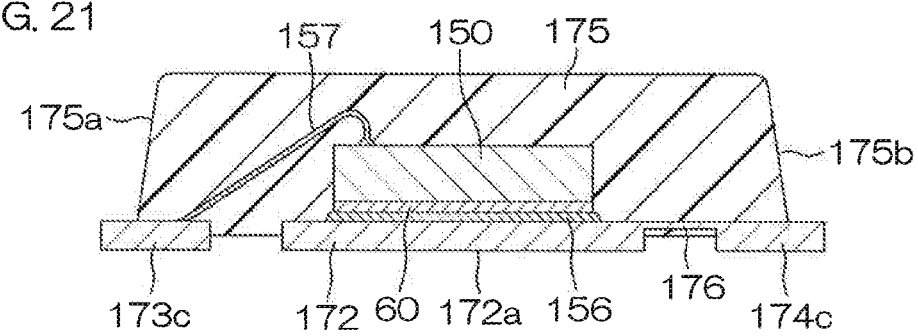
FIG. 21 is a cross-sectional view taken along line XXI-XXI shown in FIG. 20.

FIG. 18 is an upper-surface perspective view showing a semiconductor package 171 in which the semiconductor chip 150 is mounted. FIG. 19 is an undersurface perspective view of the semiconductor package 171 shown in FIG. 18. FIG. 20 is a plan view showing an internal structure of the semiconductor package 171 shown in FIG. 18. FIG. 21 is a cross-sectional view taken along line XXI-XXI shown in FIG. 20.

The semiconductor package 171 differs from the semiconductor package 151 in the fact that the semiconductor package 171 is a one-channel type, in the fact that the semiconductor package 171 includes one lead frame 172 instead of the pair of lead frames 152*a* and 152*b*, in the fact that the semiconductor package 171 includes input terminals 173*a* to 173*d* instead of the input terminals 153*a* to 153*d*, in the fact that the semiconductor package 171 includes output terminals 174*a* to 174*d* instead of the output terminals 154*a* to 154*d*, and in the fact that the semiconductor package 171 includes a package body 175 instead of the package body 155. In the other respects, the semiconductor package 171 is arranged in the same way as the aforementioned semiconductor package 151. In FIG. 18 to FIG. 21, the same reference sign as in FIG. 15 to FIG. 17 is given to a component corresponding to each component of FIG. 15 to FIG. 17 mentioned above, and a description of this component is omitted.

As shown in FIG. 18 to FIG. 21, the package body 175 is formed in, for example, a substantially rectangular shape of about 3 mm×3 mm. As shown in FIG. 20, the lead frame 172 that is substantially rectangular is disposed in the package body 175 when the surface of the package body 175 is viewed from the normal direction (hereinafter, referred to simply as "when viewed planarly"). The drain electrode 60 of the semiconductor chip 150 is connected to the upper surface of the lead frame 172 through the solder 156. On the other hand, as shown in FIG. 19 and FIG. 21, an undersurface 172*a* of the lead frame 172 is exposed from the undersurface of the package body 175. The undersurface 172*a* of the lead frame 172 may be exposed so as to protrude from the undersurface of the package body 175 as shown in FIG. 19. The undersurface 172*a* of the lead frame 172 may be exposed so as to be hollowed toward the inner part of the package body 175 rather than be exposed from the undersurface of the package body 175.

Each input terminal 173*a* to 173*d* is disposed on the side of the side portion 175*a* on one side of the package body 175. The input terminals 173*a* to 173*d* are spaced out along the longitudinal direction of the side portion 175*a* on the other side so as to be electrically separated from each other. Furthermore, each input terminal 173*a* to 173*d* is disposed with an interval from the lead frame 172 so as to be electrically separated from the lead frame 172.

A part of the upper portion of each input terminal 173*a* to 173*d* and a part of its side portion positioned on the side of the lead frame 172 are sealed by the package body 175. On the other hand, the bottom portion of each input terminal 173*a* to 173*d* and its side portion positioned on the side opposite to the lead frame 172 are exposed from a corner portion at which the side portion 175*a* on the one side of the package body 175 and the undersurface of the package body 175 intersect each other. Each input terminal 173*a* to 173*d* may be exposed so as to protrude from the undersurface of the package body 175 as shown in FIG. 19. Each input terminal 173*a* to 173*d* may be exposed so as to be hollowed toward the inner part of the package body 175 rather than be exposed from the undersurface of the package body 175.

The input terminal 173*a* is electrically connected to the source pad 6 disposed in the VDMIS region 2 of the semiconductor chip 150 through the bonding wire 157. In other words, the input terminal 173*a* forms a ground terminal to which a ground potential is applied. On the other hand, the input terminal 173*c* is electrically connected to the CMIS region 3 of the semiconductor chip 150 through the bonding wire 157. The exposed portion of each input terminal 173*a* to 173*d* is connected to a wire or the like disposed on a mounting substrate or the like by means of, for example, a solder. Electric power input from the outside into each input terminal 173a to 173d is supplied to the semiconductor chip 150 through the bonding wire 157.

Although the input terminal 173b and the input terminal 173d are electrically opened in this example, each of the input terminals 173b and 173d may be electrically connected to the VDMIS region 2 or to the CMIS region 3 through the bonding wire 157. Additionally, the input terminal 173b may be formed integrally with the input terminal 173a or with the input terminal 173c in the package body 175. Additionally, the input terminal 173d may be formed integrally with the input terminal 173c in the package body 175.

On the other hand, each output terminal 174a to 174d is disposed on the side of the side portion 175b that is on the other side facing the side portion 175a that is on the one side of the package body 175 with the lead frame 172 therebetween. The output terminals 174a to 174d are spaced out along the longitudinal direction of the side portion 175b on the other side.

A part of the upper portion of each output terminal 174a to 174d and a part of its side portion positioned on the side of the lead frame 172 are sealed by the package body 175. On the other hand, the bottom portion of each output terminal 174a to 174d and its side portion positioned on the side opposite to the lead frame 172 are exposed from a corner portion at which the side portion 175b on the other side of the package body 175 and the undersurface of the package body 175 intersect each other. Each output terminal 174a to 174d may be exposed so as to protrude from the undersurface of the package body 175 as shown in FIG. 19. Each output terminal 174a to 174d may be exposed so as to be hollowed toward the inner part of the package body 175 rather than be exposed from the undersurface of the package body 175.

Each output terminal 174a to 174d is formed so as to be integrally continuous with the lead frame 172 through, for example, a connection portion 176 in the package body 175. An electric signal acquired from the semiconductor chip 150 is output to the outside from each output terminal 174a to 174d through the lead frame 172 and through the connection portion 176. Each output terminal 174a to 174d may be electrically connected to the lead frame 172 through, for example, a bonding wire instead of the connection portion 176. Any one of the output terminals 174a to 174d may be electrically separated from the lead frame 172.

Referring again to FIG. 18, the package body 175 has its surface having an index 177 that determines a mounting direction. The index 177 is formed at a corner portion of the surface of the package body 175 positioned near the input terminal 173a when viewed planarly. This makes it possible to indicate the position of the input terminal 173a, and makes it possible to determine the mounting direction of the semiconductor package 171.

According to this arrangement, it is possible to provide a one-channel semiconductor package 171 whose single semiconductor chip 150 is connected to the single lead frame 172. Additionally, according to the semiconductor package 171, the undersurface 172a of the lead frame 172 is exposed from the undersurface of the package body 175, and therefore it is possible to effectively dissipate heat generated in the semiconductor chip 150 to the outside. In consideration of the semiconductor package 151, the semiconductor package 171 may be formed as a multichannel (two-channel or more) semiconductor package.

The aforementioned semiconductor chip 150 (the semiconductor device 1, 130, 135, 143, 144, 147, 148) and the semiconductor packages 151 and 171 are capable of being incorporated into a power module for use in an inverter circuit forming a driving circuit to drive an electric motor that is used as a power source of, for example, an electric automobile (including a hybrid automobile), a train, and an industrial robot.

Additionally, the semiconductor chip 150 and the semiconductor packages 151 and 171 are also capable of being incorporated into a power module for use in an inverter circuit that converts electric power generated by a solar battery, by a wind generator, or by other power generators (particularly, a private electric generator) so as to match the electric power of a commercial power source.

Besides, various design changes can be made within the scope of the matters recited in the appended claims.

What is claimed is:

1. A semiconductor device comprising:
   a semiconductor layer in which a gate trench is formed;
   a gate insulating film formed along an inner surface of the gate trench;
   a gate electrode that is buried in the gate trench through the gate insulating film and that has a lower electrode and an upper electrode that are separated upwardly and downwardly from each other with an intermediate insulating film between the lower electrode and the upper electrode; and
   a gate contact that is formed in the gate trench so as to pass through the upper electrode and through the intermediate insulating film and so as to reach the lower electrode and that electrically connects the lower electrode and the upper electrode together.

2. The semiconductor device according to claim 1, wherein the gate contact is formed along a longitudinal direction of the gate trench.

3. The semiconductor device according to claim 1, wherein the gate contact has a bottom portion that is contiguous to an upper end portion of the lower electrode and that is contiguous to the intermediate insulating film.

4. The semiconductor device according to claim 1, wherein the gate contact has a bottom portion contiguous to an upper end portion of the lower electrode and has a side portion contiguous to the intermediate insulating film.

5. The semiconductor device according to claim 1, further comprising:
   a second conductivity type body region formed at a surface portion of the semiconductor layer; and
   a first conductivity type region formed in the body region, wherein the gate insulating film includes:
   a thick film portion contiguous to the lower electrode; and
   a thin film portion that is smaller in thickness than the thick film portion and that is interposed between the upper electrode and the body region.

6. The semiconductor device according to claim 5, wherein the thin film portion of the gate insulating film has a thickness of $\frac{1}{10}$ or less with respect to the thick film portion of the gate insulating film.

7. The semiconductor device according to claim 5, further comprising a contact for use in the first conductivity type region, the contact being formed so as to pass through the first conductivity type region and so as to reach the body region.

8. The semiconductor device according to claim 7, wherein the contact for use in the first conductivity type region has a bottom portion at a position shallower than the bottom portion of the gate contact.

9. The semiconductor device according to claim 7, wherein the contact for use in the first conductivity type region is formed along the longitudinal direction of the gate trench.

10. The semiconductor device according to claim 7, wherein the contact for use in the first conductivity type region includes tungsten.

11. The semiconductor device according to claim 1, further comprising an interlayer insulating film formed on the semiconductor layer,
wherein the gate contact is formed so as to pass through the interlayer insulating film.

12. The semiconductor device according to claim 1, wherein the gate contact includes tungsten.

13. The semiconductor device according to claim 1, wherein the semiconductor layer includes an element region electrically separated by a DTI (Deep Trench Isolation) structure,
the DTI structure comprising:
a DTI insulating film formed along an inner surface of a DTI trench formed in the semiconductor layer;
a DTI electrode that is buried in the DTI trench through the DTI insulating film and that has a lower DTI electrode and an upper DTI electrode that are separated upwardly and downwardly from each other with the DTI intermediate insulating film between the lower DTI electrode and the upper DTI electrode; and
a DTI contact that is formed in the DTI trench so as to pass through the upper DTI electrode and through the DTI intermediate insulating film and so as to reach the lower DTI electrode and that electrically connects the lower DTI electrode and the upper DTI electrode together.

14. The semiconductor device according to claim 13, wherein a ground potential is applied to the DTI contact.

15. The semiconductor device according to claim 13, wherein the element region includes a CMIS (Complementary MIS) region, the CMIS region having a first conductivity type MISFET (Metal-Insulator-Semiconductor Field-Effect Transistor) and a second conductivity type MISFET.

16. A method for manufacturing a semiconductor device, the method comprising:
a step of forming a gate trench in a semiconductor layer;
a step of forming a gate insulating film along an inner surface of the gate trench;
a step of forming a lower electrode by burying a conductive material to a halfway portion in a depth direction of the gate trench;
a step of forming an intermediate insulating film by coating the lower electrode with an insulating film;
a step of forming an upper electrode by burying a conductive material so as to backfill the gate trench from above the intermediate insulating film; and
a step of forming a gate contact that electrically connects the lower electrode and the upper electrode together by allowing the gate contact to pass through the upper electrode and through the intermediate insulating film and to reach the lower electrode.

17. The method for manufacturing the semiconductor device according to claim 16, wherein the gate contact is formed along a longitudinal direction of the gate trench.

18. The method for manufacturing the semiconductor device according to claim 16, the method further comprising:
a step of, prior to a step of forming the intermediate insulating film, allowing the gate insulating film contiguous to the lower electrode to remain as a thick film portion by selectively removing the gate insulating film to the halfway portion in the depth direction of the gate trench;
the step of forming the intermediate insulating film including a step of forming the insulating film that has a thickness smaller than the thick film portion along the inner surface of the gate trench from which the gate insulating film has been removed and forming a thin film portion serving as the gate insulating film;
a step of forming a body region facing the upper electrode with the thin film portion of the gate insulating film between the body region and the upper electrode by implanting a second conductivity type impurity into a surface portion of the semiconductor layer; and
a step of forming a first conductivity type region by implanting a first conductivity type impurity into a surface portion of the semiconductor layer in the body region.

19. The method for manufacturing the semiconductor device according to claim 18, the method further comprising a step of forming a contact for the first conductivity type region, the contact passing through the first conductivity type region and reaching the body region.

20. The method for manufacturing the semiconductor device according to claim 19, wherein the contact for the first conductivity type region is formed, the contact including tungsten.

21. The method for manufacturing the semiconductor device according to claim 16, the method further comprising a step of forming an interlayer insulating film with which the semiconductor layer is covered after the step of forming the upper electrode and prior to the step of forming the gate contact,
wherein the gate contact is formed so as to pass through the interlayer insulating film, through the upper electrode, and through the intermediate insulating film in this order and so as to reach the lower electrode.

22. The method for manufacturing the semiconductor device according to claim 16, wherein the gate contact that includes tungsten is formed.

* * * * *